(12) United States Patent
Kitano

(10) Patent No.: US 12,183,757 B2
(45) Date of Patent: Dec. 31, 2024

(54) SOLID-STATE IMAGING DEVICE

(71) Applicant: SONY SEMICONDUCTOR SOLUTIONS CORPORATION, Kanagawa (JP)

(72) Inventor: Yoshiaki Kitano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 415 days.

(21) Appl. No.: 17/619,337

(22) PCT Filed: Jun. 25, 2020

(86) PCT No.: PCT/JP2020/024925
§ 371 (c)(1),
(2) Date: Dec. 15, 2021

(87) PCT Pub. No.: WO2020/262502
PCT Pub. Date: Dec. 30, 2020

(65) Prior Publication Data
US 2022/0367552 A1 Nov. 17, 2022

(30) Foreign Application Priority Data
Jun. 26, 2019 (JP) .................. 2019-118474

(51) Int. Cl.
*H01L 27/146* (2006.01)
*H01L 29/78* (2006.01)
(Continued)

(52) U.S. Cl.
CPC .. *H01L 27/14634* (2013.01); *H01L 27/14612* (2013.01); *H01L 29/785* (2013.01); *H04N 25/77* (2023.01); *H04N 25/79* (2023.01)

(58) Field of Classification Search
CPC ......... H01L 27/14634; H01L 27/14612; H01L 29/785; H01L 27/124; H01L 27/1464;
(Continued)

(56) References Cited

U.S. PATENT DOCUMENTS

2011/0155893 A1 6/2011 Endo et al.
2015/0179691 A1 6/2015 Yanagita et al.
(Continued)

FOREIGN PATENT DOCUMENTS

JP 2010-245506 10/2010
JP 2011049445 A 3/2011
(Continued)

OTHER PUBLICATIONS

International Search Report prepared by the Japan Patent Office on Sep. 15, 2020, for International Application No. PCT/JP2020/024925, 2 pgs.

*Primary Examiner* — Yasser A Abdelaziez
(74) *Attorney, Agent, or Firm* — SHERIDAN ROSS P.C.

(57) ABSTRACT

There is provided a solid-state imaging device including: a first substrate including a photoelectric converter and an electric charge accumulation section for each pixel, the electric charge accumulation section in which a signal electric charge generated in the photoelectric converter is accumulated; a second substrate including a semiconductor layer and a pixel transistor, the semiconductor layer being stacked on the first substrate, and the pixel transistor that includes a gate electrode opposed to the semiconductor layer, and reads the signal electric charge of the electric charge accumulation section; and a through electrode that is provided in the first substrate and the second substrate, and electrically couples the first substrate and the second substrate to each other and is partially in contact with the gate electrode.

20 Claims, 57 Drawing Sheets

(51) Int. Cl.
*H04N 25/77* (2023.01)
*H04N 25/79* (2023.01)

(58) Field of Classification Search
CPC ......... H01L 27/14643; H01L 27/14636; H01L 27/14605; H01L 27/14603; H01L 27/14609; H01L 27/14641; H04N 25/77; H04N 25/79

See application file for complete search history.

(56) References Cited

U.S. PATENT DOCUMENTS

| | | |
|---|---|---|
| 2016/0013236 A1 | 1/2016 | Endo et al. |
| 2016/0126285 A1* | 5/2016 | Kobayashi .......... H01L 27/0296 438/60 |
| 2016/0358968 A1 | 12/2016 | Endo et al. |
| 2017/0062499 A1 | 3/2017 | Yanagita et al. |
| 2017/0345854 A1 | 11/2017 | Kwon |
| 2018/0033809 A1* | 2/2018 | Tayanaka ............... H04N 25/60 |
| 2018/0108690 A1 | 4/2018 | Yanagita et al. |
| 2018/0114808 A1 | 4/2018 | Endo et al. |
| 2019/0252430 A1 | 8/2019 | Yanagita et al. |
| 2020/0027909 A1* | 1/2020 | Ebiko ............... H01L 27/14656 |

FOREIGN PATENT DOCUMENTS

| | | |
|---|---|---|
| JP | 2012015277 A | 1/2012 |
| JP | 2014-022561 | 2/2014 |
| JP | 2015032687 A | 2/2015 |
| JP | 2017183636 A | 10/2017 |
| JP | 2018195803 A | 12/2018 |
| KR | 20180112766 A | 10/2018 |
| WO | WO 2011/077580 | 6/2011 |
| WO | WO-2013094430 A1 | 6/2013 |
| WO | WO-2016136486 A1 | 9/2016 |
| WO | WO-2017138197 A1 | 8/2017 |

* cited by examiner

SOLID-STATE IMAGING DEVICE

CROSS REFERENCE TO RELATED APPLICATIONS

This application is a national stage application under 35 U.S.C. 371 and claims the benefit of PCT Application No. PCT/JP2020/024925 having an international filing date of 25 Jun. 2020, which designated the United States, which PCT application claimed the benefit of Japanese Patent Application No. 2019-118474 filed 26 Jun. 2019, the entire disclosures of each of which are incorporated herein by reference.

TECHNICAL FIELD

The present disclosure relates to a solid-state imaging device including a plurality of semiconductor layers that are stacked on each other.

BACKGROUND ART

Recently, for a solid-state imaging device, development of a CMOS (Complementary Metal Oxide Semiconductor) image sensor has advanced. For example, PTL 1 discloses a solid-state imaging device in which a semiconductor wafer including a pixel array section and a semiconductor wafer including a logic circuit are stacked.

For example, a photodiode, a floating diffusion, a pixel transistor, and the like are provided in the pixel array section.

CITATION LIST

Patent Literature

PTL 1: Japanese Unexamined Patent Application Publication No. 2010-245506

SUMMARY OF THE INVENTION

In such a solid-state imaging device, reduction in noise of a signal to be outputted from a pixel transistor is desired.

It is therefore desirable to provide a solid-state imaging device that makes it possible to reduce noise of a signal to be outputted from a pixel transistor.

A solid-state imaging device according to an embodiment of the present disclosure includes: a first substrate including a photoelectric converter and an electric charge accumulation section for each pixel, the electric charge accumulation section in which a signal electric charge generated in the photoelectric converter is accumulated; a second substrate including a semiconductor layer and a pixel transistor, the semiconductor layer being stacked on the first substrate, and the pixel transistor that includes a gate electrode opposed to the semiconductor layer, and reads the signal electric charge of the electric charge accumulation section; and a through electrode that is provided in the first substrate and the second substrate, and electrically couples the first substrate and the second substrate to each other and is partially in contact with the gate electrode.

In the solid-state imaging device according to the embodiment of the present disclosure, the gate electrode of the pixel transistor is provided in contact with a portion of the through electrode; therefore, an area of the gate electrode is increased, as compared with a case where the gate electrode is disposed apart from the through electrode.

BRIEF DESCRIPTION OF DRAWINGS

FIG. 46 is a schematic plan view of another example of a pixel separation section illustrated in FIG. 7A and the like.

MODES FOR CARRYING OUT THE INVENTION

Some embodiments of the present disclosure are described below in detail with reference to the drawings. It is to be noted that description is given in the following order.

1. Embodiment (An imaging device having a stacked structure of three substrates)

2. Modification Example 1 (An example in which a gate electrode is in contact with a front surface and a side surface of an amplification transistor)

3. Modification Example 2 (An example in which a gate electrode of the amplification transistor includes a through hole)

4. Modification Example 3 (An example including a connecting section that connects fins)

5. Modification Example 4 (An example in which the amplification transistor includes a planar type transistor)

6. Modification Example 5 (An example in which the amplification transistor includes an embedded type gate electrode)

7. Modification Example 6 (An example 1 of a planar configuration)

8. Modification Example 7 (An example 2 of the planar configuration)

9. Modification Example 8 (An example 3 of the planar configuration)

10. Modification Example 9 (An example including contact sections between substrates in a middle portion of a pixel array section)

11. Modification Example 10 (An example including a planar transfer transistor)

12. Modification Example 11 (An example in which one pixel is coupled to one readout circuit)

13. Modification Example 12 (A configuration example of a pixel separation section)

14. Modification Example 13 (An example in which one well contact is provided for every plurality of sensor pixels)

15. Application Example (An imaging system)

16. Practical Application Examples

1. Embodiment

[Functional Configuration of Imaging Device 1]

Figure 1:
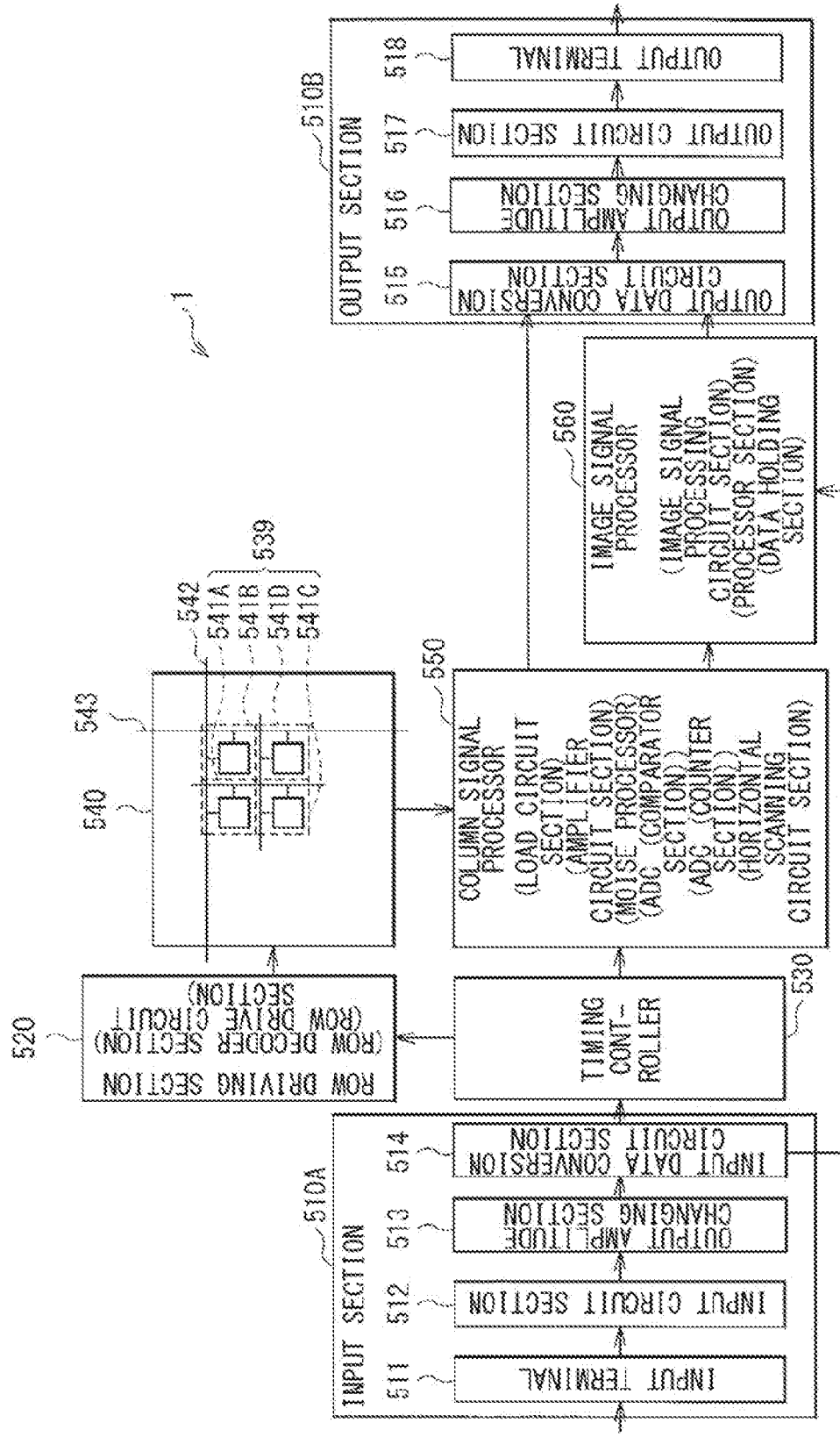
FIG. 1 is a block diagram illustrating an example of a functional configuration of an imaging device according to an embodiment of the present disclosure.

FIG. 1 is a block diagram illustrating an example of a functional configuration of a solid-state imaging device (an imaging device 1) according to an embodiment of the present disclosure.

The imaging device 1 in FIG. 1 includes, for example, an input section 510A, a row driving section 520, a timing controller 530, a pixel array section 540, a column signal processor 550, an image signal processor 560, and an output section 510B.

In the pixel array section 540, pixels 541 are repeatedly arranged in an array. More specifically, pixel sharing units 539 each including a plurality of pixels are repeating units, and are repeatedly arranged in an array in a row direction and a column direction. It is to be noted that in the present specification, for the sake of convenience, the row direction and the column direction orthogonal to the row direction are sometimes referred to as an "H direction" and a "V direction", respectively. In an example in FIG. 1, one pixel sharing unit 539 includes four pixels (pixels 541A, 541B, 541C, and 541D). The pixels 541A, 541B, 541C, and 541D each include a photodiode PD (illustrated in FIG. 6 and the like to be described later). The pixel sharing unit 539 is a unit sharing one pixel circuit (a pixel circuit 210 in FIG. 3 to be described later). In other words, one pixel circuit (the pixel circuit 210 to be described later) is included for every four pixels (the pixels 541A, 541B, 541C, and 541D). The pixel circuit is driven in a time division manner to sequentially read pixel signals of the respective pixels 541A, 541B, 541C, and 541D. The pixels 541A, 541B, 541C, and 541D are arranged in two rows by two columns, for example. The pixel array section 540 includes a plurality of row drive signal lines 542 and a plurality of vertical signal lines (column readout lines) 543 together with the pixels 541A, 541B, 541C, and 541D. The row drive signal lines 542 drive the pixels 541 that are arranged side by side in the row direction in the pixel array section 540 and included in the plurality of pixel sharing units 539. The row drive signal lines 542 drive each of pixels arranged side by side in the row direction in the pixel sharing units 539. As described in detail later with reference to FIG. 4, the pixel sharing unit 539 includes a plurality of transistors. In order to drive each of the plurality of transistors, a plurality of row drive signal lines 542 is coupled to one pixel sharing unit 539. The pixel sharing units 539 are coupled to the vertical signal lines (column readout lines) 543. The pixel signals are read from the respective pixels 541A, 541B, 541C, and 541D included in the pixel sharing units 539 through the vertical signal lines (column readout lines) 543.

The row driving section 520 includes, for example, a row address controller that determines the position of a row for driving pixels, that is, a row decoder section, and a row drive circuit section that generates a signal for driving the pixels 541A, 541B, 541C, and 541D.

The column signal processor 550 is coupled to, for example, the vertical signal lines 543, and includes a load circuit section that forms a source follower circuit with the pixels 541A, 541B, 541C, and 541D (the pixel sharing unit 539). The column signal processor 550 may include an amplifier circuit section that amplifies a signal read from the pixel sharing unit 539 through the vertical signal line 543. The column signal processor 550 may include a noise processor. The noise processor removes, for example, a noise level of a system from a signal read as a result of photoelectric conversion from the pixel sharing unit 539.

The column signal processor 550 includes, for example, an analog-digital converter (ADC). The analog-digital converter converts a signal read from the pixel sharing unit 539 or an analog signal having been subjected to noise processing described above into a digital signal. The ADC includes, for example, a comparator section and a counter section. The comparator section compares an analog signal as a conversion target with a reference signal as a comparison target. The counter section measures time until a comparison result in the comparator section is inverted. The column signal processor 550 may include a horizontal scanning circuit section that controls scanning of readout columns.

The timing controller 530 supplies a signal that controls a timing to the row driving section 520 and the column signal processor 550 on the basis of a reference clock signal and a timing control signal inputted to the device.

The image signal processor 560 is a circuit that performs various types of signal processing on data obtained as a result of photoelectric conversion, that is, data obtained as a result of an imaging operation in the imaging device 1. The image signal processor 560 includes, for example, an image signal processing circuit section and a data holding section. The image signal processor 560 may include a processor section.

One example of the signal processing to be executed in the image signal processor 560 is tone curve correction processing in which gray scales are increased in a case where AD-converted imaging data is data obtained by shooting a dark subject, and gray scales are decreased in a case where the AD-converted imaging data is data obtained by shooting a bright subject. In this case, it is desirable that characteristic data of tone curves about which tone curve is to be used to correct gray scales of imaging data be stored in advance in the data holding section of the image signal processor 560.

The input section 510A inputs, for example, the reference clock signal, the timing control signal, the characteristic data, and the like described above from outside the device to the imaging device 1. Examples of the timing control signal include a vertical synchronization signal, a horizontal synchronization signal, and the like. The characteristic data is to be stored in the data holding section of the image signal processor 560, for example. The input section 510A includes, for example, an input terminal 511, an input circuit section 512, an input amplitude changing section 513, an input data conversion circuit section 514, and a power source section (not illustrated).

The input terminal 511 is an external terminal for inputting data. The input circuit section 512 takes a signal inputted to the input terminal 511 into the imaging device 1. The input amplitude changing section 513 changes amplitude of the signal taken by the input circuit section 512 into amplitude easy to be used inside the imaging device 1. The input data conversion circuit section 514 changes the order of data columns of input data. The input data conversion circuit section 514 includes, for example, a serial-parallel conversion circuit. The serial-parallel conversion circuit converts a serial signal received as input data into a parallel signal. It is to be noted that in the input section 510A, the input amplitude changing section 513 and the input data conversion circuit section 514 may be omitted. The power source section supplies power that is set to various types of voltages necessary inside the imaging device 1 with use of power supplied from outside to the imaging device 1.

In a case where the imaging device 1 is coupled to an external memory device, the input section 510A may include a memory interface circuit that receives data from the external memory device. Examples of the external memory device include a flash memory, an SRAM, a DRAM, and the like.

The output section 510B outputs image data to outside of the device. Examples of the image data include image data captured by the imaging device 1, image data having been subjected to signal processing by the image signal processor 560, and the like The output section 510B includes, for example, an output data conversion circuit section 515, an output amplitude changing section 516, an output circuit section 517, and an output terminal 518.

The output data conversion circuit section 515 includes, for example, a parallel-serial conversion circuit. The output data conversion circuit section 515 converts a parallel signal used inside the imaging device 1 into a serial signal. The output amplitude changing section 516 changes amplitude of a signal used inside the imaging device 1. The signal having changed amplitude is easily used in an external device coupled to the outside of the imaging device 1. The output circuit section 517 is a circuit that outputs data from inside the imaging device 1 to the outside of the device, and the output circuit section 517 drives a wiring line outside the imaging deice 1 coupled to the output terminal 518. At the output terminal 518, data is outputted from the imaging device 1 to the outside of the device. In the output section 510B, the output data conversion circuit section 515 and the output amplitude changing section 516 may be omitted.

In a case where the imaging device 1 is coupled to an external memory device, the output section 510B may include a memory interface circuit that outputs data to the external memory device. Examples of the external memory device include a flash memory, an SRAM, a DRAM, and the like.

[Schematic Configuration of Imaging Device 1]

Figure 2:
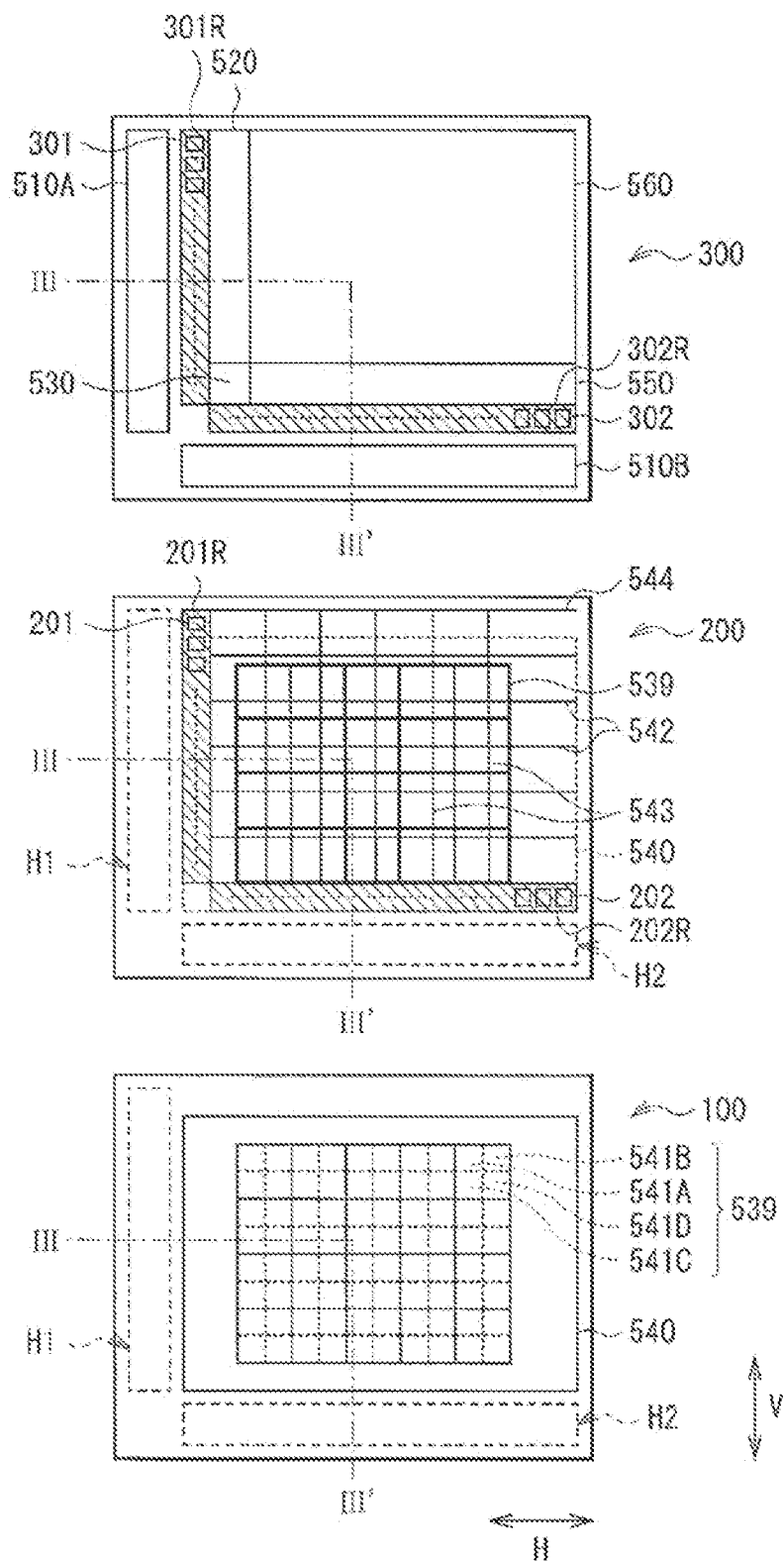
FIG. 2 is a schematic plan view of a schematic configuration of the imaging device illustrated in FIG. 1.
Figure 3:
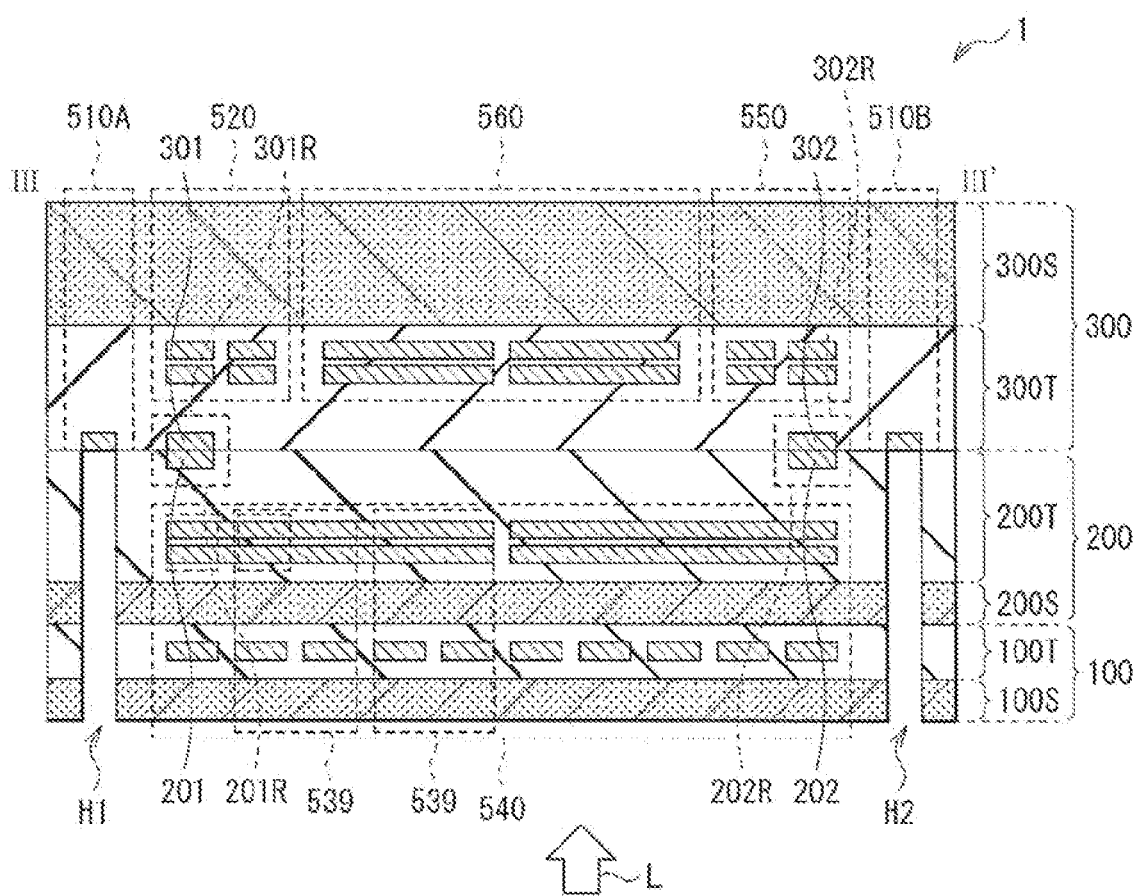
FIG. 3 is a schematic view of a cross-sectional configuration taken along a line III-III' illustrated in FIG. 2.

FIGS. 2 and 3 each illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300, and FIG. 3 schematically illustrates a cross-sectional configuration of the first substrate 100, the second substrate 200, and the third substrate 300 that are stacked on each other. FIG. 3 corresponds to a cross-sectional configuration taken along a line illustrated in FIG. 2. The imaging device 1 is an imaging device having a three-dimensional structure in which three substrates (the first substrate 100, the second substrate 200, and the third substrate 300) are bonded together. The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Herein, for the sake of convenience, a combination of a wiring line included in each substrate of the first substrate 100, the second substrate 200, and the third substrate 300 and its surrounding interlayer insulating film is referred to as a wiring layer (100T, 200T, or 300T) provided in each of substrates (the first substrate 100, the second substrate 200, and the third substrate 300). The first substrate 100, the second substrate 200, and the third substrate 300 are stacked in this order, and the semiconductor layer 100S, the wiring layer 100T, the semiconductor layer 200S, the wiring layer 200T, the wiring layer 300T, and the semiconductor layer 300S are disposed in this order in a stacking direction. Specific configurations of the first substrate 100, the second substrate 200, and the third substrate 300 are described later. An arrow illustrated in FIG. 3 indicates an incident direction of light L onto the imaging device 1. In the present specification, for the sake of convenience, in subsequent cross-sectional views, light incident side in the imaging device 1 is sometimes referred to as "bottom", "lower side", or "below", and side opposite to the light incident side is sometimes referred to as "top", "upper side", or "above". In addition, in the present specification, for the sake of convenience, in a substrate including a semiconductor layer and a wiring layer, side of the wiring layer is sometimes referred to as a front surface, and side of the semiconductor layer is sometimes referred to as a back surface. It is to be noted that references in the specification are not limited to those described above. The imaging device 1 is, for example, a back-illuminated imaging device in which light enters from back surface side of the first substrate 100 including a photodiode.

The pixel array section 540 and the pixel sharing units 539 included in the pixel array section 540 are both configured with use of both the first substrate 100 and the second substrate 200. The first substrate 100 includes a plurality of pixels 541A, 541B, 541C, and 541D included in the pixel sharing units 539. Each of the pixels 541 includes a photodiode (a photodiode PD to be described later) and a transfer transistor (a transfer transistor TR to be described later). The second substrate 200 includes pixel circuits (pixel circuits 210 to be described later) included in the pixel sharing units 539. The pixel circuits each read a pixel signal transferred from the photodiode of each of the pixels 541A, 541B, 541C, and 541D through the transfer transistor, or reset the photodiode. The second substrate 200 includes, in addition to such pixel circuits, a plurality of row drive signal lines 542 extending in the row direction and a plurality of vertical signal lines 543 extending in the column direction. The second substrate 200 further includes a power source line 544 extending in the row direction. The third substrate 300 includes, for example, the input section 510A, the row driving section 520, the timing controller 530, the column signal processor 550, the image signal processor 560, and the output section 510B. The row driving section 520 is provided in, for example, a region partially overlapping the pixel array section 540 in a stacking direction of the first substrate 100, the second substrate 200, and the third substrate 300 (hereinafter simply referred to as a stacking direction). More specifically, the row driving section 520 is provided in a region overlapping a portion in proximity to an end in the H direction of the pixel array section 540 in the stacking direction (FIG. 2). The column signal processor 550 is provided in, for example, a region partially overlapping the pixel array section 540 in the stacking direction. More specifically, the column signal processor 550 is provided in a region overlapping a portion in proximity to an end in the V direction of the pixel array section 540 in the stacking direction (FIG. 2). Although not illustrated, the input section 510A and the output section 510B may be disposed in a portion other than the third substrate 300, and may be disposed in the second substrate 200, for example. Alternatively, the input section 510A and the output section 510B may be provided on the back surface (light incident surface) side of the first substrate 100. It is to be noted that the pixel circuit provided in the second substrate 200 described above is also referred to as a pixel transistor circuit, a pixel transistor group, a pixel transistor, a pixel readout circuit, or a readout circuit. In the present specification, the term "pixel circuit" is used.

The first substrate 100 and the second substrate 200 are electrically coupled to each other by, for example, a through electrode (through electrodes 120E and 121E in FIG. 6 to be described later). The second substrate 200 and the third substrate 300 are electrically coupled to each other through, for example, contact sections 201, 202, 301, and 302. The second substrate 200 is provided with the contact sections 201 and 202, and the third substrate 300 is provided with the contact sections 301 and 302. The contact section 201 of the second substrate 200 is in contact with the contact section 301 of the third substrate 300, and the contact section 202 of the second substrate 200 is in contact with the contact section 302 of the third substrate 300. The second substrate 200 includes a contact region 201R provided with a plurality of contact sections 201 and a contact region 202R provided with a plurality of contact sections 202. The third substrate 300 includes a contact region 301R provided with a plurality of contact sections 301 and a contact region 302R provided with a plurality of contact sections 302. The contact regions 201R and 301R are provided in the stacking direction between the pixel array section 540 and the row driving section 520 (FIG. 3). In other words, the contact regions 201R and 301R are provided in, for example, a region where the row driving section 520 (the third substrate 300) and the pixel array section 540 (the second substrate 200) overlap each other in the stacking direction, or a region in proximity to the region. The contact regions 201R and 301R are disposed at an end in the H direction of such a region, for example (FIG. 2). In the third substrate 300, the contact region 301R is provided, for example, at a position overlapping a portion of the row driving section 520, specifically an end in the H direction of the row driving section 520 (FIGS. 2 and 3). The contact sections 201 and 301 couple, for example, the row driving section 520 provided in the third substrate 300 and the row drive lines 542 provided in the second substrate 200 to each other. The contact sections 201 and 301 may couple, for example, the input section 510A provided in the third substrate 300 to the power source line 544 and a reference potential line (a reference potential line VSS to be described later). The contact regions 202R and 302R are provided in the stacking direction between the pixel array section 540 and the column signal processor 550 (FIG. 3). In other words, the contact regions 202R and 302R are provided in, for example, a region where the column signal processor 550 (the third substrate 300) and the pixel array section 540 (the second substrate 200) overlap each other in the stacking direction, or a region in proximity to the region. The contact regions 202R and 302R are disposed at an end in the V direction of such a region (FIG. 2). In the third substrate 300, the contact region 301R is provided, for example, at a position overlapping a portion of the column signal processor 550, specifically an end in the V direction of the column signal processor 550 (FIGS. 2 and 3). The contact sections 202 and 302 couple, for example, a pixel signal outputted from each of the plurality of pixel sharing units 539 included in the pixel array section 540 (a signal corresponding to the amount of electric charges generated as a result of photoelectric conversion by the photodiode) to the column signal processor 550 provided in the third substrate 300. The pixel signal is transmitted from the second substrate 200 to the third substrate 300.

FIG. 3 is an example of a cross-sectional view of the imaging device 1 as described above. The first substrate 100, the second substrate 200, and the third substrate 300 are electrically coupled to each other through the wiring layers 100T, 200T, and 300T. For example, the imaging device 1 includes an electrical coupling section that electrically couples the second substrate 200 and the third substrate 300 to each other. Specifically, the contact sections 201, 202, 301, and 302 are each formed using an electrode that is formed using an electrically conductive material. The electrically conductive material is formed using, for example, a metal material such as copper (Cu), aluminum (Al), and gold (Au). The contact regions 201R, 202R, 301R, and 302R electrically couple the second substrate and the third substrate to each other, for example, by directly bonding wiring lines formed as electrodes, which makes it possible to input and/or output signals to and from the second substrate 200 and the third substrate 300.

It is possible to provide, at a desired position, the electrical coupling section that electrically couples the second substrate 200 and the third substrate 300 to each other. For example, as described in FIG. 3 as the contact regions 202R, 301R, and 302R, the electrical coupling section may be provided in a region overlapping the pixel array section 540 in the stacking direction. In addition, the electrical coupling section may be provided in a region not overlapping the pixel array section 540 in the stacking direction. Specifically, the electrical coupling section may be provided in a region overlapping, in the stacking direction, a peripheral section disposed outside the pixel array section 540.

The first substrate 100 and the second substrate 200 include, for example, coupling hole sections H1 and H2. The coupling hole sections H1 and H2 penetrate through the first substrate 100 and the second substrate 200 (FIG. 3). The coupling hole sections H1 and H2 are provided outside the pixel array section 540 (or a portion overlapping the pixel array section 540) (FIG. 2). For example, the coupling hole section H1 is disposed outside the pixel array section 540 in the H direction, and the coupling hole section H2 is disposed outside the pixel array section 540 in the V direction. For example, the coupling hole section H1 reaches the input section 510A provided in the third substrate 300, and the coupling hole section H2 reaches the output section 510B provided in the third substrate 300. The coupling hole sections H1 and H2 may be hollows, or may at least partially include an electrically conductive material. For example, there is a configuration in which a bonding wire is coupled to an electrode formed as the input section 510A and/or the output section 510B. Alternatively, there is a configuration in which the electrode formed as the input section 510A and/or the output section 510B and the electrically conductive material provided in the coupling hole sections H1 and H2 are coupled to each other. The electrically conductive material provided in the coupling hole sections H1 and H2 may be embedded in a portion or the entirety of each of the coupling hole sections H1 and H2, or the electrically conductive material may be formed on a sidewall of each of the coupling hole sections H1 and H2.

It is to be noted that FIG. 3 illustrates a configuration in which the input section 510A and the output section 510B are provided in the third substrate 300, but this is not limitative. For example, transmitting a signal of the third substrate 300 to the second substrate 200 through the wiring layers 200T and 300T makes it possible to provide the input section 510A and/or the output section 510B in the second substrate 200. Likewise, transmitting a signal of the second substrate 200 to the first substrate 100 through the wiring layers 100T and 200T makes it possible to provide the input section 510A and/or the output section 510B in the first substrate 100.

Figure 4:
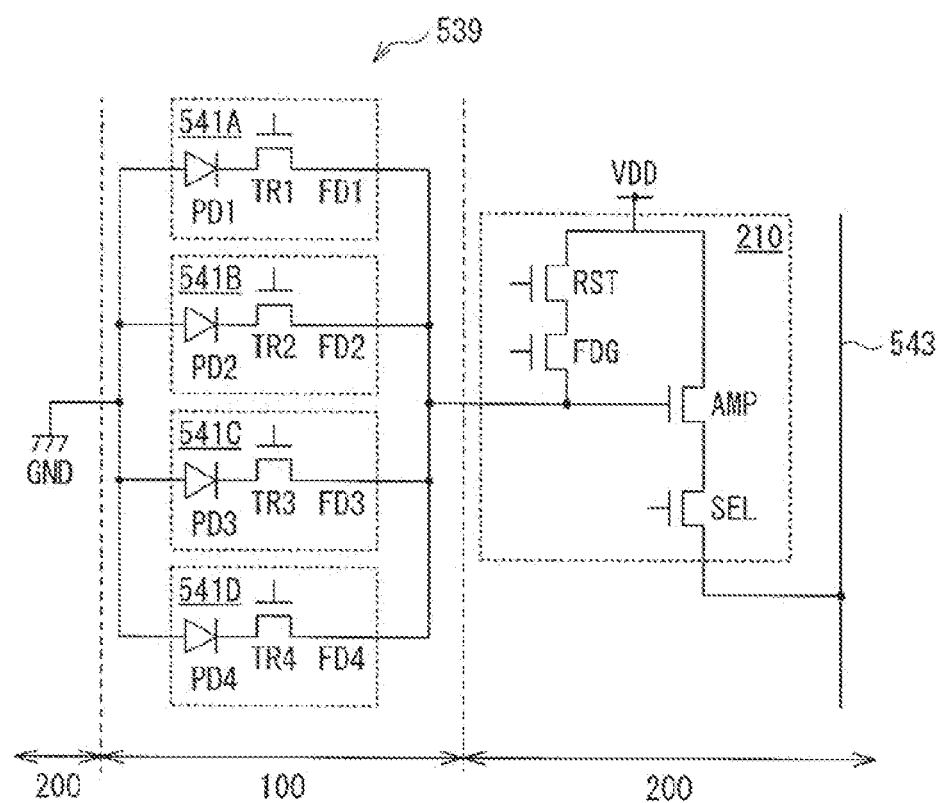
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes a plurality of pixels 541 (FIG. 4 illustrates four pixels 541, that is, the pixels 541A, 541B, 541C, and 541D), one pixel circuit 210 coupled to the plurality of pixels 541, and the vertical signal line 543 coupled to the pixel circuit 210. The pixel circuit 210 includes, for example, four transistors, specifically, an amplification transistor AMP, a selection transistor SEL, a reset transistor RST, and an FD conversion gain switching transistor FDG. As described above, the pixel sharing unit 539 operates one pixel circuit 210 in a time division manner to sequentially output pixel signals of the four pixels 541 (the pixels 541A, 541B, 541C, and 541D) included in the pixel sharing unit 539 to the vertical signal line 543. One pixel circuit 210 is coupled to the plurality of pixels 541, and a mode in which the pixel signals of the plurality of pixels 541 are outputted by the one pixel circuit 210 in a time division manner means "sharing one pixel circuit 210 by the plurality of pixels 541". Herein, at least one transistor (for example, the amplification transistor AMP, the selection transistor SEL, the reset transistor RST, or the FD conversion gain switching transistor FDG) included in the pixel circuit 210 corresponds to a specific example of a "pixel transistor" of the present disclosure.

The pixels 541A, 541B, 541C, and 541D include components common to each other. Hereinafter, in order to distinguish components of the pixels 541A, 541B, 541C, and 541D from one another, an identification number "1" is assigned at the end of a reference sign of the component of the pixel 541A, an identification number "2" is assigned at the end of a reference sign of the component of the pixel 541B, an identification number "3" is assigned at the end of a reference sign of the component of the pixel 541C, and an identification number "4" is assigned at the end of a reference sign of the component of the pixel 541D. In a case where the components of the pixels 541A, 541B, 541C, and 541D do not need to be distinguished from one another, the identification number at the end of the reference sign of the component of each of the pixels 541A, 541B, 541C, and 541D is omitted.

The pixels 541A, 541B, 541C, and 541D each include, for example, the photodiode PD, the transfer transistor TR electrically coupled to the photodiode PD, and a floating diffusion FD electrically coupled to the transfer transistor TR. In the photodiode PD (PD1, PD2, PD3, and PD4), a cathode is electrically coupled to a source of the transfer transistor TR, and an anode is electrically coupled to the reference potential line (e.g., a ground). The photodiode PD photoelectrically converts incident light to generate electric charges corresponding to the amount of received light. The transfer transistor TR (transfer transistors TR1, TR2, TR3, and TR4) is, for example, an n-type CMOS (Complementary Metal Oxide Semiconductor) transistor. In the transfer transistor TR, a drain is electrically coupled to the floating diffusion FD, and a gate is electrically coupled to a drive signal line. The drive signal line is a portion of the plurality of row drive signal lines 542 (see FIG. 1) coupled to one pixel sharing unit 539. The transfer transistor TR transfers the electric charges generated by the photodiode PD to the floating diffusion FD. The floating diffusion FD (floating diffusions FD1, FD2, FD3, and FD4) is an n-type diffusion layer region formed in a p-type semiconductor layer. The floating diffusion FD is an electric charge holding means that temporarily holds the electric charges transferred from the photodiode PD, as well as an electric charge-voltage conversion means that generates a voltage corresponding to the amount of the electric charges. Herein, the photodiode PD corresponds to a specific example of a "photoelectric converter" of the present disclosure, and the floating diffusion FD corresponds to a specific example of an "electric charge accumulation section" of the present disclosure.

The four floating diffusions FD (the floating diffusions FD1, FD2, FD3, and FD4) included in one pixel sharing unit 539 are electrically coupled to each other, and are electrically coupled to a gate of the amplification transistor AMP and a source of the FD conversion gain switching transistor FDG. A drain of the FD conversion gain switching transistor FDG is coupled to a source of the reset transistor RST, and a gate of the FD conversion gain switching transistor FDG is coupled to a drive signal line. The drive signal line is a portion of the plurality of row drive signal lines 542 coupled to the one pixel sharing unit 539. A drain of the reset transistor RST is coupled to the power source line VDD, and a gate of the reset transistor RST is coupled to a drive signal line. The drive signal line is a portion of the plurality of row drive signal lines 542 coupled to the one pixel sharing unit 539. A gate of the amplification transistor AMP is coupled to the floating diffusion FD, a drain of the amplification transistor AMP is coupled to the power source line VDD, and a source of the amplification transistor AMP is coupled to a drain of the selection transistor SEL. A source of the selection transistor SEL is coupled to the vertical signal line 543, and a gate of the selection transistor SEL is coupled to a drive signal line. The drive signal line is a portion of the plurality of row drive signal lines 542 coupled to the one pixel sharing unit 539.

In a case where the transfer transistor TR is turned on, the transfer transistor TR transfers electric charges of the photodiode PD to the floating diffusion FD. The gate (a transfer gate TG) of the transfer transistor TR includes, for example, a so-called vertical electrode, and is provided to extend from a front surface of a semiconductor layer (the semiconductor layer 100S in FIG. 6 to be described later) to a depth reaching the PD, as illustrated in FIG. 6 to be described later. The reset transistor RST resets the potential of the floating diffusion FD to a predetermined potential. In a case where the reset transistor RST is turned on, the potential of the floating diffusion FD is reset to the potential of the power source line VDD. The selection transistor SEL controls an output timing of the pixel signal from the pixel circuit 210. The amplification transistor AMP generates, as the pixel signal, a signal of a voltage corresponding to the level of electric charges held by the floating diffusion FD. The amplification transistor AMP is coupled to the vertical signal line 543 through the selection transistor SEL. The amplification transistor AMP configures a source follower together with the load circuit section (see FIG. 1) coupled to the vertical signal line 543 in the column signal processor 550.

In a case where the selection transistor SEL is turned on, the amplification transistor AMP outputs the voltage of the floating diffusion FD to the column signal processor 550 through the vertical signal line 543. The reset transistor RST, the amplification transistor AMP, and the selection transistor SEL are, for example, N-type CMOS type transistors.

The FD conversion gain switching transistor FDG is used to change a gain of electric charge-voltage conversion in the floating diffusion FD. In general, a pixel signal is small when shooting in a dark place. In performing electric charge-voltage conversion on the basis of Q=CV, larger capacity of the floating diffusion FD (FD capacity C) causes the value V to be smaller upon conversion to a voltage at the amplification transistor AMP. Meanwhile, the pixel signal becomes large in a bright place; it is therefore not possible, for the floating diffusion FD, to receive the electric charges of the photodiode PD unless the FD capacity C is large. Further, the FD capacity C needs to be large to allow the value V not to be too large (in other words, to be small) upon the conversion to a voltage at the amplification transistor AMP. Taking these into account, when the FD conversion gain switching transistor FDG is turned on, a gate capacity for the FD conversion gain switching transistor FDG is increased, thus causing the entire FD capacity C to be large. Meanwhile, when the FD conversion gain switching transistor FDG is turned off, the entire FD capacity C becomes small. In this manner, performing ON/OFF switching of the FD conversion gain switching transistor FDG enables the FD capacity C to be variable, thus making it possible to switch conversion efficiency. The FD conversion gain switching transistor FDG is, for example, an N-type CMOS type transistor.

It is to be noted that a configuration is possible in which the FD conversion gain switching transistor FDG is not provided. On this occasion, the pixel circuit 210 includes, for example, three transistors, that is, the amplification transistor AMP, the selection transistor SEL, and the reset transistor RST. The pixel circuit 210 includes, for example, at least one of the pixel transistors such as the amplification transistor AMP, the selection transistor SEL, the reset transistor RST, and the FD conversion gain switching transistor FDG.

The selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the row drive signal line 542 (see FIG. 1). The source (an output end of the pixel circuit 210) of the amplification transistor AMP is electrically coupled to the vertical signal line 543, and the gate of the amplification transistor AMP is electrically coupled to the source of the reset transistor RST. It is to be noted that although not illustrated, the number of pixels 541 that share one pixel circuit 210 may be other than four. For example, two or eight pixels 541 may share one pixel circuit 210.

Figure 5:
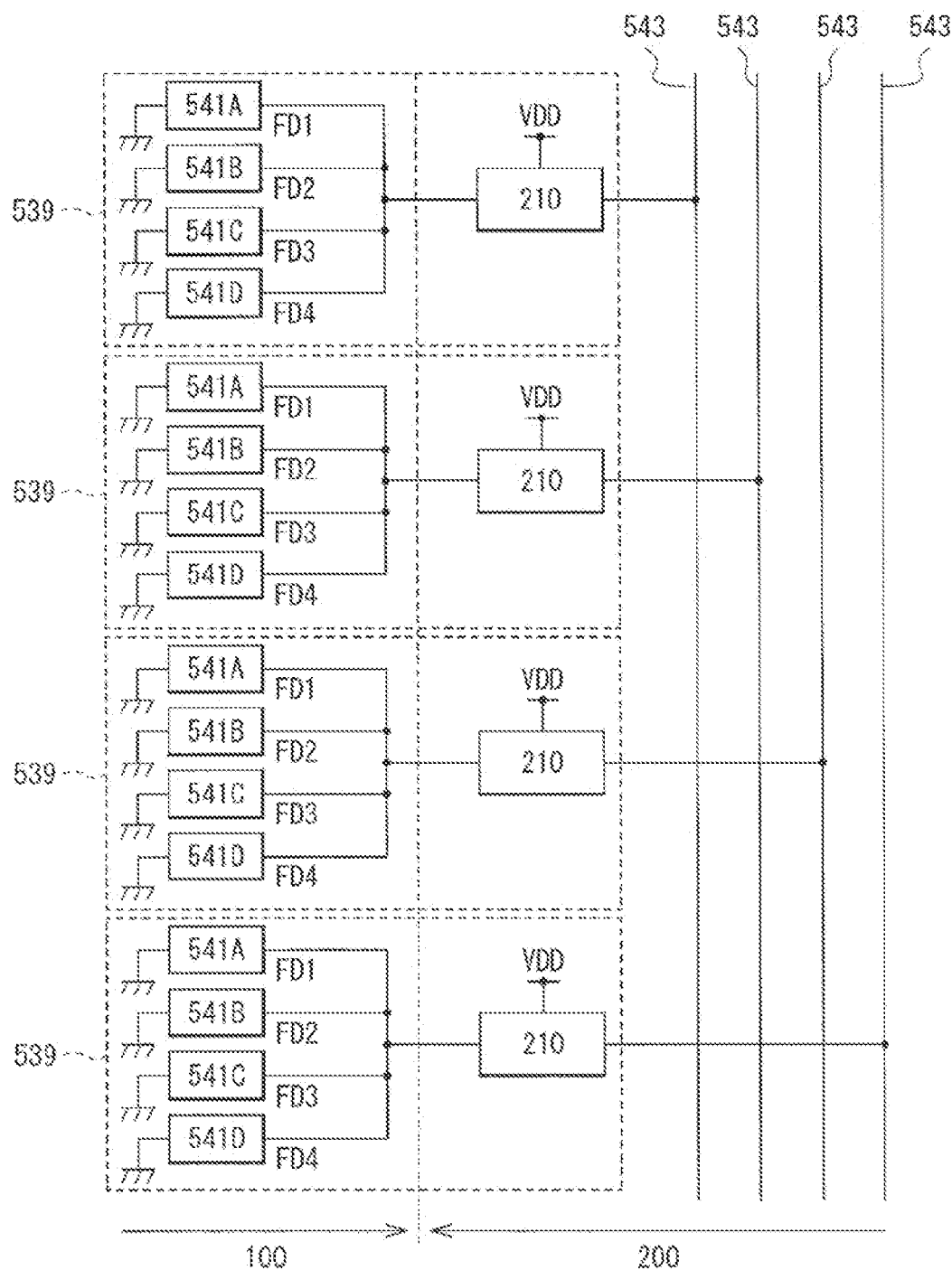
FIG. 5 is a diagram illustrating an example of a coupling mode between a plurality of pixel sharing units and a plurality of vertical signal lines.

FIG. 5 illustrates an example of a coupling mode between a plurality of pixel sharing units 539 and the vertical signal lines 543. For example, four pixel sharing units 539 arranged side by side in the column direction are divided into four groups, and the vertical signal line 543 is coupled to each of the four groups. For ease of explanation, FIG. 5 illustrates an example in which each of the four groups includes one pixel sharing unit 539; however, each of the four groups may include a plurality of pixel sharing units 539. As described above, in the imaging device 1, the plurality of pixel sharing units 539 arranged side by side in the column direction may be divided into groups including one or a plurality of pixel sharing units 539. For example, the vertical signal line 543 and the column signal processing circuit 550 are coupled to each of the groups, which makes it possible to simultaneously read the pixel signals from the respective groups. Alternatively, in the imaging device 1, one vertical signal line 543 may be coupled to a plurality of pixel sharing units 539 arranged side by side in the column direction. On this occasion, the pixel signals are sequentially read from the plurality of pixel sharing units 539 coupled to the one vertical signal line 543 in a time division manner.

[Specific Configuration of Imaging Device 1]

Figure 6:
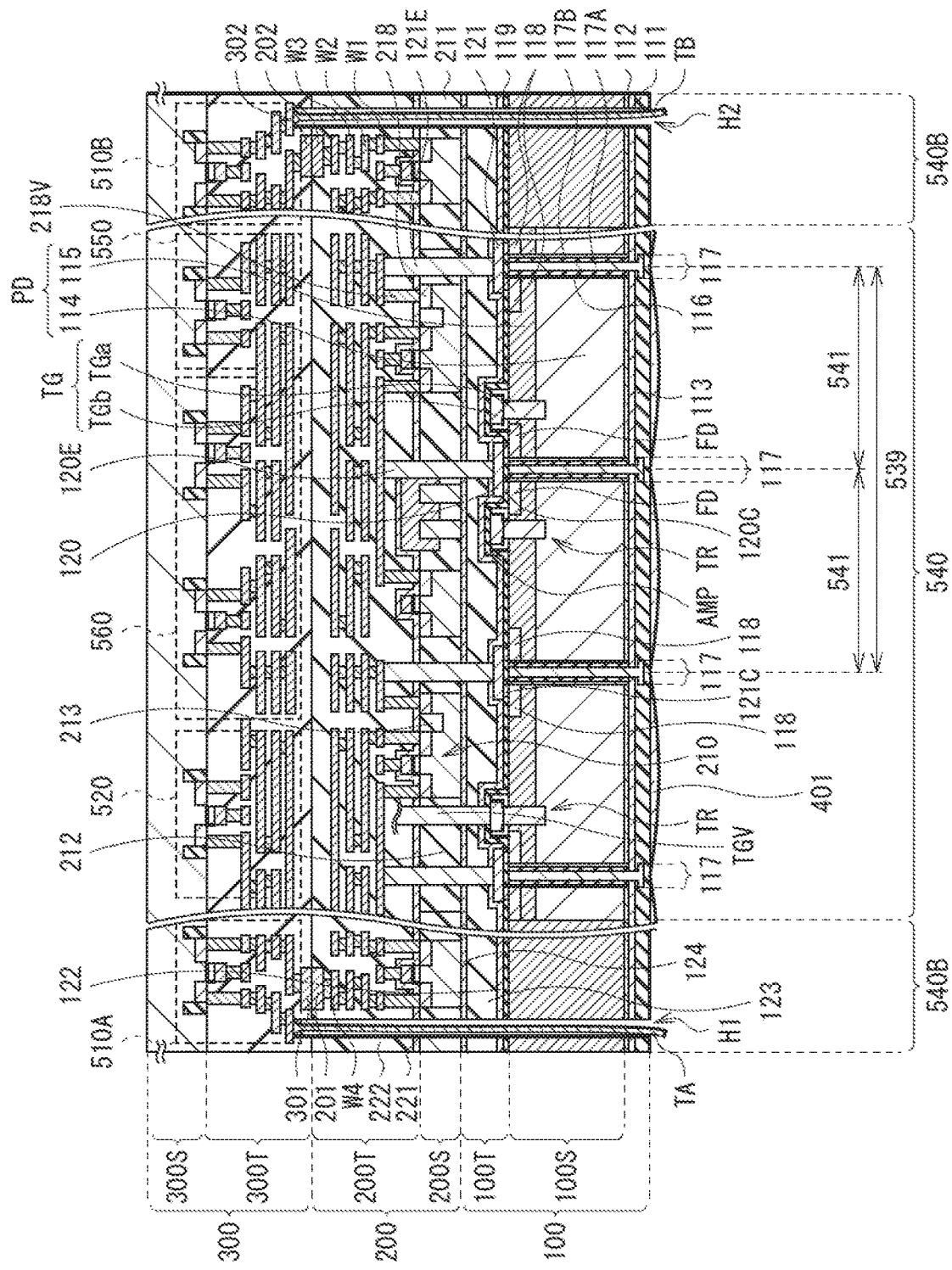
FIG. 6 is a schematic cross-sectional view of an example of a specific configuration of the imaging device illustrated in FIG. 3.

FIG. 6 illustrates an example of a cross-sectional configuration in a vertical direction with respect to main surfaces of the first substrate 100, the second substrate 200, and the third substrate 300 of the imaging device 1. FIG. 6 schematically illustrates a positional relationship of components for ease of understanding, and may be different from an actual cross section. In the imaging device 1, the first substrate 100, the second substrate 200, and the third substrate 300 are stacked in this order. The imaging device 1 further includes a light-receiving lens 401 on the back surface side (light incident surface side) of the first substrate 100. A color filter layer (not illustrated) may be provided between the light-receiving lens 401 and the first substrate 100. The light-receiving lens 401 is provided for each of the pixels 541A, 541B, 541C, and 541D, for example. The imaging device 1 is, for example, a back-illuminated imaging device. The imaging device 1 includes the pixel array section 540 disposed in a middle portion and a peripheral section 540B disposed outside the pixel array section 540.

The first substrate 100 includes an insulating film 111, a fixed electric charge film 112, the semiconductor layer 100S, and the wiring layer 100T in order from side of the light-receiving lens 401. The semiconductor layer 100S includes, for example, a silicon substrate. The semiconductor layer 100S includes, for example, a p-well layer 115 in a portion of the front surface (a surface on side of the wiring layer 100T) and in proximity to the portion, and includes an n-type semiconductor region 114 in a region (a region deeper than the p-well layer 115) other than the p-well layer 115. For example, the pn-junction photodiode PD includes the n-type semiconductor region 114 and the p-well layer 115. The p-well layer 115 is a p-type semiconductor region.

Figure 7A:
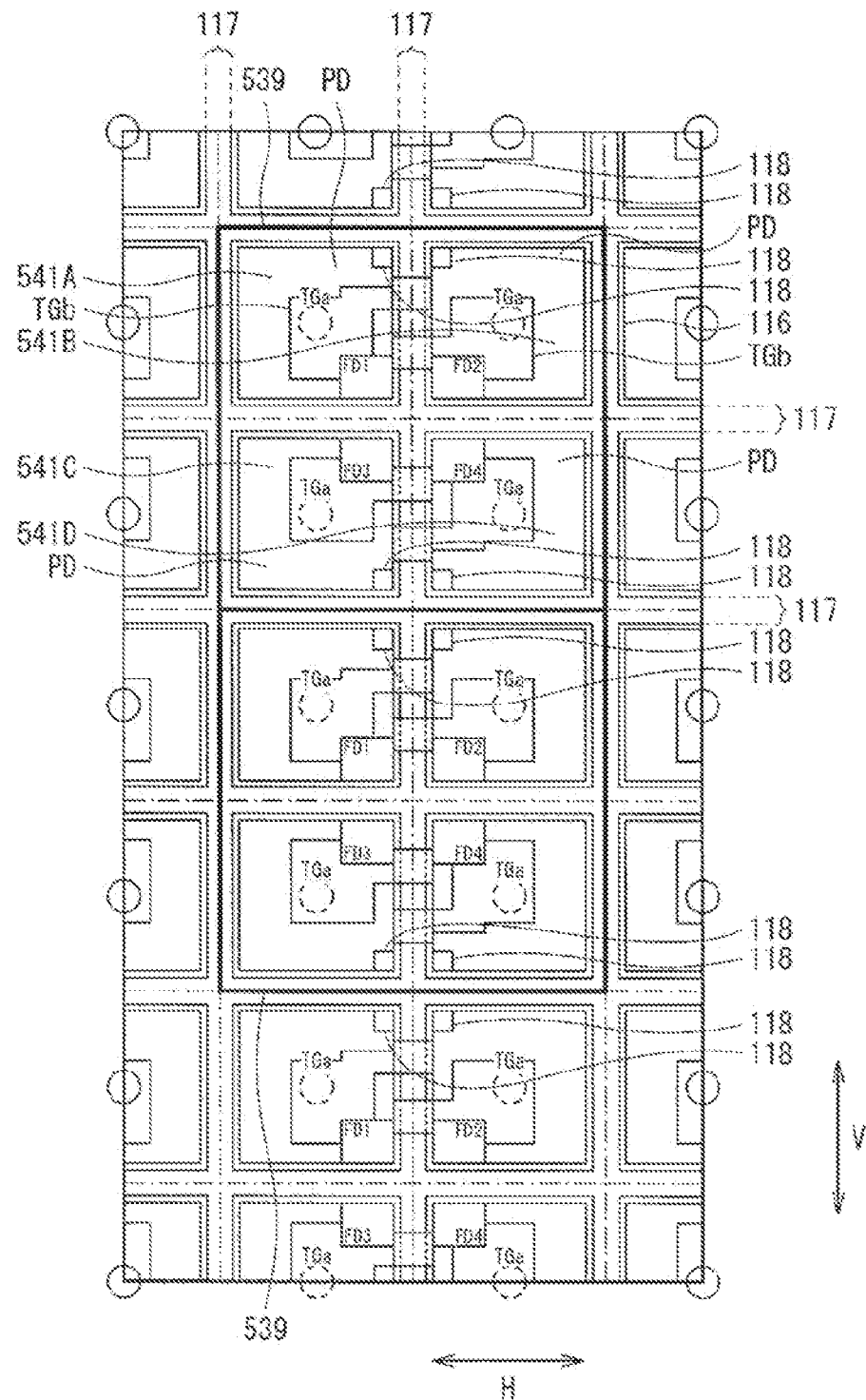
FIG. 7A is a schematic view of an example of a planar configuration of a main part of a first substrate illustrated in FIG. 6.

FIG. 7A illustrates an example of a planar configuration of the first substrate 100. FIG. 7A mainly illustrates a planar configuration of a pixel separation section 117, the photodiode PD, the floating diffusion FD, a VSS contact region 118, and the transfer transistor TR of the first substrate 100. The configuration of the first substrate 100 is described with use of FIG. 7A together with FIG. 6.

The floating diffusion FD and the VSS contact region 118 are provided in proximity to the front surface of the semiconductor layer 100S. The floating diffusion FD includes an n-type semiconductor region provided in the p-well layer 115. The floating diffusions FD (the floating diffusions FD1, FD2, FD3, and FD4) of the pixels 541A, 541B, 541C, and 541D are provided close to each other in a middle portion of the pixel sharing unit 539, for example (FIG. 7A). As described in detail later, the four floating diffusions (the floating diffusions FD1, FD2, FD3, and FD4) included in the pixel sharing unit 539 are electrically coupled to each other in the first substrate (more specifically in the wiring layer 100T) through an electrical coupling means (a pad section 120 to be described later). Furthermore, the floating diffusions FD are coupled from the first substrate 100 to the second substrate 200 (more specifically, from the wiring layer 100T to the wiring layer 200T) through an electrical means (the through electrode 120E to be described later). In the second substrate 200 (more specifically inside the wiring layer 200T), the floating diffusions FD are electrically coupled to the gate of the amplification transistor AMP and the source of the FD conversion gain switching transistor FDG by the electrical means.

The VSS contact region 118 is a region electrically coupled to the reference potential line VSS, and is disposed apart from the floating diffusion FD. For example, in the pixels 541A, 541B, 541C, and 541D, the floating diffusion FD is disposed at one end in the V direction of each pixel, and the VSS contact region 118 is disposed at another end (FIG. 7A). The VSS contact region 118 includes, for example, a p-type semiconductor region. The VSS contact region 118 is coupled to a ground potential or a fixed potential, for example. Thus, a reference potential is supplied to the semiconductor layer 100S.

The first substrate 100 includes the transfer transistor TR together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on front surface side (side opposite to the light incident surface side, side of the second substrate 200) of the semiconductor layer 100S. The transfer transistor TR includes the transfer gate TG. The transfer gate TG includes, for example, a horizontal portion TGb opposed to the front surface of the semiconductor layer 100S, and a vertical portion TGa provided inside the semiconductor layer 100S. The vertical portion TGa extends in a thickness direction of the semiconductor layer 100S. The vertical portion TGa has one end in contact with the horizontal portion TGb, and another end provided inside the n-type semiconductor region 114. The transfer transistor TR includes such a vertical transistor, which hinders occurrence of a failure in transferring the pixel signal, thus making it possible to improve readout efficiency of the pixel signal.

The horizontal portion TGb of the transfer gate TG extends from a position opposed to the vertical portion TGa toward, for example, the middle portion of the pixel sharing unit 539 in the H direction (FIG. 7A). This makes it possible to bring the position in the H direction of a through electrode (the through electrode TGV to be described later) that reaches the transfer gate TG close to positions in the H direction of through electrodes (the through electrodes 120E and 121E to be described later) coupled to the floating diffusion FD and the VSS contact region 118. For example, the plurality of pixel sharing units 539 provided in the first substrate 100 have the same configuration as each other (FIG. 7A).

Figure 7B:
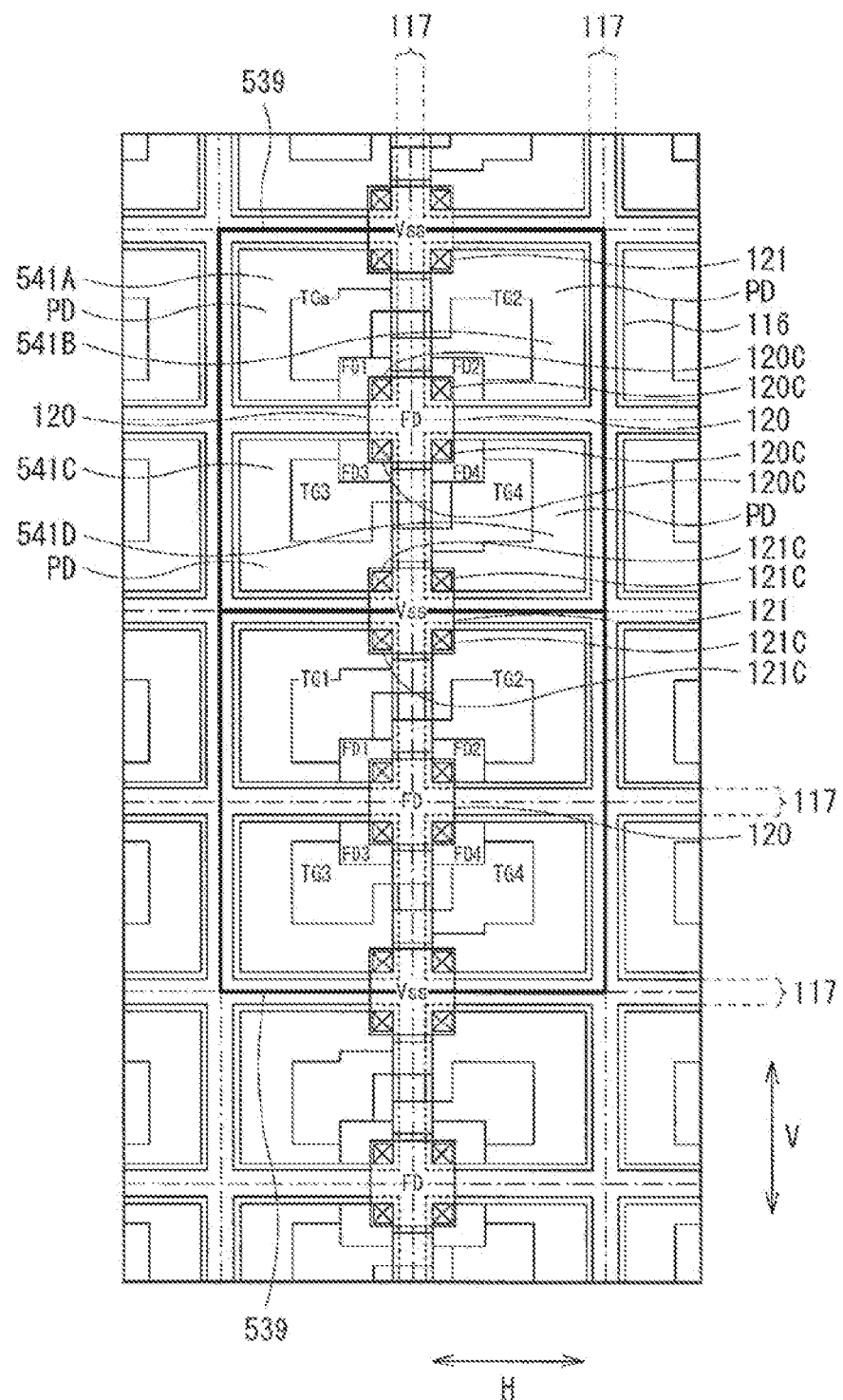
FIG. 7B is a schematic view of a planar configuration of pad sections together with the main part of the first substrate illustrated in FIG. 7A.

The semiconductor layer 100S includes the pixel separation section 117 that separates the pixels 541A, 541B, 541C, and 541D from each other. The pixel separation section 117 is formed to extend in a direction normal to the semiconductor layer 100S (a direction perpendicular to the front surface of the semiconductor layer 100S). The pixel separation section 117 is provided to partition the pixels 541A, 541B, 541C, and 541D from each other, and has a planar grid shape (FIGS. 7A and 7B). For example, the pixel separation section 117 electrically and optically separates the pixels 541A, 541B, 541C, and 541D from each other. The pixel separation section 117 includes, for example, a light-shielding film 117A and an insulating film 117B. For example, tungsten (W) or the like is used for the light-shielding film 117A. The insulating film 117B is provided between the light-shielding film 117A and the p-well layer 115 or the n-type semiconductor region 114. The insulating film 117B includes, for example, silicon oxide (SiO). The pixel separation section 117 has, for example, an FTI (Full Trench Isolation) structure, and penetrates through the semiconductor layer 100S. Although not illustrated, the pixel separation section 117 is not limited to the FTI structure that penetrates through the semiconductor layer 100S. For example, the pixel separation section 117 may have a DTI (Deep Trench Isolation) structure that does not penetrate through the semiconductor layer 100S. The pixel separation section 117 extends in the direction normal to the semiconductor layer 100S, and is formed in a partial region of the semiconductor layer 100S.

The semiconductor layer 100S includes, for example, a first pinning region 113 and a second pinning region 116. The first pinning region 113 is provided in proximity to the back surface of the semiconductor layer 100S, and is disposed between the n-type semiconductor region 114 and the fixed electric charge film 112. The second pinning region 116 is provided on a side surface of the pixel separation section 117, specifically, between the pixel separation section 117 and the p-well layer 115 or the n-type semiconductor region 114. The first pinning region 113 and the second pinning region 116 each include, for example, a p-type semiconductor region.

The fixed electric charge film 112 having a negative fixed electric charge is provided between the semiconductor layer 100S and the insulating film 111. The first pinning region 113 of a hole accumulation layer is formed at an interface on side of a light-receiving surface (the back surface) of the semiconductor layer 100S by an electric field induced by the fixed electric charge film 112. This suppresses generation of a dark current caused by an interface state on the side of the light-receiving surface of the semiconductor layer 100S. The fixed electric charge film 112 is formed using, for example, an insulating film having a negative fixed electric charge. Examples of a material of the insulating film having a negative fixed electric charge include hafnium oxide, zirconium oxide, aluminum oxide, titanium oxide, and tantalum oxide.

The light-shielding film 117A is provided between the fixed electric charge film 112 and the insulating film 111. The light-shielding film 117A may be provided continuously to the light-shielding film 117A included in the pixel separation section 117. The light-shielding film 117A between the fixed electric charge film 112 and the insulating film 111 is selectively provided at a position opposed to the pixel separation section 117 inside the semiconductor layer 100S, for example. The insulating film 111 is provided to cover the light-shielding film 117A. The insulating film 111 includes, for example, silicon oxide.

The wiring layer 100T provided between the semiconductor layer 100S and the second substrate 200 includes an interlayer insulating film 119, pad sections 120 and 121, a passivation film 122, an interlayer insulating film 123, and a bonding film 124 in this order from side of the semiconductor layer 100S. The horizontal portion TGb of the transfer gate TG is provided in the wiring layer 100T, for example. The interlayer insulating film 119 is provided throughout the front surface of the semiconductor layer 100S, and is in contact with the semiconductor layer 100S. The interlayer insulating film 119 includes, for example, a silicon oxide film. It is to be noted that the configuration of the wiring layer 100T is not limited to the configuration described above, and it is sufficient if the wiring layer 100T has a configuration including a wiring line and an insulating film. Herein, the pad section 120 corresponds to a specific example of a "shared coupling section" of the present disclosure.

FIG. 7B illustrates configurations of the pad sections 120 and 121 together with the planar configuration illustrated in FIG. 7A. The pad sections 120 and 121 are provided in a selective region on the interlayer insulating film 119. The pad section 120 couples the floating diffusions FD (the floating diffusions FD1, FD2, FD3, and FD4) of the pixels 541A, 541B, 541C, and 541D to each other. The pad section 120 is disposed, for example, for each pixel sharing unit 539 in the middle portion of the pixel sharing unit 539 in plan view (FIG. 7B). The pad section 120 is provided to straddle the pixel separation section 117, and is disposed to be superimposed on at least a portion of each of the floating diffusions FD1, FD2, FD3, and FD4 (FIGS. 6 and 7B). Specifically, the pad section 120 is formed in a region overlapping, in the direction perpendicular to the front surface of the semiconductor layer 100S, at least a portion of each of the plurality of floating diffusions FD (the floating diffusions FD1, FD2, FD3, and FD4) that shares the pixel circuit 210 and at least a portion of the pixel separation section 117 formed between the plurality of photodiodes PD (the photodiodes PD1, PD2, PD3, and PD4) that shares the pixel circuit 210. The interlayer insulating film 119 includes a coupling via 120C for electrically coupling the pad section 120 and each of the floating diffusions FD1, FD2, FD3, and FD4 to each other. The coupling via 120C is provided for each of the pixels 541A, 541B, 541C, and 541D. For example, a portion of the pad section 120 is embedded in the coupling via 120C to electrically couple the pad section 120 and each of the floating diffusions FD1, FD2, FD3, and FD4 to each other.

The pad section 121 couples a plurality of VSS contact regions 118 to each other. For example, the VSS contact regions 118 provided in the pixels 541C and 541D of one of the pixel sharing units 539 adjacent to each other in the V direction, and the VSS contact regions provided in the pixels 541A and 541B of the other of the pixel sharing units 539 are electrically coupled to each other by the pad section 121. The pad section 121 is provided to straddle the pixel separation section 117, for example, and is disposed to be superimposed on at least a portion of each of the four VSS contact regions 118. Specifically, the pad section 121 is formed in a region overlapping, in the direction perpendicular to the front surface of the semiconductor layer 100S, at least a portion of each of the plurality of VS S contact regions 118 and at least a portion of the pixel separation section 117 formed between the plurality of VSS contact regions 118. The interlayer insulating film 119 includes a coupling via 121C for electrically coupling the pad section 121 and each of the VSS contact regions 118 to each other. The coupling via 121C is provided for each of the pixels 541A, 541B, 541C, and 541D. For example, a portion of the pad section 121 is embedded in the coupling via 121C to electrically couple the pad section 121 and each of the VSS contact regions 118 to each other. For example, the pad section 120 and the pad section 121 of each of a plurality of pixel sharing units 539 arranged side by side in the V direction are disposed at substantially the same position in the H direction (FIG. 7B).

Providing the pad section 120 makes it possible to reduce wiring lines for coupling from the floating diffusions FD to the pixel circuit 210 (e.g., a gate electrode of the amplification transistor AMP) in an entire chip. Likewise, providing the pad section 121 makes it possible to reduce wiring lines that supply a potential to each of the VSS contact regions 118 in the entire chip. This makes it possible to achieve a decrease in area of the entire chip, suppression of electrical interference between wiring lines in miniaturized pixels, cost reduction by reduction in the number of components, and/or the like.

It is possible to provide the pad sections 120 and 121 at desired positions of the first substrate 100 and the second substrate 200. Specifically, it is possible to provide the pad sections 120 and 121 in one of the wiring layer 100T and an insulating region 212 of the semiconductor layer 200S. In a case where the pad sections 120 and 121 are provided in the wiring layer 100T, the pad sections 120 and 121 may be in direct contact with the semiconductor layer 100S. Specifically, the pad sections 120 and 121 may be configured to be directly coupled to at least a portion of each of the floating diffusions FD and/or the VSS contact regions 118. In addition, a configuration may be adopted in which the coupling vias 120C and 121C are provided from each of the floating diffusions FD and/or the VSS contact regions 118 coupled to the pad sections 120 and 121, and the pad sections 120 and 121 are provided at desired positions of the wiring layer 100T and the insulating region 2112 of the semiconductor layer 200S.

In particular, in a case where the pad sections 120 and 121 are provided in the wiring layer 100T, it is possible to reduce wiring lines coupled to the floating diffusions FD and/or the VSS contact regions 118 in the insulating region 212 of the semiconductor layer 200S. This makes it possible to reduce the area of the insulating region 212, for forming through wiring lines for coupling the floating diffusions FD to the pixel circuit 210, of the second substrate 200 where the pixel circuits 210 are formed. Accordingly, it is possible to secure a large area of the second substrate 200 where the pixel circuits 210 are formed. Securing the area of the pixel circuit 210 makes it possible to form a large pixel transistor and contribute to an improvement in image quality resulting from noise reduction and the like.

In particular, in a case where the pixel separation section 117 uses an FTI structure, the floating diffusions FD and/or the VSS contact regions 118 are preferably provided in the respective pixels 541; therefore, using the configurations of the pad sections 120 and 121 makes it possible to significantly reduce wiring lines that couples the first substrate 100 and the second substrate 200 to each other.

In addition, as illustrated in FIG. 7B, for example, the pad sections 120 to which a plurality of floating diffusions FD is coupled and the pad sections 121 to which a plurality of VSS contact regions 118 is coupled are alternately linearly arranged in the V direction. In addition, the pad sections 120 and 121 are formed at positions surrounded by a plurality of photodiodes PD, a plurality of transfer gates TG, and a plurality of floating diffusions FD. This makes it possible to freely dispose an element other than the floating diffusions FD and the VS S contact regions 118 in the first substrate 100 where a plurality of elements are formed, and enhance efficiency of a layout of the entire chip. In addition, symmetry in a layout of elements formed in each of the pixel sharing units 539 is secured, which makes it possible to suppress variations in characteristics of the pixels 541.

The pad sections 120 and 121 include, for example, polysilicon (Poly Si), more specifically, a doped polysilicon doped with an impurity. The pad sections 120 and 121 preferably include an electrically conductive material having high heat resistance such as polysilicon, tungsten (W), titanium (Ti), and titanium nitride (TiN). This makes it possible to form the pixel circuit 210 after bonding the semiconductor layer 200S of the second substrate 200 to the first substrate 100. A reason for this is described below. It is to be noted that in the following description, a method of forming the pixel circuit 210 after bonding the first substrate 100 and the semiconductor layer 200S of the second substrate 200 together is referred to as a first manufacturing method.

Herein, it is conceivable to form the pixel circuit 210 in the second substrate 200 and thereafter bond the pixel circuit 210 to the first substrate 100 (hereinafter referred to as a second manufacturing method). In the second manufacturing method, electrodes for electrical coupling are formed in advance on both the front surface of the first substrate 100 (the front surface of the wiring layer 100T) and the front surface of the second substrate 200 (the front surface of the wiring layer 200T). In a case where the first substrate 100 and the second substrate 200 are bonded together, the electrodes for electrical coupling formed on the front surface of the first substrate 100 and the front surface of the second substrate 200 are brought into contact with each other at the same time. Thus, electrical coupling is formed between wiring lines included in the first substrate 100 and wiring lines included in the second substrate 200. Accordingly, configuring the imaging device 1 with use of the second manufacturing method makes it possible to perform manufacturing with use of appropriate processes corresponding to the configurations of the first substrate 100 and the second substrate 200 and manufacture an imaging device having high quality and high performance.

In such a second manufacturing method, upon bonding the first substrate 100 and the second substrate 200 together, an error in alignment may be caused by a manufacturing apparatus for bonding. In addition, the first substrate 100 and the second substrate 200 each have, for example, a diameter of about several tens cm, and upon bonding the first substrate 100 and the second substrate 200 together, expansion and contraction of substrates may occur in a microscopic region of each part of the first substrate 100 and the second substrate 200. The expansion and contraction of the substrates result from slight deviation of a timing at which the substrates come into contact with each other. An error may occur at the positions of the electrodes for electrical coupling formed on the front surface of the first substrate 10 and the front surface of the second substrate 200 due to such expansion and contraction of the first substrate 100 and the second substrate 200. In the second manufacturing method, even if such an error occurs, it is preferable to cause the electrodes of the first substrate 100 and the second substrate 200 to come into contact with each other. Specifically, at least one, preferably both of electrodes of the first substrate 100 and the second substrate 200 are made large in consideration of the error described above. Accordingly, in a case where the second manufacturing method is used, for example, the size (the size in a substrate plane direction) of the electrode formed on the front surface of the first substrate 100 or the second substrate 200 becomes larger than the size of an internal electrode extending in the thickness direction from inside of the first substrate 100 or the second substrate 200 to the front surface.

Meanwhile, the pad sections 120 and 121 include an electrically conductive material having heat resistance, which makes it possible to use the first manufacturing method described above. In the first manufacturing method, after the first substrate 100 including the photodiodes PD, the transfer transistors TR, and the like is formed, the first substrate 100 and the second substrate 200 (the semiconductor layer 200S) are bonded together. On this occasion, the second substrate 200 is in a state in which a pattern such as an active element and a wiring layer included in the pixel circuit 210 is not yet formed. The second substrate 200 is in a state before forming the pattern; therefore, even if an error in a bonding position occurs upon bonding the first substrate 100 and the second substrate 200 together, an error in alignment between a pattern of the first substrate 100 and the pattern of the second substrate 200 is not caused by such a bonding error. A reason for this is that the pattern of the second substrate 200 is formed after bonding the first substrate 100 and the second substrate 200 together. It is to be noted that upon forming the pattern of the second substrate, for example, in an exposure apparatus for pattern formation, the pattern is formed to be aligned with the pattern formed on the first substrate. For the reason described above, in the first manufacturing method, an error in a bonding position between the first substrate 100 and the second substrate 200 is not an issue in manufacturing of the imaging device 1. For a similar reason, in the first manufacturing method, an error resulting from expansion and contraction of the substrate caused in the second manufacturing method is also not an issue in manufacturing of the imaging device 1.

In the first manufacturing method, after the first substrate 100 and the second substrate 200 (the semiconductor layer 200S) are bonded together in this manner, an active element is formed on the second substrate 200. Thereafter, the through electrodes 120E and 121E and the through electrodes TGV (FIG. 6) are formed. In formation of the through electrodes 120E, 121E, and TGV, for example, a pattern of through electrodes is formed from above the second substrate 200 with use of reduction-projection exposure by an exposure apparatus. The reduction-projection exposure is used; therefore, even if an error occurs in alignment between the second substrate 200 and the exposure apparatus, magnitude of the error in the second substrate 200 is only a fraction (the inverse number of reduction-projection exposure magnification) of the error in the second manufacturing method described above. Accordingly, alignment between elements formed in the first substrate 100 and the second substrate 200 is facilitated by configuring the imaging device 1 with use of the first manufacturing method, which makes it possible to manufacture an imaging device having high quality and high performance.

The imaging device 1 manufactured with use of such a first manufacturing method has characteristics different from those of an imaging device manufactured by the second manufacturing method. Specifically, in the imaging device 1 manufactured by the first manufacturing method, for example, the through electrodes 120E, 121E, and TGV each have a substantially constant thickness (size in the substrate plane direction) from the second substrate 200 to the first substrate 100. Alternatively, in a case where the through electrodes 120E, 121E, and TGV each have a tapered shape, they have a tapered shape having a constant slope. In the imaging device 1 including such through electrodes 120E, 121E, and TGV, the pixels 541 are easily miniaturized.

Herein, in a case where the imaging device 1 is manufactured by the first manufacturing method, the active element is formed on the second substrate 200 after bonding the first substrate 100 and the second substrate 200 (the semiconductor layer 200S) together; therefore, heating treatment necessary for formation of the active element also affects the first substrate 100. For this reason, as described above, the pad sections 120 and 121 provided in the first substrate 100 preferably use an electrically conductive material having high heat resistance. For example, the pad sections 120 and 121 preferably use a material having a higher melting point (that is, higher heat resistance) than the melting point of at least some of wiring materials included in the wiring layer 200T of the second substrate 200. For example, the pad sections 120 and 121 use an electrically conductive material having high heat resistance such as doped polysilicon, tungsten, titanium, and titanium nitride. This makes it possible to manufacture the imaging device 1 with use of the first manufacturing method described above.

The passivation film 122 is provided throughout the front surface of the semiconductor layer 100S to cover the pad sections 120 and 121, for example (FIG. 6). The passivation film 122 includes, for example, a silicon nitride (SiN) film. The interlayer insulating film 123 covers the pad sections 120 and 121 with the passivation film 122 interposed therebetween. The interlayer insulating film 123 is provided throughout the front surface of the semiconductor layer 100S, for example. The interlayer insulating film 123 includes, for example, a silicon oxide (SiO) film. The bonding film 124 is provided on a bonding surface between the first substrate 100 (specifically the wiring layer 100T) and the second substrate 200. That is, the bonding film 124 is in contact with the second substrate 200. The bonding film 124 is provided throughout the main surface of the first substrate 100. The bonding film 124 includes, for example, a silicon nitride film.

The light-receiving lens 401 is opposed to the semiconductor layer 100S with the fixed electric charge film 112 and the insulating film 111 interposed therebetween, for example (FIG. 6). The light-receiving lens 401 is provided at a position opposed to the photodiode PD of each of the pixels 541A, 541B, 541C, and 541D, for example.

The second substrate 200 includes the semiconductor layer 200S and the wiring layer 200T in this order from side of the first substrate 100. The semiconductor layer 200S includes a silicon substrate. In the semiconductor layer 200S, a well region 211 is provided in the thickness direction. The well region 211 is, for example, a p-type semiconductor region. The second substrate 20 includes the pixel circuit 210 disposed for each of the pixel sharing units 539. The pixel circuit 210 is provided on front surface side (side of the wiring layer 200T) of the semiconductor layer 200S, for example. In the imaging device 1, the second substrate 200 is bonded to the first substrate 100 to cause back surface side (side of the semiconductor layer 200S) of the second substrate 200 to be opposed to front surface side (side of the wiring layer 100T) of the first substrate 100. That is, the second substrate 200 is bonded face-to-back to the first substrate 100.

Figure 8:
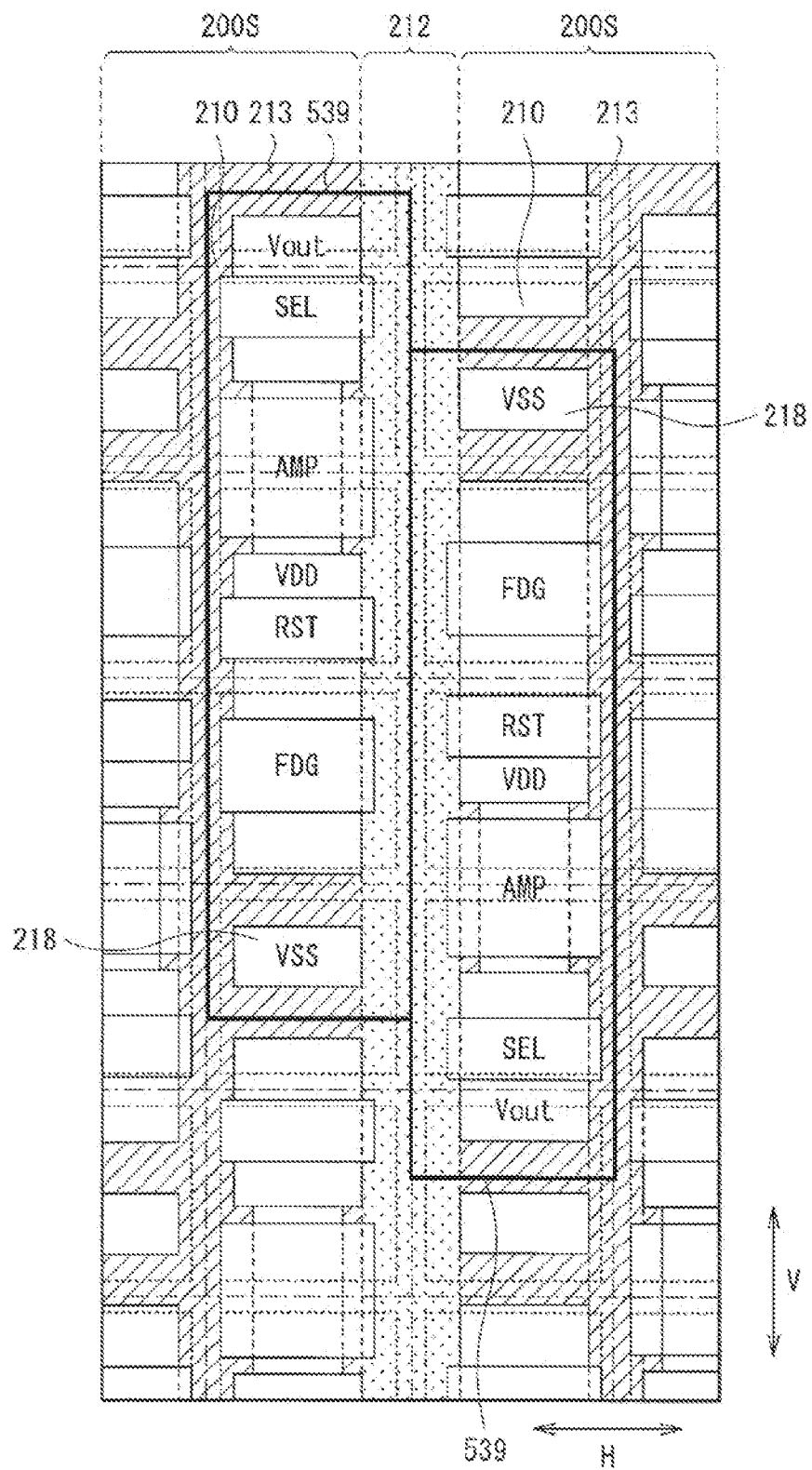
FIG. 8 is a schematic view of an example of a planar configuration of a second substrate (a semiconductor layer) illustrated in FIG. 6.
Figure 9:
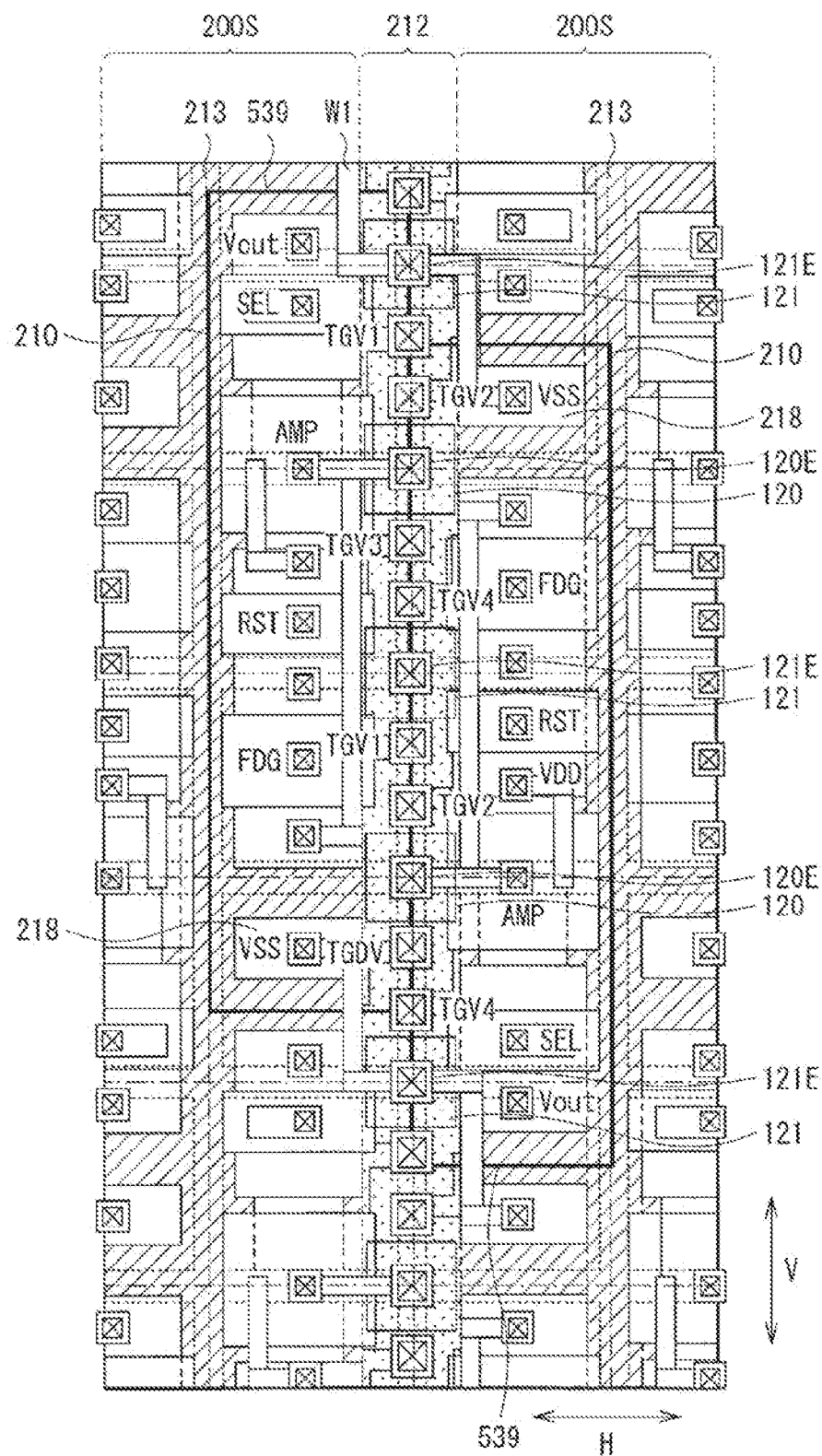
FIG. 9 is a schematic view of an example of a planar configuration of main parts of a pixel circuit and the first substrate together with a first wiring layer illustrated in FIG. 6.
Figure 10:
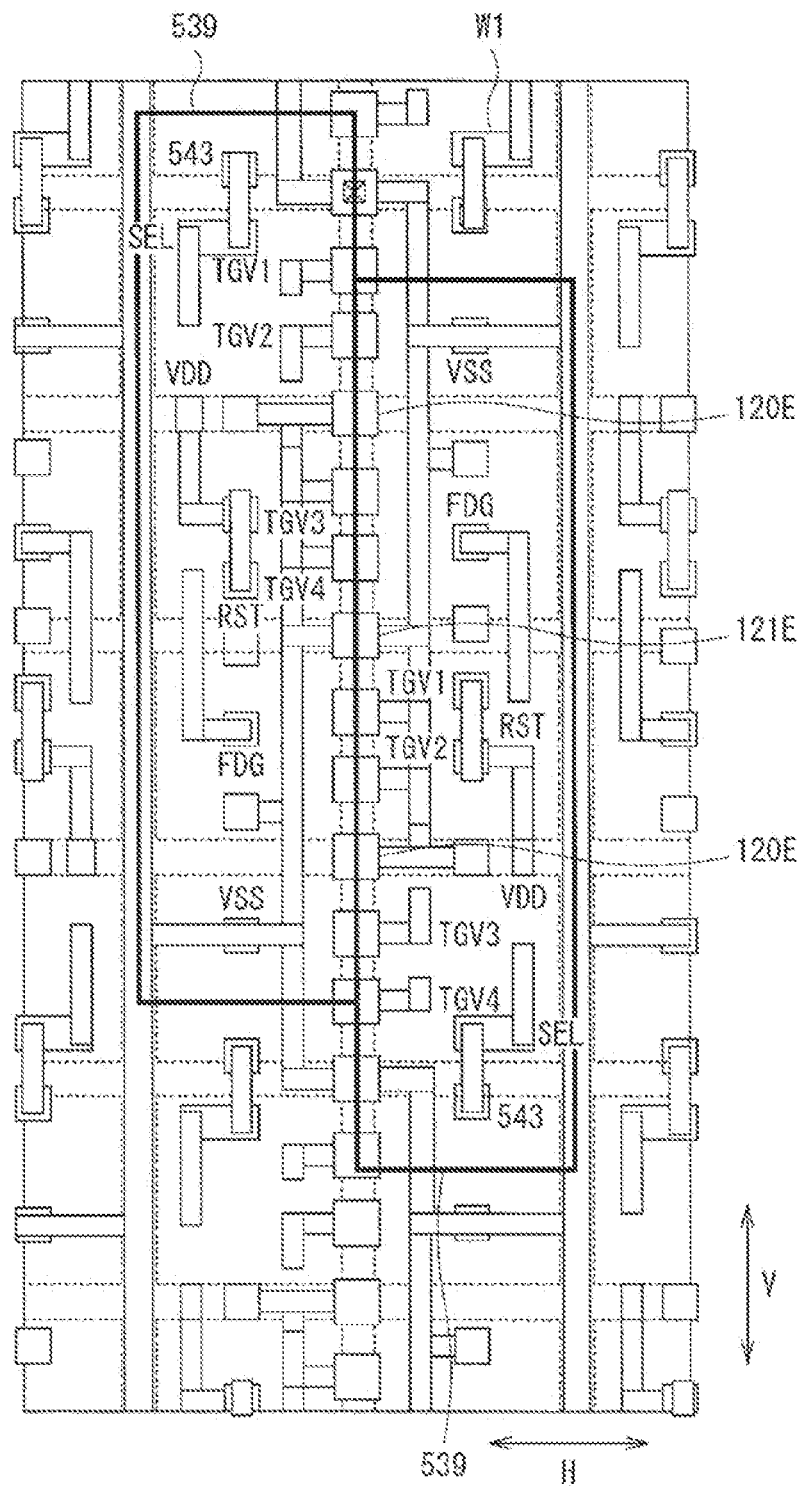
FIG. 10 is a schematic view of an example of a planar configuration of the first wiring layer and a second wiring layer illustrated in FIG. 6.
Figure 11:
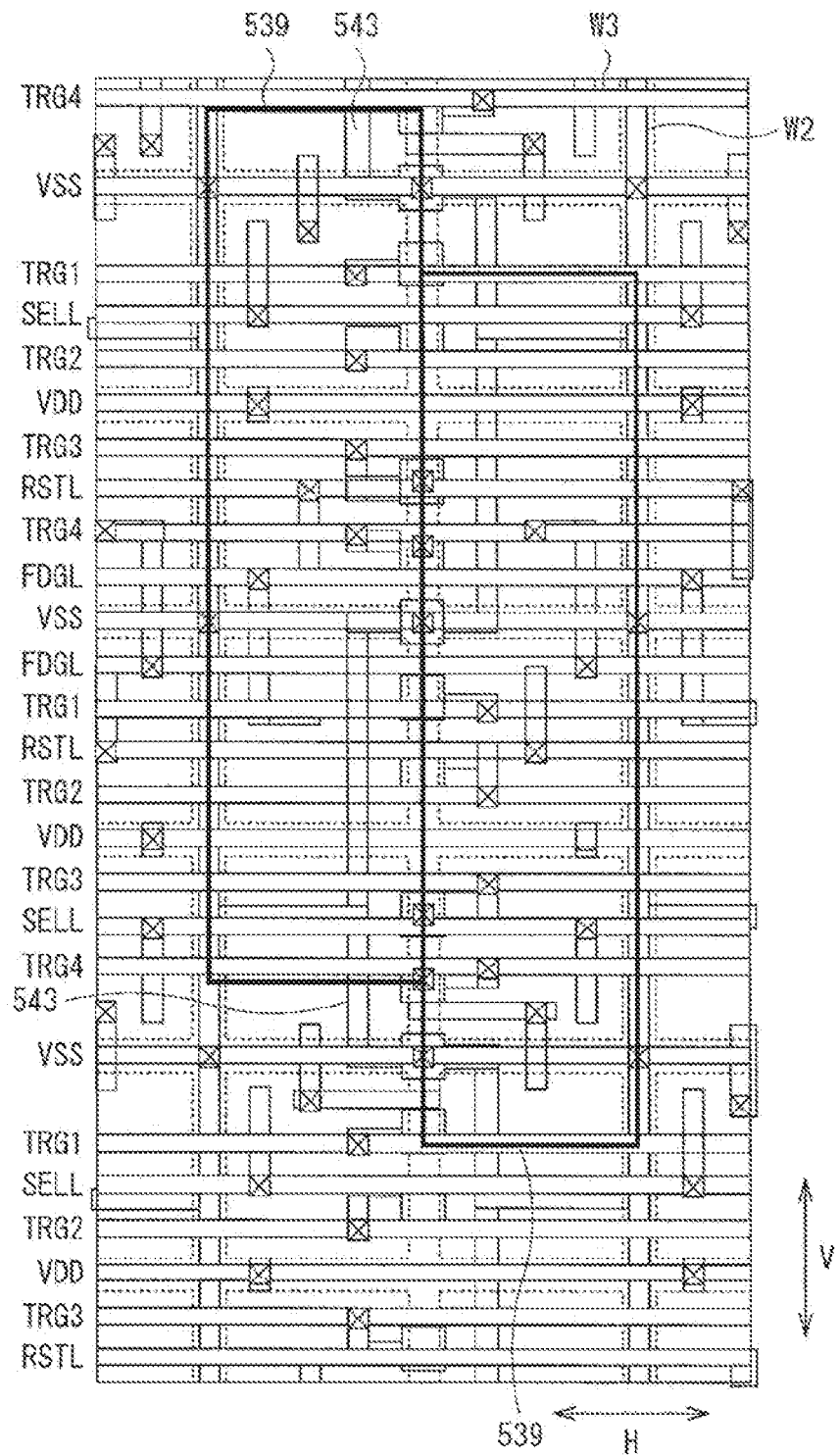
FIG. 11 is a schematic view of an example of a planar configuration of the second wiring layer and a third wiring layer illustrated in FIG. 6.
Figure 12:
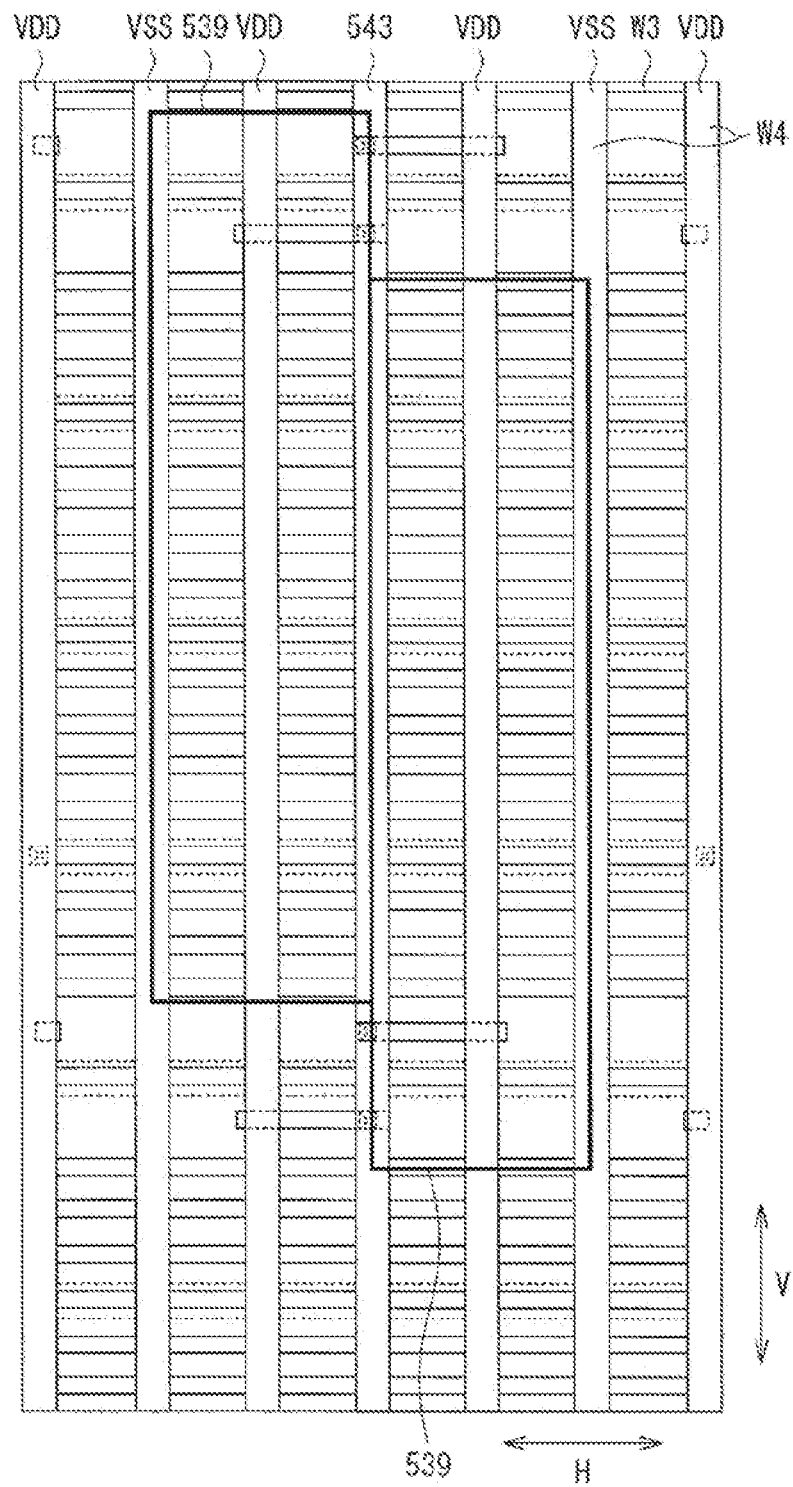
FIG. 12 is a schematic view of an example of a planar configuration of the third wiring layer and a fourth wiring layer illustrated in FIG. 6.

FIGS. 8 to 12 schematically illustrates an example of a planar configuration of the second substrate 200. FIG. 8 illustrates a configuration of the pixel circuit 210 provided in proximity to the front surface of the semiconductor layer 200S. FIG. 9 schematically illustrates a configuration of each part of the wiring layer 200T (specifically, a first wiring layer W1 to be described later), the semiconductor layer 200S coupled to the wiring layer 200T, and the first substrate 100. FIGS. 10 to 12 each illustrate an example of a planar configuration of the wiring layer 200T. The configuration of the second substrate 200 is described below with use of FIGS. 8 to 12 together with FIG. 6. In FIGS. 8 and 9, the contour of the photodiode PD (a boundary between the pixel separation section 117 and the photodiode PD) is indicated by a broken line, and a boundary between the semiconductor layer 200S in a portion overlapping the gate electrode of each of the transistors included in the pixel circuit 210 and the element separation region 213 or the insulating region 212 is indicated by a dotted line. In a portion overlapping the gate electrode of the amplification transistor AMP, a boundary between the semiconductor layer 200S and the element separation region 213 and a boundary between the element separation region 213 and the insulating region 212 are provided on one side in a channel width direction.

The second substrate 200 includes the insulating region 212 that divides the semiconductor layer 200S, and the element separation region 213 that is provided in a portion in the thickness direction of the semiconductor layer 200S (FIG. 6). For example, in the insulating region 212 provided between two pixel circuits 210 adjacent to each other in the H direction, the through electrodes 120E and 121E and the through electrodes TGV (through electrodes TGV1, TGV2, TGV3, and TGV4) of two pixel sharing units 539 coupled to the two pixel circuits 210 are disposed (FIG. 11). Herein, the through electrode 120E corresponds to a specific example of a "through electrode" of the present disclosure.

The insulating region 212 has substantially the same thickness as the thickness of the semiconductor layer 200S (FIG. 6). The semiconductor layer 200S is divided by the insulating region 212. The through electrodes 120E and 121E, and the through electrodes TGV are disposed in the insulating region 212. The insulating region 212 includes, for example, silicon oxide.

The through electrodes 120E and 121E are provided to penetrate through the insulating region 212 in the thickness direction. Upper ends of the through electrodes 120E and 121E are coupled to wiring lines (the first wiring layer W1, a second wiring layer W2, a third wiring layer W3, and a fourth wiring layer W4 that are to be described later) of the wiring layer 200T. The through electrodes 120E and 121E are provided to penetrate through the insulating region 212, the bonding film 124, the interlayer insulating film 123, and the passivation film 122, and lower ends thereof are coupled to the pad sections 120 and 121 (FIG. 6). The through electrode 120E electrically couples the pad section 120 and the pixel circuit 210 to each other. That is, the floating diffusion FD of the first substrate 100 is electrically coupled to the pixel circuit 210 of the second substrate 200 by the through electrode 120E. The through electrode 121E electrically couples the pad section 121 and the reference potential line VSS of the wiring layer 200T to each other. That is, the VSS contact region 118 of the first substrate 100 is electrically coupled to the reference potential line VSS of the second substrate 200 by the through electrode 121E.

The through electrode TGV is provided to penetrate through the insulating region 212 in the thickness direction. An upper end of the through electrode TGV is coupled to a wiring line of the wiring layer 200T. The through electrode TGV is provided to penetrate through the insulating region 212, the bonding film 124, the interlayer insulating film 123, the passivation film 122, and the interlayer insulating film 119, and a lower end thereof is coupled to the transfer gate TG (FIG. 6). Such a through electrode TGV electrically couples the transfer gate TG (a transfer gate TG1, TG2, TG3, or TG4) of each of the pixels 541A, 541B, 541C, and 541D and a wiring line (a portion of the row drive signal lines 542, specifically a wiring line TRG1, TRG2, TRG3, or TRG4 in FIG. 11 to be described later) of the wiring layer 200T to each other. That is, the transfer gate TG of the first substrate 100 is electrically coupled to a wiring line TRG of the second substrate 200 by the through electrode TGV to transmit a drive signal to each of the transfer transistors TR (the transfer transistors TR1, TR2, TR3, and TR4).

The insulating region 212 is a region for insulating, from the semiconductor layer 200S, the through electrodes 120E and 121E and the through electrodes TGV for electrically coupling the first substrate 100 and the second substrate 200 to each other. For example, in the insulating region 212 provided between two pixel circuits 210 (the pixel sharing units 539) adjacent to each other in the H direction, the through electrodes 120E and 121E, and the through electrodes TGV (the through electrodes TGV1, TGV2, TGV3, and TGV4) that are coupled to the two pixel circuits 210 are disposed. The insulating region 212 is provided to extend in the V direction, for example (FIGS. 8 and 9). Herein, arrangement of the horizontal portions TGb of the transfer gates TG is devised, thereby disposing the positions in the H direction of the through electrodes TGV closer to the positions in the H direction of the through electrodes 120E and 121E, as compared with the positions of the vertical portions TGa (FIGS. 7A and 9). For example, the through electrodes TGV are disposed at substantially the same positions in the H direction as the through electrodes 120E and 120E. This makes it possible to collectively provide the through electrodes 120E and 121E and the through electrodes TGV in the insulating region 212 that extends in the V direction. As another arrangement example, it is conceivable that the horizontal portion TGb is provided only in a region superimposed on the vertical portion TGa. In this case, the through electrode TGV is formed substantially directly above the vertical portion TGa, and the through electrode TGV is disposed in a substantially middle portion in the H direction and the Y direction of each of the pixels 541, for example. On this occasion, the position in the H direction of the through electrode TGV is significantly deviated from the positions in the H direction of the through electrodes 120E and 121E. For example, the insulating region 212 is provided around, for example, the through electrodes TGV and the through electrodes 120E and 121E to electrically insulate them from the semiconductor layer 200S in proximity thereto. In a case where the position in the H direction of the through electrode TGV and the positions in the H direction of the through electrodes 120E and 121E are significantly separated from each other, it is necessary to independently provide the insulating region 212 around each of the through electrodes 120E, 121E, and TGV. Accordingly, the semiconductor layer 200S is finely divided. In comparison with this, a layout in which the through electrodes 120E and 121E and the through electrodes TGV are collectively disposed in the insulating region 212 that extends in the V direction allows for an increase in size in the H direction of the semiconductor layer 200S. This makes it possible to secure a large area of a semiconductor element formation region in the semiconductor layer 200S. Accordingly, it is possible to increase a size of the amplification transistor AMP and improve, for example, transconductance gm. This makes it possible to reduce RTS (Random Telegraph Signal) noise.

As described with reference to FIG. 4, the pixel sharing unit 539 has a structure in which the floating diffusions FD provided in a plurality of pixels 541 are electrically coupled to each other, and the plurality of pixels 541 share one pixel circuit 210. Then, electrical coupling between the floating diffusions FD is made by the pad section 120 provided in the first substrate 100 (FIGS. 6 and 7B). An electrical coupling section (the pad section 120) provided in the first substrate 100 and the pixel circuit 210 provided in the second substrate 200 are electrically coupled to each other through one through electrode 120E. As another structure example, it is conceivable that an electrical coupling section between the floating diffusions FD is provided in the second substrate 200. In this case, in the pixel sharing unit 539, four through electrodes coupled to respective floating diffusions FD1, FD2, FD3, and FD4 are provided. Accordingly, in the second substrate 200, the number of through electrodes that penetrate through the semiconductor layer 200S is increased, and the insulating region 212 that insulates the peripheries of these through electrodes becomes large. As compared with this, a structure in which the pad section 120 is provided in the first substrate 100 (FIGS. 6 and 7B) makes it possible to reduce the number of through electrodes and make the insulating region 212 small. Accordingly, it is possible to secure a large area of the semiconductor element formation region in the semiconductor layer 200S. This makes it possible to increase the size of the amplification transistor AMP and suppress noise, for example.

The element separation region 213 is provided on the front surface side of the semiconductor layer 200S. The element separation region 213 has an STI (Shallow Trench Isolation) structure. In the element separation region 213, the semiconductor layer 200S is engraved in the thickness direction (a direction perpendicular to the main surface of the second substrate 200), and an insulating film is embedded in an engraved portion. The insulating film includes, for example, silicon oxide. The element separation region 213 achieves element separation between a plurality of transistors included in the pixel circuit 210 in accordance with a layout of the pixel circuit 210. The semiconductor layer 200S (specifically, the well region 211) extends below the element separation region 213 (a deep portion of the semiconductor layer 200S).

Hereinafter, description is given of a difference between a contour shape (a contour shape in the substrate plane direction) of the pixel sharing unit 539 in the first substate 100 and a contour shape of the pixel sharing unit 539 in the second substrate 200 with reference to FIGS. 7A, 7B, and 8.

In the imaging device 1, the pixel sharing units 539 are provided over both the first substrate 100 and the second substrate 200. For example, the contour shape of the pixel sharing unit 539 provided in the first substrate 100 and the contour shape of the pixel sharing unit 539 provided in the second substrate 200 are different from each other.

In FIGS. 7A and 7B, a contour line of each of the pixels 541A, 541B, 541C, and 541D is indicated by an alternate long and short dashed line, and a contour line of the pixel sharing unit 539 is indicated by a heavy line. For example, the pixel sharing unit 539 of the first substrate 100 includes two pixels 541 (the pixels 541A and 541B) disposed adjacent to each other in the H direction and two pixels 541 (the pixels 541C and 541D) disposed adjacent thereto in the V direction. That is, the pixel sharing unit 539 of the first substrate 100 includes four adjacent pixels 541 in two rows by two columns, and the pixel sharing unit 539 of the first substrate 100 has a substantially square contour shape. In the pixel array section 540, such pixel sharing units 539 are arranged adjacent to each other with two-pixel pitches (pitches corresponding to two pixels 541) in the H direction and two-pixel pitches (pitches corresponding to two pixels 541) in the V direction.

In FIGS. 8 and 9, the contour line of each of the pixels 541A, 541B, 541C, and 541D is indicated by an alternate long and short dashed line, and the contour line of the pixel sharing unit 539 is indicated by a heavy line. For example, the contour shape of the pixel sharing unit 539 of the second substrate 200 is smaller in the H direction than that of the pixel sharing unit 539 of the first substrate 100, and is larger in the V direction than that of the pixel sharing unit 539 of the first substrate 100. For example, the pixel sharing unit 539 of the second substrate 200 is formed to have a size (a region) corresponding to one pixel in the H direction, and is formed to have a size corresponding to four pixels in the V direction. That is, the pixel sharing unit 539 of the second substrate 200 is formed to have a size corresponding to adjacent pixels arranged in one row by four columns, and the pixel sharing unit 539 of the second substrate 200 has a substantially rectangular contour shape.

For example, in each of the pixel circuits 210, the selection transistor SEL, the amplification transistor AMP, the reset transistor RST, and the FD conversion gain switching transistor FDG are disposed in this order side by side in the V direction (FIG. 8). The contour shape of each of the pixel circuits 210 is provided as a substantially rectangular shape as described above, which makes it possible to dispose four transistors (the selection transistor SEL, the amplification transistor AMP, the reset transistor RST, and the FD conversion gain switching transistor FDG) side by side in one direction (the V direction in FIG. 8). This makes it possible to share the drain of the amplification transistor AMP and the drain of the reset transistor RST in one diffusion region (a diffusion region coupled to the power source line VDD). For example, it is possible to provide the formation region of each of the pixel circuits 210 in a substantially square shape (see FIG. 21 to be described later). In this case, two transistors are disposed in one direction, which makes it difficult to share the drain of the amplification transistor AMP and the drain of the reset transistor RST in one diffusion region. Accordingly, providing the formation region of the pixel circuit 210 in a substantially rectangular shape makes it easy to dispose four transistors close to each other, and makes it possible to make the formation region of the pixel circuit 210 small. That is, it is possible to miniaturize the pixels. In addition, in a case where it is not necessary to make the formation region of the pixel circuit 210 small, it is possible to make the formation region of the amplification transistor AMP large and reduce noise.

For example, in addition to the selection transistor SEL, the amplification transistor AMP, the reset transistor RST, and the FD conversion gain switching transistor FDG, the VSS contact region 218 coupled to the reference potential line VSS is provided in proximity to the front surface of the semiconductor layer 200S. The VSS contact region 218 includes, for example, a p-type semiconductor region. The VSS contact region 218 is electrically coupled to the VSS contact region 118 of the first substrate 100 (the semiconductor layer 100S) through a wiring line of the wiring layer 200T and the through electrode 121E. This VSS contact region 218 is provided at a position adjacent to the source of the FD conversion gain switching transistor FDG with the element separation region 213 interposed therebetween, for example (FIG. 8).

Next, description is given of a positional relationship between the pixel sharing unit 539 provided in the first substrate 100 and the pixel sharing unit 539 provided in the second substrate 200 with reference to FIGS. 7B and 8. For example, of two pixel sharing units 539 arranged side by side in the V direction of the first substrate 100, one (e.g., on upper side of a paper surface in FIG. 7B) pixel sharing unit 539 is coupled to one (e.g., on left side of a paper surface in FIG. 8) pixel sharing unit 539 of two pixel sharing units 539 arranged side by side in the H direction of the second substrate 200. For example, of the two pixel sharing units 539 arranged side by side in the V direction of the first substrate 100, the other (e.g., on lower side of the paper surface in FIG. 7B) pixel sharing unit 539 is coupled to the other (e.g., on right side of the paper surface in FIG. 8) pixel sharing unit 539 of the two pixel sharing units 539 arranged side by side in the H direction of the second substrate 200.

For example, in the two pixel sharing units 539 arranged side by side in the H direction of the second substrate 200, an internal layout (arrangement of transistors and the like) of one pixel sharing unit 539 is substantially equal to a layout obtained by inverting an internal layout of the other pixel sharing unit 539 in the V direction and the H direction. Effects achieved by this layout are described below.

In the two pixel sharing units 539 arranged side by side in the V direction of the first substrate 100, each of the pad sections 120 is disposed in a middle portion of the contour shape of the pixel sharing unit 539, that is, a middle portion in the V direction and the H direction of the pixel sharing unit 539 (FIG. 7B). Meanwhile, the pixel sharing unit 539 of the second substrate 200 has a substantially rectangular contour shape that is long in the V direction as described above; therefore, for example, the amplification transistor AMP coupled to the pad section 120 is disposed at a position deviated from the middle in V direction of the pixel sharing unit 539 to upper side of the paper surface. For example, in a case where internal layouts of the two pixel sharing units 539 arranged side by side in the H direction of the second substrate 200 are the same, a distance between the amplification transistor AMP of one pixel sharing unit 539 and the pad section 120 (e.g., the pad section 120 of the pixel sharing unit 539 on upper side of the paper surface in FIG. 7) is relatively short. However, a distance between the amplification transistor AMP of the other pixel sharing unit 539 and the pad section 120 (e.g., the pad section 120 of the pixel sharing unit 539 on lower side of the paper surface in FIG. 7) is long. Accordingly, an area of a wiring line necessary for coupling between the amplification transistor AMP and the pad section 120 is increased, which may complicate a wiring layout of the pixel sharing unit 539. This may affect miniaturization of the imaging device 1.

In contrast, internal layouts of the two pixel sharing units 539 arranged side by side in the H direction of the second substrate 200 are inverted to each other in at least the V direction, which makes it possible to shorten distances between the amplification transistors AMP of both the two pixel sharing units 539 and the pad sections 120. Accordingly, as compared with a configuration in which the internal layouts of two pixel sharing units 539 arranged side by side in the H direction of the second substrate 200 are the same, the imaging device 1 is easily miniaturized. It is to be noted that a planar layout of each of the plurality of pixel sharing units 539 of the second substrate 200 is bilaterally symmetrical in a range illustrated in FIG. 8; however, a layout including a layout of the first wiring layer W1 illustrated in FIG. 9 to be described later is bilaterally asymmetrical.

In addition, it is preferable that the internal layouts of the two pixel sharing units 539 arranged side by side in the H direction of the second substrate 200 be inverted to each other also in the H direction. A reason for this is described below. As illustrated in FIG. 9, the two pixel sharing units 539 arranged side by side in the H direction of the second substrate 200 are each coupled to the pad sections 120 and 121 of the first substrate 100. For example, the pad sections 120 and 121 are disposed in a middle portion in the H direction of the two pixel sharing units 539 arranged side by side in the H direction of the second substrate 200 (between the two pixel sharing units 539 arranged side by side in the H direction). Accordingly, the internal layouts of the two pixel sharing units 539 arranged side by side in the H direction of the second substrate 200 are inverted to each other also in the H direction, which makes it possible to decrease distances between each of the plurality of pixel sharing units 539 of the second substrate 200 and the pad sections 120 and 121. That is, the imaging device 1 is miniaturized more easily.

In addition, the position of the contour line of the pixel sharing unit 539 of the second substrate 200 may not be aligned with the position of the contour line of one of the pixel sharing units 539 of the first substrate 100. For example, in the two pixel sharing units 539 arranged side by side in the H direction of the second substrate 200, one (e.g., on upper side of a paper surface in FIG. 9) contour line in the V direction of one (e.g., on left side of the paper surface in FIG. 9) pixel sharing unit 539 is disposed outside one contour line in the V direction of a corresponding pixel sharing unit 539 (e.g., on upper side of the paper surface in FIG. 7B) of the first substrate 100. In addition, in the two pixel sharing units 539 arranged side by side in the H direction of the second substrate 200, the other (e.g., on lower side of the paper surface in FIG. 9) contour line in the V direction of the other (e.g., on right side of the paper surface in FIG. 9) pixel sharing unit 539 is disposed outside the other contour line in the V direction of a corresponding pixel sharing unit 539 (e.g., on lower side of the paper surface in FIG. 7B) of the first substrate 100. Disposing the pixel sharing units 539 of the second substrate 200 and the pixel sharing units 539 of the first substrate 100 relative to each other makes it possible to shorten a distance between the amplification transistor AMP and the pad section 120. This makes it easy to miniaturize the imaging device 1.

In addition, the positions of contour lines of the plurality of pixel sharing units 539 of the second substrate 200 may not be aligned. For example, the two pixel sharing units 539 arranged side by side in the H direction of the second substrate 200 are disposed in a state in which the positions of the contour lines in the V direction are deviated. This makes it possible to shorten the distance between the amplification transistor AMP and the pad section 120. This makes it easy to miniaturize the imaging device 1.

Description is given of repeated arrangement of the pixel sharing units 539 in the pixel array section 540 with reference to FIGS. 7B and 9. The pixel sharing unit 539 of the first substrate 100 has a size corresponding to two pixels 541 in the H direction and a size corresponding to two pixels 541 in the V direction (FIG. 7B). For example, in the pixel array section 540 of the first substrate 100, the pixel sharing units 539 having a size corresponding to the four pixels are repeatedly arranged adjacent to each other with two-pixel pitches (pitches corresponding to two pixels 541) in the H direction and two-pixel pitches (pitches corresponding to two pixels 541) in the V direction. Alternatively, in the pixel array section 540 of the first substrate 100, a pair of pixel sharing units 539 that are two pixel sharing units 539 disposed adjacent to each other in the V direction may be provided. In the pixel array section 540 of the first substrate 100, for example, the pairs of pixel sharing units 539 are repeatedly arranged adjacent to each other with two-pixel pitches (pitches corresponding to two pixels 541) in the H direction and four-pixel pitches (pitches corresponding to four pixels 541) in the V direction. The pixel sharing unit 539 of the second substrate 200 has a size corresponding to one pixel 541 in the H direction and a size corresponding to four pixels 541 in the V direction (FIG. 9). For example, in the pixel array section 540 of the second substrate 200, a pair of pixel sharing units 539 including two pixel sharing units 539 having a size corresponding to the four pixels 541 are provided. The pixel sharing units 539 are disposed adjacent to each other in the H direction and are disposed to be deviated in the V direction. In the pixel array section 540 of the second substrate 200, for example, the pairs of pixel sharing units 539 are repeatedly arranged adjacent to each other without space with two-pixel pitches (pitches corresponding to two pixels 541) in the H direction and four-pixel pitches (pitches corresponding to four pixels 541) in the V direction. Such repeated arrangement of the pixel sharing units 539 makes it possible to arrange the pixel sharing units 539 without space. This makes it easy to miniaturize the imaging device 1.

The amplification transistor AMP preferably has, for example, a three-dimensional structure such as a fin (Fin) type (FIG. 6). For example, the Fin type amplification transistor AMP includes a fin (a fin 230 in FIG. 13 to be described later) including a portion of the semiconductor layer 200S, a gate electrode (a gate electrode 231 in FIG. 13 to be described later) having a plurality of flat surfaces opposed to the fin, and a gate insulating film provided between the gate electrode and the fin. A transistor having a three-dimensional structure is a transistor in which a plurality of flat surfaces of the gate electrode opposed to a channel is provided or a transistor in which a curved surface of the gate electrode is provided around a channel. In a case where such a transistor having the three-dimensional structure has the same footprint (occupied area in FIG. 8) as that of a planar type transistor, it is possible to increase an effective gate width in the transistor, as compared with the planar type transistor. Accordingly, a large amount of current passes through the transistor having the three-dimensional structure to increase transconductance gm. This makes it possible to improve operation speed in the transistor having the three-dimensional structure, as compared with the planar type transistor. In addition, it is possible to reduce RN (Random Noise). In addition, the transistor having the three-dimensional structure has a larger gate area, as compared with the planar type transistor, which reduces RTS noise. Herein, the amplification transistor AMP corresponds to a specific example of a "pixel transistor" of the present disclosure. A more specific structure of the amplification transistor AMP is described later.

Using such a transistor having the three-dimensional structure for at least one of the amplification transistor AMP, the selection transistor SEL, the reset transistor RST, and the FD conversion gain switching transistor FDG makes it possible to improve transistor characteristics, e.g., to improve image quality. In particular, the amplification transistor AMP includes the transistor having three-dimensional structure, which makes it possible to effectively reduce noise and improve image quality. In addition, all of the amplification transistor AMP, the selection transistor SEL, the reset transistor RST, and the FD conversion gain switching transistor FDG may be configured with use of the transistor having the three-dimensional structure. On this occasion, the pixel circuit 210 is easily manufactured.

The wiring layer 200T includes, for example, the passivation film 221, the interlayer insulating film 222, and a plurality of wiring lines (the first wiring layer W1, the second wiring layer W2, the third wiring layer W3, and the fourth wiring layer W4). The passivation film 221 is, for example, in contact with the front surface of the semiconductor layer 200S, and covers the entire front surface of the semiconductor layer 200S. The passivation film 221 covers the respective gate electrodes of the selection transistor SEL, the amplification transistor AMP, the reset transistor RST, and the FD conversion gain switching transistor FDG. The interlayer insulating film 222 is provided between the passivation film 221 and the third substrate 300. The plurality of wiring lines (the first wiring layer W1, the second wiring layer W2, the third wiring layer W3, and the fourth wiring layer W4) are separated by the interlayer insulating film 222. The interlayer insulating film 222 includes, for example, silicon oxide.

In the wiring layer 200T, for example, the first wiring layer W1, the second wiring layer W2, the third wiring layer W3, the fourth wiring layer W4, and the contact sections 201 and 202 are provided in this order from side of the semiconductor layer 200S, and are insulated from each other by the interlayer insulating film 222. The interlayer insulating film 222 includes a plurality of coupling sections that couples the first wiring layer W1, the second wiring layer W2, the third wiring layer W3, or the fourth wiring layer W4 and a layer therebelow to each other. The coupling sections are portions in which an electrically conductive material is embedded in a coupling hole provided in the interlayer insulating film 222. For example, the interlayer insulating film 222 includes a coupling section 218V that couples the first wiring layer W1 and the VSS contact region 218 of the semiconductor layer 200S to each other. For example, a hole diameter of such a coupling section that couples elements of the second substrate 200 to each other is different from hole diameters of the through electrodes 120E and 121E and the through electrode TGV. Specifically, a hole diameter of the coupling hole that couples the elements of the second substrate 200 to each other is preferably smaller than the hole diameters of the through electrodes 120E and 121E and the through electrode TGV. A reason for this is described below. A depth of a coupling section (such as the coupling section 218V) provided in the wiring layer 200T is smaller than depths of the through electrodes 120E and 121E and the through electrode TGV. Accordingly, in the coupling section, it is possible to easily embed an electrically conductive material in the coupling hole, as compared with the through electrodes 120E and 121E and the through electrode TGV. Making the hole diameter of the coupling section smaller than the hole diameters of the through electrodes 120E and 121E and the through electrode TGV makes it easy to miniaturize the imaging device 1.

For example, the through electrode 120E is coupled to the gate of the amplification transistor AMP and the source of the FD conversion gain switching transistor FDG (specifically, a coupling hole reaching the source of the FD conversion gain switching transistor FDG) by the first wiring layer W1. The first wiring layer W1 couples, for example, the through electrode 121E and the coupling section 218V to each other, which causes the VSS contact region 218 of the semiconductor layer 200S and the VSS contact region 118 of the semiconductor layer 100S to be electrically coupled to each other.

Next, description is given of a planar configuration of the wiring layer 200T with reference to FIGS. 10 to 12. FIG. 10 illustrates an example of a planar configuration of the first wiring layer W1 and the second wiring layer W2. FIG. 11 illustrates an example of a planar configuration of the second wiring layer W2 and the third wiring layer W3. FIG. 12 illustrates an example of a planar configuration of the third wiring layer W3 and the fourth wiring layer W4.

For example, the third wiring layer W3 includes wiring lines TRG1, TRG2, TRG3, and TRG4, SELL, RSTL, and FDGL that extend in the H direction (the row direction) (FIG. 11). These wiring lines correspond to the plurality of row drive signal lines 542 described with reference to FIG. 4. The wiring lines TRG1, TRG2, TRG3, and TRG4 respectively transmit drive signals to the transfer gates TG1, TG2, TG3, and TG4. The wiring lines TRG1, TRG2, TRG3, and TRG4 are respectively coupled to the transfer gates TG1, TG2, TG3, and TG4 through the second wiring layer W2, the first wiring layer W1, and the through electrode 120E. The wiring line SELL transmits a drive signal to the gate of the selection transistor SEL, the wiring line RSTL transmits a drive signal to the gate of the reset transistor RST, and the wiring line FDGL transmits a drive signal to the gate of the FD conversion gain switching transistor FDG. The wiring lines SELL, RSTL, and FDGL are respectively coupled to the gates of the selection transistor SEL, the reset transistor RST, and the FD conversion gain switching transistor FDG through the second wiring layer W2, the first wiring layer W1, and the coupling section.

For example, the fourth wiring layer W4 includes the power source line VDD, the reference potential line VSS, and the vertical signal line 543 that extend in the V direction (the column direction) (FIG. 12). The power source line VDD is coupled to the drain of the amplification transistor AMP and the drain of the reset transistor RST through the third wiring layer W3, the second wiring layer W2, the first wiring layer W1, and the coupling section. The reference potential line VSS is coupled to the VSS contact region 218 through the third wiring layer W3, the second wiring layer W2, the first wiring layer W1, and the coupling section 218V. In addition, the reference potential line VSS is coupled to the VSS contact region 118 of the first substrate 100 through the third wiring layer W3, the second wiring layer W2, the first wiring layer W1, the through electrode 121E, and the pad section 121. The vertical signal line 543 is coupled to the source (Vout) of the selection transistor SEL through the third wiring layer W3, the second wiring layer W2, the first wiring layer W1, and the coupling section.

The contact sections 201 and 202 may be provided at positions overlapping the pixel array section 540 in plan view (e.g., FIG. 3), or may be provided in the peripheral section 540B outside the pixel array section 540 (e.g., FIG. 6). The contact sections 201 and 202 are provided on the front surface (a surface on the side of the wiring layer 200T) of the second substrate 200. The contact sections 201 and 202 include, for example, metal such as Cu (copper) and Al (aluminum). The contact sections 201 and 202 are exposed to the front surface (a surface on side of the third substrate 300) of the wiring layer 200T. The contact sections 201 and 202 are used for electrical coupling between the second substrate 200 and the third substrate 300 and bonding between the second substrate 200 and the third substrate 300.

FIG. 6 illustrates an example in which a peripheral circuit is provided in the peripheral section 540B of the second substrate 200. The peripheral circuit may include a portion of the row driving section 520, a portion of the column signal processor 550, and the like. In addition, as illustrated in FIG. 3, the peripheral circuit may not be disposed in the peripheral section 540B of the second substrate 200, and the coupling hole sections H1 and H2 may be disposed in proximity to the pixel array section 540.

The third substrate 300 includes, for example, the wiring layer 300T and the semiconductor layer 300S in this order from the side of the second substrate 200. For example, the front surface of the semiconductor layer 300S is provided on the side of the second substrate 200. The semiconductor layer 300S includes a silicon substrate. A circuit is provided in a portion on front surface side of the semiconductor layer 300S. Specifically, for example, at least a portion of the input section 510A, the row driving section 520, the timing controller 530, the column signal processor 550, the image signal processor 560, and the output section 510B is provided in the portion on the front surface side of the semiconductor layer 300S. The wiring layer 300T provided between the semiconductor layer 300S and the second substrate 200 includes, for example, an interlayer insulating film, a plurality of wiring layers separated by the interlayer insulating film, and the contact sections 301 and 302. The contact sections 301 and 302 are exposed to the front surface (a surface on the side of the second substrate 200) of the wiring layer 300T. The contact section 301 is coupled to the contact section 201 of the second substrate 200, and the contact section 302 is coupled to the contact section 202 of the second substrate 200. The contact sections 301 and 302 are electrically coupled to a circuit (e.g., at least one of the input section 510A, the row driving section 520, the timing controller 530, the column signal processor 550, the image signal processor 560, and the output section 510B) formed in the semiconductor layer 300S. The contact sections 301 and 302 include, for example, metal such as Cu (copper) and aluminum (Al). For example, an external terminal TA is coupled to the input section 510A through the coupling hole section H1, and an external terminal TB is coupled to the output section 510B through the coupling hole section H2.

[Specific Configuration of Amplification Transistor AMP]

Hereinafter, description is given of a specific configuration of the amplification transistor AMP.

Figure 13:
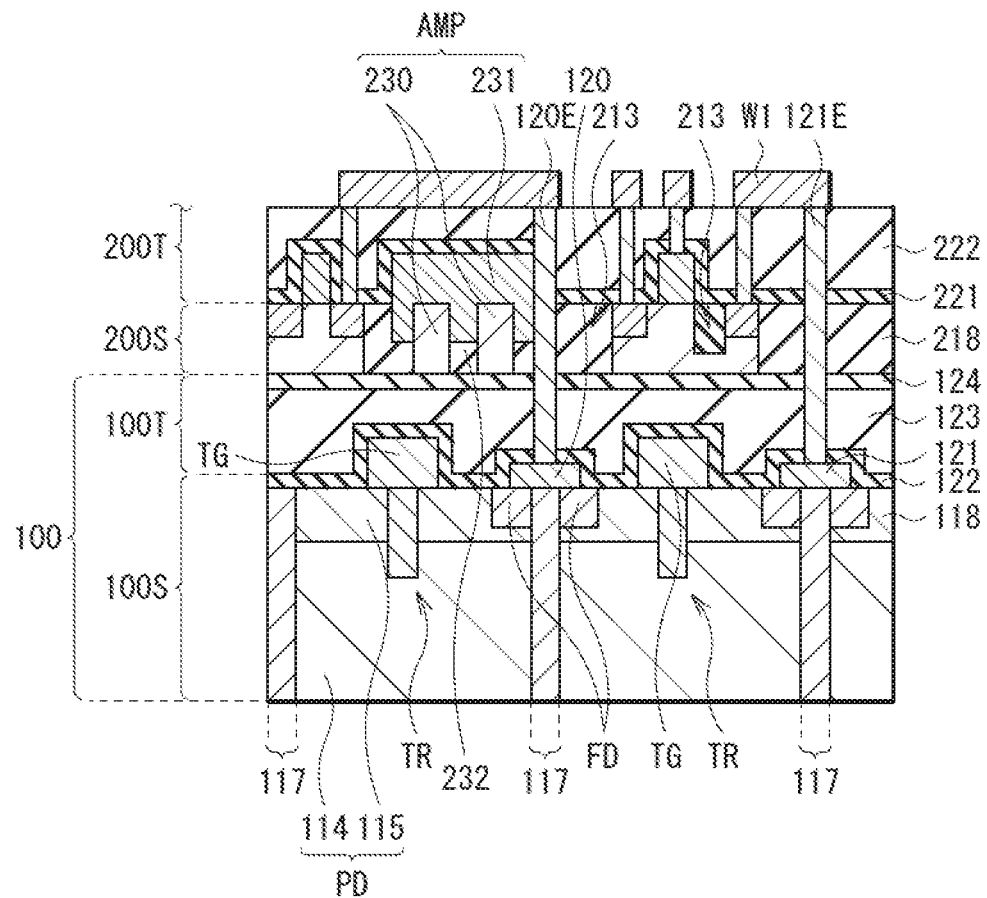
FIG. 13 is a schematic view of a cross-sectional configuration in proximity to an amplification transistor and a through electrode illustrated in FIG. 6.
Figure 14:
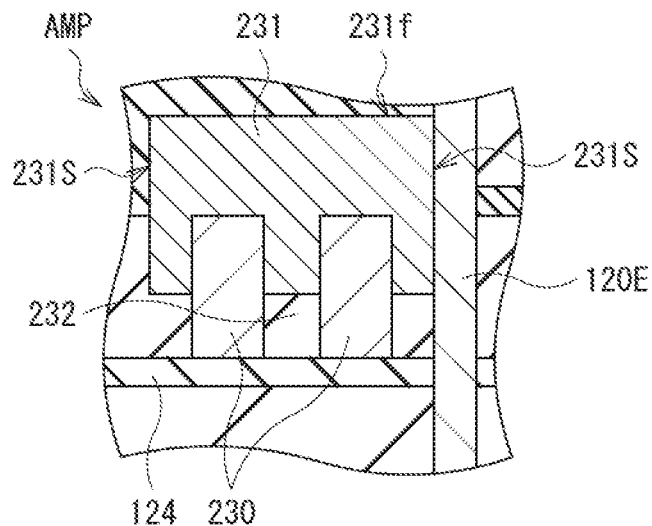
FIG. 14 is an enlarged schematic cross-sectional view of the amplification transistor illustrated in FIG. 13.

FIG. 13 is a schematic cross-sectional view of proximity to the amplification transistor AMP and the through electrode 120E illustrated in FIG. 6, and FIG. 14 illustrates the amplification transistor AMP illustrated in FIG. 13 in an enlarged manner. For example, the amplification transistor AMP is provided at a position closer to the through electrode 120E than other transistors included in the pixel circuit 210. The amplification transistor AMP includes, for example, a fin 230 and a gate electrode 231. A gate insulating film (not illustrated) is provided between the fin 230 and the gate electrode 231. The fin 230 is formed by partially engraving the semiconductor layer 200S. The amplification transistor AMP includes, for example, two fins 230 extending in a channel length direction (a direction perpendicular to a paper surface in FIG. 13), for example. The two fins 230 are provided apart from each other with the insulating film 232 interposed therebetween, for example. The insulating film 232 includes silicon oxide (SiO) or the like. The amplification transistor AMP may include one fin 230 or may include three or more fins 230.

The gate electrode 231 is provided from the semiconductor layer 200S to the wiring layer 200T, for example. A portion (a lower portion in the paper surface in FIG. 13) in the thickness direction of the gate electrode 231 is embedded in the semiconductor layer 200S (or the insulating region 212), and another portion (an upper portion in the paper surface in FIG. 13) is provided in the wiring layer 200T. The gate electrode 231 is also embedded between the two fins 230. The insulating region 212 or the insulating film 232 is provided between the gate electrode 231 and the bonding film 124. Such a gate electrode 231 is opposed to a plurality of surfaces of the fins 230. In other words, the gate electrode 231 is opposed to the fins 230 in a plurality of directions. Specifically, the gate electrode 231 is provided opposed to a pair of side surfaces extending in the channel length direction of each of the two fins 230 and a top surface coupling the pair of side surfaces of each of the fins 230. For example, upper portions of the pair of side surfaces of each of the fins 230 are opposed to the gate electrode 231, and lower portions of the pair of side surfaces of each of the fins 230 are covered with the insulating film 232 or the insulating region 212. A bottom surface of each of the two fins 230 is in contact with the bonding film 124, for example.

The gate electrode 231 has a front surface 231f opposed to the top surfaces of the fins 230 (the front surface of the semiconductor layer 200S), and a pair of side surfaces 231s provided in a direction intersecting with the front surface 231f (FIG. 14). For example, the front surface 231f is substantially parallel to the first substrate 100, and is provided in the wiring layer 200T. The pair of side surfaces 231s are provided substantially perpendicular to the front surface 231f, for example. The pair of side surfaces 231s are opposed to each other with the two fins 230 interposed therebetween. In the present embodiment, the gate electrode 231 is provided in contact with the through electrode 120E. As described in detail later, accordingly, an area of the gate electrode 231, specifically, an area in the channel width direction is increased, as compared with a case where the gate electrode 231 is disposed apart from the through electrode 120E.

One of the pair of side surfaces 231s of the gate electrode 231 is provided adjacent to the through electrode 120E, and is in contact with a portion of the through electrode 120E. More specifically, of the through electrode 120E, a portion provided in the wiring layer 200T and the semiconductor layer 200S (the insulating region 212) is partially in contact with the side surface 231s of the gate electrode 231. The one side surface 231s is in contact with the through electrode 120E in the thickness direction of the gate electrode 231, for example. A portion in the thickness direction of the other side surface 231s is covered with the passivation film 221, and another portion is embedded in the insulating region 212. The front surface 231f is covered with the passivation film 221, for example.

Hereinafter, description is given of characteristics of the imaging device 1.

In general, an imaging device includes a photodiode and a pixel circuit as main components. Herein, in a case where the area of the photodiode is increased, electric charges generated as a result of photoelectric conversion are increased, which consequently makes it possible to improve a signal-to-noise ratio (S/N ratio) of a pixel signal, thereby allowing the imaging device to output more favorable image data (image information). Meanwhile, in a case where the size of a transistor (specifically, the size of an amplification transistor) included in the pixel circuit is increased, noise generated in the pixel circuit is reduced, which consequently makes it possible to improve an S/N ratio of an imaging signal, thereby allowing the imaging device to output more favorable image data (image information).

However, it is conceivable that in an imaging device in which the photodiode and the pixel circuit are provided in the same semiconductor substrate, in a case where the area of the photodiode is increased within a limited area of the semiconductor substrate, the size of the transistor included in the pixel circuit is decreased. In addition, it is conceivable that in a case where the size of the transistor included in the pixel circuit is increased, the area of the photodiode is decreased.

To solve these issues, the imaging device 1 according to the present embodiment uses a structure in which a plurality of pixels 541 shares one pixel circuit 210, and the shared pixel circuit 210 is disposed to be superimposed on the photodiodes PD. This makes it possible to make the area of the photodiode PD as large as possible within the limited area of the semiconductor substrate and make the size of the transistor included in the pixel circuit 210 as large as possible. This makes it possible to improve the S/N ratio of the pixel signal, thereby allowing the imaging device 1 to output more favorable image data (image information).

In a case where a structure in which a plurality of pixels 541 shares one pixel circuit 210 and the pixel circuit 210 is disposed to be superimposed on the photodiodes PD is achieved, a plurality of wiring lines that is coupled from the respective floating diffusions FD of the plurality of pixels 541 to one pixel circuit 210 extends. In order to secure a large area of the second substrate 200 in which the pixel circuit 210 is formed, for example, it is possible to form a coupling wiring line that couples the plurality of extending wiring lines to each other to combine them into one. For a plurality of wiring lines extending from the VSS contact region 118, it is possible to form a coupling wiring line that couples the plurality of wiring lines to each other to combine them into one.

For example, it is conceivable that in a case where a coupling wiring line that couples the plurality of wiring lines extending from the respective floating diffusions FD of the plurality of pixels 541 to each other is formed in the second substrate 200 in which the pixel circuit 210 is formed, an area where the transistors included in the pixel circuit 210 are to be formed is decreased. Likewise, it is conceivable that in a case where a coupling wiring line that couples the plurality of wiring lines extending from the VSS contact regions 118 of the plurality of pixels 541 to each other to combine them into one is formed in the second substrate 200 in which the pixel circuit 210 is formed, an area where the transistors included in the pixel circuit 210 are to be formed is decreased.

To solve these issues, for example, the imaging device 1 according to the present embodiment is able to have a structure in which a plurality of pixels 541 shares one pixel circuit 210, and the shared pixel circuit 210 is disposed to be superimposed on the photodiodes PD, as well as a structure in which the coupling wiring line that couples the floating diffusions FD of the plurality of pixels 541 to each other to combine them into one, and the coupling wiring line that couples the VSS contact regions 118 included in the plurality of pixels 541 to each other to combine them into one are provided in the first substrate 100.

Herein, in a case where the second manufacturing method described above is used as a manufacturing method for providing, in the first substrate 100, the coupling wiring line that couples the floating diffusions FD of the plurality of pixels 541 to each other to combine them into one, and the coupling wiring line that couples the VSS contact regions 118 of the plurality of pixels 541 to each other to combine them into one, it is possible to perform manufacturing with use of appropriate processes corresponding to the configurations of the first substrate 100 and the second substrate 200 and manufacture an imaging device having high quality and high performance. In addition, it is possible to form the coupling wiring lines of the first substrate 100 and the second substrate 200 by an easy process. Specifically, in a case where the second manufacturing method described above is used, an electrode coupled to the floating diffusion FD and an electrode coupled to the VSS contact region 118 are provided on the front surface of the first substrate 100 and the front surface of the second substrate 200 that form a bonding boundary surface between the first substrate 100 and the second substrate 200. Furthermore, even if displacement occurs between the electrodes provided on the front surfaces of the first substrate 100 and the second substrate 200 upon bonding the two substrate together, the electrodes formed on the front surfaces of the two substrates are preferably made large to cause the electrodes formed on the front surfaces of the two substrates to be in contact with each other. In this case, it is considered difficult to dispose the electrodes described above in the limited area of each pixel included in the imaging device 1.

To solve an issue that a large electrode is necessary on the bonding boundary surface between the first substrate 100 and the second substrate 200, for example, in the imaging device 1 according to the present embodiment, it is possible to use the first manufacturing method described above as a manufacturing method of sharing one pixel circuit 210 by a plurality of pixels 541 and disposing the shared pixel circuit 210 to superimpose the shared pixel circuit 210 on the photodiodes PD. This makes it possible to facilitate alignment of elements formed in the first substrate 100 and the second substrate 200 and manufacture an imaging device having high quality and high performance. Furthermore, it is possible to include a unique structure formed by using this manufacturing method. That is, a structure in which the semiconductor layer 100S and the wiring layer 100T of the first substrate 100, and the semiconductor layer 200S and the wiring layer 200T of the second substrate 200 are stacked in this order, that is, a structure in which the first substrate 100 and the second substrate 200 are stacked face-to-back is included, and through electrodes 120E and 121E are included that penetrate through the semiconductor layer 200S and the wiring layer 100T of the first substrate 100 from the front surface side of the semiconductor layer 200S of the second substrate 200 and reach the front surface of the semiconductor layer 100S of the first substrate 100.

In a structure in which the coupling wiring line that couples the floating diffusions FD of the plurality of pixels 541 to each other to combine them into one and the coupling wiring line that couples the VSS contact regions 118 of the plurality of pixels 541 to each other to combine them into one are provided in the first substrate 100, this structure and the second substrate 200 are stacked with use of the first manufacturing method, and the pixel circuit 210 is formed in the second substrate 200, which may cause heating treatment necessary for formation of an active element included in the pixel circuit 210 to affect the coupling wiring lines described above formed in the first substrate 100.

Therefore, to solve an issue that heating treatment for formation of the active element described above affects the coupling wiring lines described above, in the imaging device 1 according to the present embodiment, it is desirable that an electrically conductive material having high heat resistance be used for the coupling wiring line that couples the floating diffusions FD of the plurality of pixels 541 to each other to combine them into one and the coupling wiring line that couples the VS S contact regions 118 of the plurality of pixels 541 to each other to combine them into one. Specifically, as the electrically conductive material having high heat resistance, it is possible to use a material having a higher melting point than that of at least some of wiring materials included in the wiring layer 200T of the second substrate 200.

As described above, for example, the imaging device 1 according to the present embodiment includes (1) a structure in which the first substrate 100 and the second substrate 200 are stacked face-to-back (specifically, a structure in which the semiconductor layer 100S and the wiring layer 100T of the first substrate 100 and the semiconductor layer 200S and the wiring layer 200T of the second substrate 200 are stacked in this order), (2) a structure in which the through electrodes 120E and 121E are provided that penetrate from the front surface side of the semiconductor layer 200S of the second substrate 200 to the front surface of the semiconductor layer 100S of the first substrate 100 through the semiconductor layer 200S and the wiring layer 100T of the first substrate 100, and (3) a structure in which the coupling wiring line that couples the floating diffusions FD included in the plurality of pixels 541 to each other to combine them into one and the coupling wiring line that couples the VSS contact regions 118 included in the plurality of pixels 541 to each other to combine them into one are formed with use of an electrically conductive material having high heat resistance, which makes it possible to provide, in the first substrate 100, a coupling wiring line that couples the floating diffusions FD included in the plurality of pixels 541 to each other to combine them into one and a coupling wiring line that couples the VSS contact regions 118 included in the plurality of pixels 541 to each other to combine them into one, without providing a large electrode at an interface between the first substrate 100 and the second substrate 200.

[Operation of Imaging Device 1]

Figure 15:
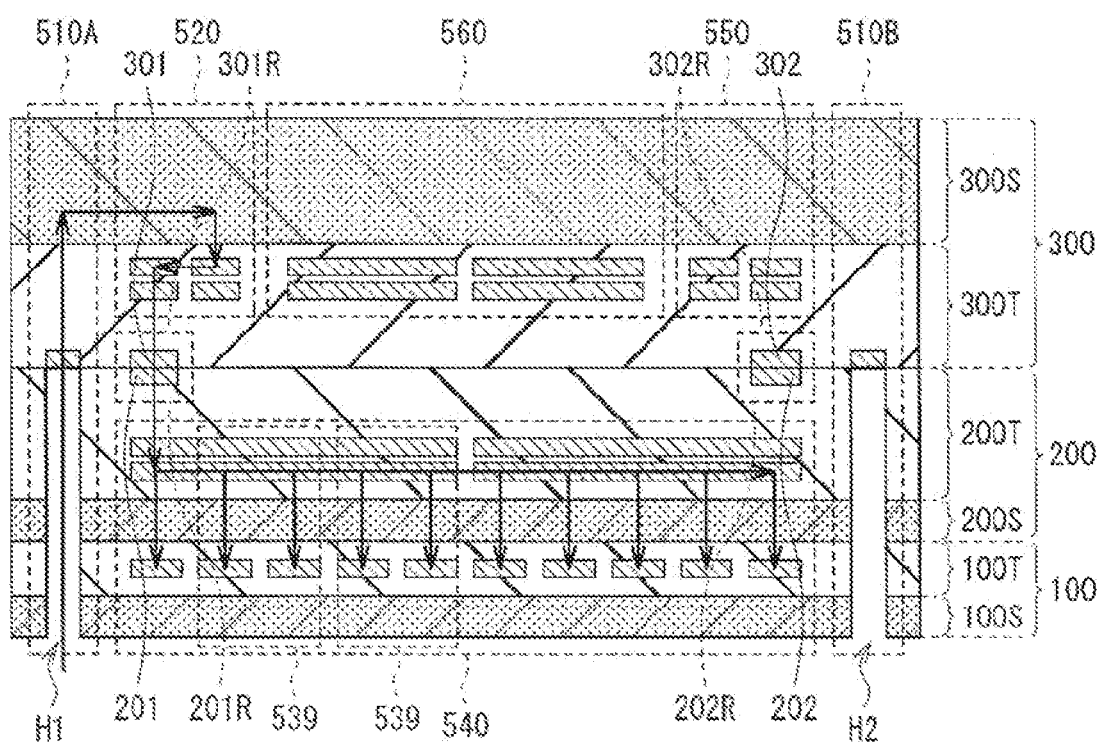
FIG. 15 is a schematic view for describing a path of an input signal to the imaging device illustrated in FIG. 3.
Figure 16:
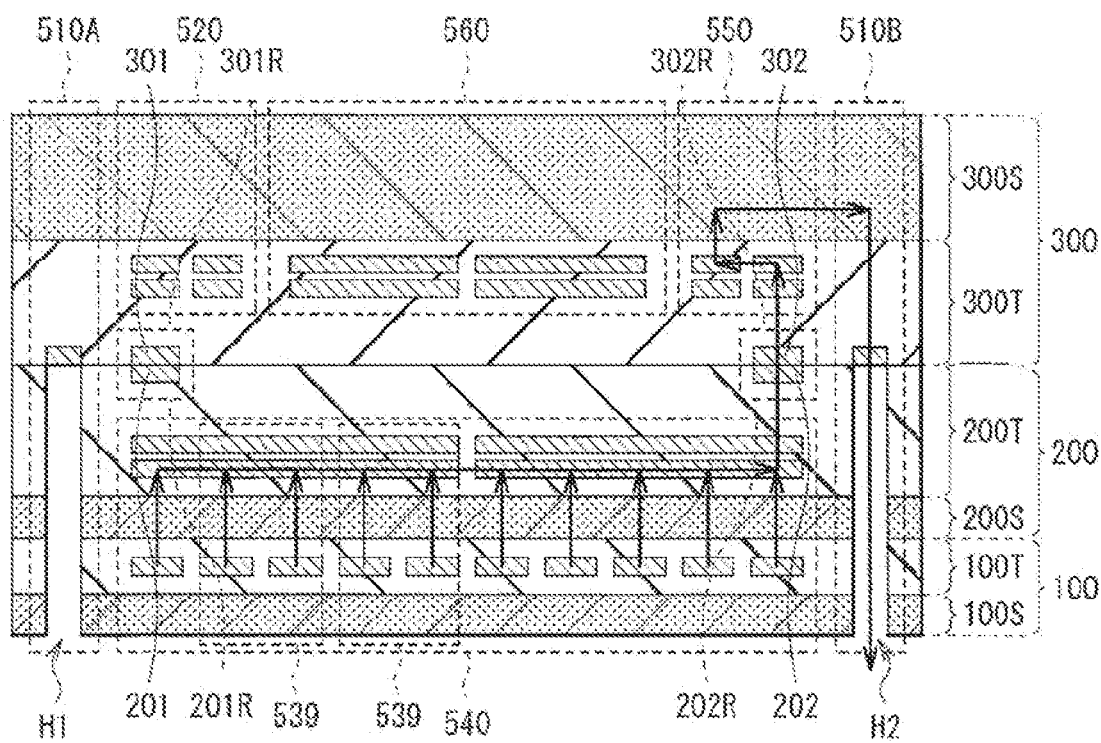
FIG. 16 is a schematic view for describing a signal path of a pixel signal of the imaging device illustrated in FIG. 3.

Next, description is given of an operation of the imaging device 1 with use of FIGS. 15 and 16. FIGS. 15 and 16 correspond to FIG. 3 with an arrow indicating a path of each signal. FIG. 15 illustrates paths, indicated by arrows, of an input signal to be inputted from outside to the imaging device 1, a power source potential, and a reference potential. FIG. 16 illustrates a signal path, indicated by arrows, of a pixel signal to be outputted from the imaging device 1 to outside. For example, the input signal (e.g., a pixel clock and a synchronization signal) inputted to the imaging device 1 through the input section 510A is transmitted to the row driving section 520 of the third substrate 300, and row drive signals are generated in the row driving section 520. The row drive signals are transmitted to the second substrate 200 through the contact sections 301 and 201. Furthermore, the row drive signals reach each of the pixel sharing units 539 of the pixel array section 540 through the row drive signal lines 542 in the wiring layer 200T. A drive signal other than a drive signal of the transfer gate TG among the row drive signals having reached the pixel sharing unit 539 of the second substrate 200 is inputted to the pixel circuit 210 to drive each of the transistors included in the pixel circuit 210. The drive signal of the transfer gate TG is inputted to the transfer gates TG1, TG2, TG3, and TG4 of the first substrate 100 through the through electrodes TGV to drive the pixels 541A, 541B, 541C, and 541D (FIG. 15). In addition, the power source potential and the reference potential supplied from outside of the imaging device 1 to the input section 510A (the input terminal 511) of the third substrate 300 are transmitted to the second substrate 200 through the contact sections 301 and 201 to be supplied to the pixel circuit 210 of each of the pixel sharing units 539 through a wiring line in the wiring layer 200T. The reference potential is also supplied to the pixels 541A, 541B, 541C, and 541D of the first substrate 100 through the through electrodes 121E. Meanwhile, the pixel signals photoelectrically converted in the pixels 541A, 541B, 541C, and 541D of the first substrate 100 are transmitted to the pixel circuit 210 of the second substrate 200 for each pixel sharing unit 539 through the through electrodes 120E. A pixel signal based on the pixel signal is transmitted from the pixel circuit 210 to the third substrate 300 through the vertical signal line 543 and the contact sections 202 and 302. The pixel signal is processed in the column signal processor 550 and the image signal processor 560 of the third substrate 300, and then outputted to outside through the output section 510B (FIG. 16).

[Effects]

In the imaging device 1 according to the present embodiment, the gate electrode 231 of the amplification transistor AMP is provided in contact with a portion of the through electrode 120E, which makes the area of the gate electrode 231 large, as compared with a case where the gate electrode 231 is disposed apart from the through electrode 120E. Description is given of workings and effects regarding this with use of a comparative example.

Figure 17:
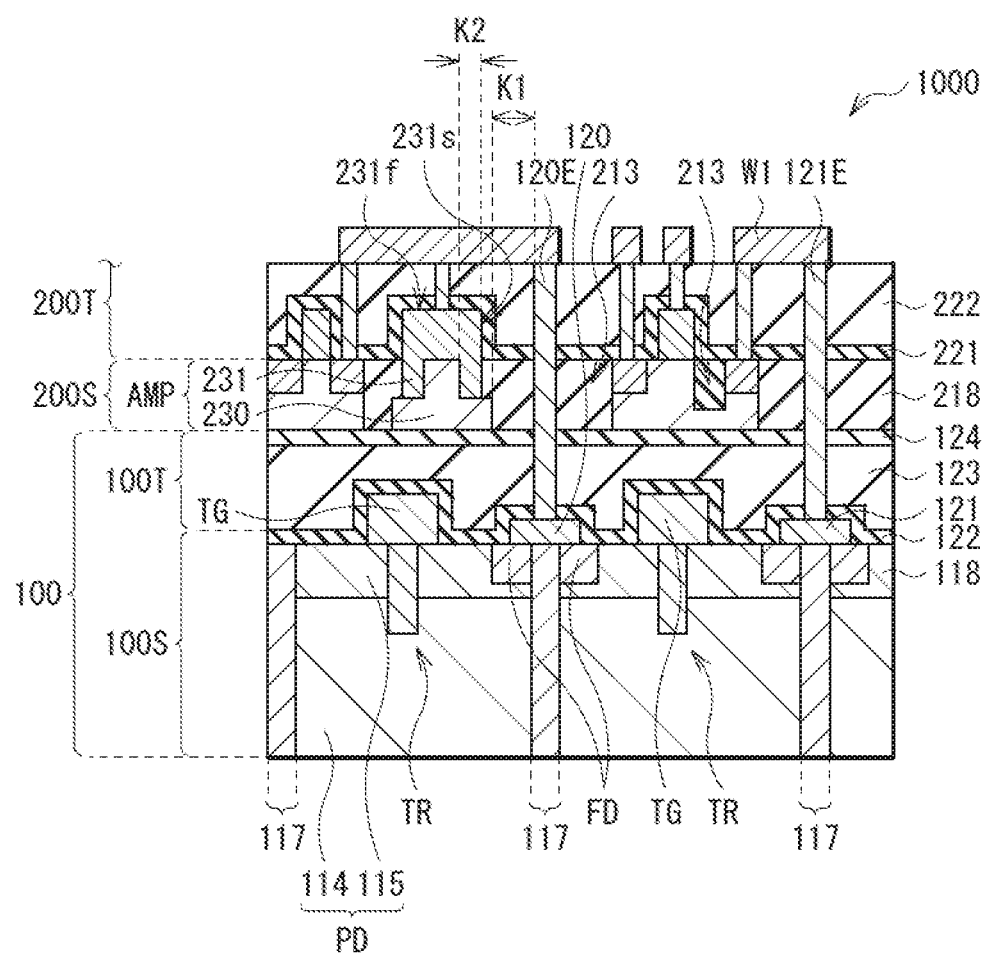
FIG. 17 is a schematic view of a cross-sectional configuration of a main part of an imaging device according to a comparative example.

FIG. 17 illustrates a cross-sectional configuration of a main part of an imaging device (an imaging device 1000) according to the comparative example. FIG. 17 corresponds to FIG. 13 that illustrates the imaging device 1. In the imaging device 1000, the gate electrode 231 of the amplification transistor AMP is disposed apart from the through electrode 120E. The semiconductor layer 200S where a channel of the amplification transistor AMP is formed is provided apart at a distance K1 from the through electrode 120E, and the imaging device 1000 differs from the imaging device 1 in this point.

In such an imaging device 1000, the size of the amplification transistor AMP is limited by the following distances K1 and K2. The distance K1 is a distance between the semiconductor layer 200S where the channel of the amplification transistor AMP is formed and the through electrode 120E. The distance K2 is a distance between the side surface of the fin 230 and the side surface 231s of the gate electrode 231. In the imaging device 1000, the gate electrode 231 is provided apart from the through electrode 120E; therefore, it is difficult to increase the distance K2. That is, it is difficult to sufficiently increase the area of the gate electrode 231, which may deteriorate transistor characteristics such as transconductance gm. This increases RTS (Random Telegraph Signal) noise, and the RTS noise may affect image data.

Figure 18:
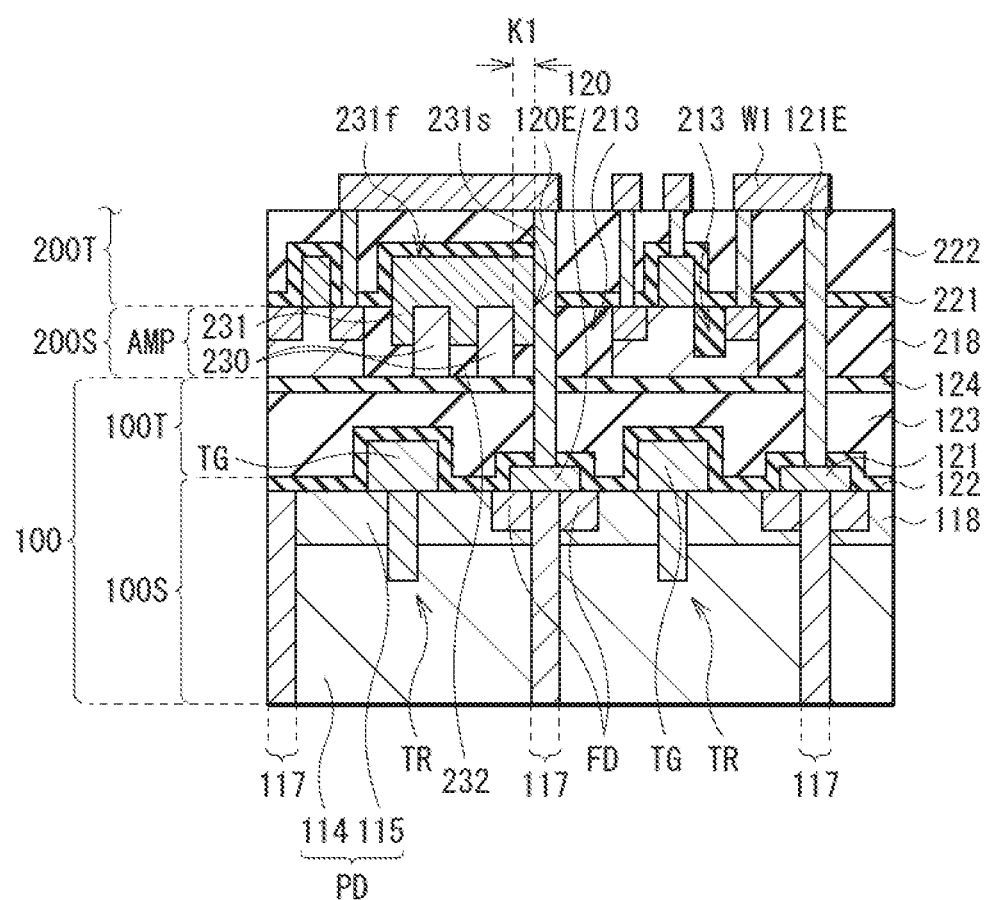
FIG. 18 is a schematic cross-sectional view for describing a size of the amplification transistor illustrated in FIG. 13.

FIG. 18 illustrates the distance K1 that specifies the size of the amplification transistor AMP of the imaging device 1. In the present embodiment, the side surface 231s of the gate electrode 231 is in contact with the through electrode 120E in such a manner; therefore, the size of the amplification transistor AMP is not limited by the distance (the distance K2 in FIG. 17) between the fin 230 and the side surface 231s of the gate electrode 231. In other words, in the imaging device 1, it is sufficient if only the distance K1 between the semiconductor layer 200S where the channel of the amplification transistor is formed and the through electrode 120E is considered. Accordingly, it is possible to increase the area in the channel width direction of the gate electrode 231. This makes it possible to increase the size of the amplification transistor AMP and improve transistor characteristics such as the transconductance gm. Accordingly, in the imaging device 1, it is possible to reduce RST noise of a signal to be outputted from the amplification transistor AMP and output image data having high quality.

In addition, forming the through electrode 120E after the amplification transistor AMP is formed makes it possible to form the through electrode 120E along the side surface 231s of the gate electrode 231 with self-alignment. On this occasion, misalignment does not occur between the amplification transistor AMP and the through electrode 120E. This makes it possible to reduce a margin in design, which easily makes the area in the channel width direction of the gate electrode 231 larger. Accordingly, it is possible to increase the size of the amplification transistor AMP even in this respect.

In addition, the present embodiment, the pixels 541A, 541B, 541C, and 541D (the pixel sharing units 539), and the pixel circuits 210 are provided in mutually different substrates (the first substrate 100 and the second substrate 200). This makes it possible to increase the areas of the pixels 541A, 541B, 541C, and 541D and the pixel circuits 210, as compared with a case where the pixels 541A, 541B, 541C, and 541D and the pixel circuits 210 are formed in the same substrate. This consequently makes it possible to increase the amount of pixel signals obtained by photoelectric conversion and reduce transistor noise of the pixel circuits 210. Accordingly, it is possible to improve the signal-to-noise ratio of the pixel signal, thereby allowing the imaging device 1 to output more favorable pixel data (image information). In addition, it is possible to miniaturize the imaging device 1 (in other words, reduce the pixel size and downsize the imaging device 1). Reduction in the pixel size makes it possible to increase the number of pixels per unit area, thereby allowing the imaging device 1 to output an image having high image quality.

In addition, in the imaging device 1, the first substrate 100 and the second substrate 200 are electrically coupled to each other by the through electrodes 120E and 121E provided in the insulating region 212. For example, a method of coupling the first substrate 100 and the second substrate 200 to each other by bonding pad electrodes together and a method of coupling the first substrate 100 and the second substrate 200 to each other by a through wiring line (e.g., a TSV ((Thorough Si Via)) penetrating through a semiconductor layer may be considered. As compared with such methods, providing the through electrodes 120E and 121E in the insulating region 212 makes it possible to reduce an area necessary for coupling between the first substrate 100 and the second substrate 200. This makes it possible to reduce the pixel size and further downsize the imaging device 1. In addition, further miniaturization of an area per pixel makes it possible to further enhance resolution. In a case where reduction in chip size is not necessary, it is possible to expand formation regions of the pixels 541A, 541B, 541C, and 541D and the pixel circuits 210. This consequently makes it possible to increase the amount of the pixel signals obtained by photoelectric conversion and to reduce noise of the transistors included in the pixel circuits 210. This makes it possible to improve the signal-to-noise ratio of the pixel signal, thereby allowing the imaging device 1 to output more favorable pixel data (image information).

In addition, in the imaging device 1, the pixel circuits 210, and the column signal processor 550 and the image signal processor 560 are provided in mutually different substrates (the second substrate 200 and third substrate 300). As compared with a case where the pixel circuits 210, the column signal processor 550, and the image signal processor 560 are formed in the same substrate, it is possible to increase the areas of the pixel circuits 210 and the areas of the column signal processor 550 and the image signal processor 560. This makes it possible to reduce noise generated in the column signal processor 550 and mount a more advanced image processing circuit in the image signal processor 560. Accordingly, it is possible to improve the signal-to-noise ratio of the pixel signal, thereby allowing the imaging device 1 to output more favorable pixel data (image information).

In addition, in the imaging device 1, the pixel array section 540 is provided in the first substrate 100 and the second substrate 200, and the column signal processor 550 and the image signal processor 560 are provided in the third substrate 300. In addition, the contact sections 201, 202, 301, and 302 that couple the second substrate 200 and the third substrate 300 to each other are formed above the pixel array section 540. This makes it possible to freely lay out the contact sections 201, 202, 301, and 302 without interference in layout by various types of wiring lines included in a pixel array. Accordingly, it is possible to use the contact sections 201, 202, 301, and 302 for electrical coupling between the second substrate 200 and the third substrate 300. For example, flexibility in layout in the column signal processor 550 and the image signal processor 560 is increased by using the contact sections 201, 202, 301, and 302. This makes it possible to reduce noise generated in the column signal processor 550 and mount a more advanced image processing circuit in the image signal processor 560. Accordingly, it is possible to improve the signal-to-noise ratio of the pixel signal, thereby allowing the imaging device 1 to output more favorable pixel data (image information).

In addition, in the imaging device 1, the pixel separation section 117 penetrates through the semiconductor layer 100S. This makes it possible to suppress color mixture among the pixels 541A, 541B, 541C, and 541D even in a case where a distance between adjacent pixels (the pixels 541A, 541B, 541C, and 541D) is decreased by miniaturization of an area per pixel. Accordingly, it is possible to improve the signal-to-noise ratio of the pixel signal, thereby allowing the imaging device 1 to output more favorable pixel data (image information).

In addition, in the imaging device 1, the pixel circuit 210 is provided for each pixel sharing unit 539. Accordingly, as compared with a case where the pixel circuit 210 is provided for each of the pixels 541A, 541B, 541C, and 541D, it is possible to expand formation regions of the transistors (the amplification transistor AMP, the reset transistor RST, the selection transistor SEL, and the FD conversion gain switching transistor FDG) included in the pixel circuit 210. For example, expanding the formation region of the amplification transistor AMP makes it possible to suppress noise. Accordingly, it is possible to improve the signal-to-noise ratio of the pixel signal, thereby allowing the imaging device 1 to output more favorable pixel data (image information).

Furthermore, in the imaging device 1, the pad section 120 that electrically couples the floating diffusions FD (the floating diffusions FD1, FD2, FD3, and FD4) of four pixels (the pixels 541A, 541B, 541C, and 541D) to each other is provided in the first substrate 100. Accordingly, as compared with a case where such a pad section 120 is provided in the second substrate 200, it is possible to reduce the number of through electrodes (the through electrodes 120E) that couple the first substrate 100 and the second substrate 200 to each other. This makes it possible to make the insulating region 212 small and secure sufficiently large formation regions (the semiconductor layer 200S) of the transistors included in the pixel circuit 210. This makes it possible to reduce noise of the transistors included in the pixel circuit 210, which makes it possible to improve the signal-to-noise ratio of the pixel signal, thereby allowing the imaging device 1 to output more favorable pixel data (image information).

Furthermore, in the imaging device 1, the transistors such as the amplification transistor AMP included in the pixel circuit 210 include a transistor having a three-dimensional structure. This makes it possible to increase an effective gate width while maintaining a footprint, as compared with a case where a planar transistor is used. Accordingly, it is possible to improve transistor performance (such as operation speed and RN) without obstructing miniaturization of pixels. In addition, a gate area is increased, which makes it possible to reduce RTS noise. This makes it possible to suppress an influence of noise on an image more effectively.

In addition, in the present embodiment, regarding the second substrate 200, description has been given of an example in which the amplification transistor AMP, the reset transistor RST, and the selection transistor SEL that are allowed to be included in the pixel circuit 210 are formed in one semiconductor layer 200S; however, at least one transistor may be formed in an semiconductor layer 200S-1, and the remaining transistors may be formed in a semiconductor layer 200S-2 that is different from the semiconductor layer 100S and the semiconductor layer 200S-1. Although the semiconductor layer 200S-2 is not illustrated, for example, an insulating layer, a coupling section, and a coupling wiring line are formed above the semiconductor layer 200S-1 (corresponding to the semiconductor layer 200S), and the semiconductor layer 200S-2 is further stacked thereon. This another semiconductor layer 200S-2 is stacked on a surface on side opposite to a surface stacked on the semiconductor layer 100S of the interlayer insulating film 123, and it is possible to form a desired transistor in the semiconductor layer 200S-2. As an example, it is possible to form the amplification transistor AMP in the semiconductor layer 200S-1, and form the reset transistor RST and/or the selection transistor SEL in the semiconductor layer 200S-2.

In addition, a plurality of other semiconductor layers may be provided, and a desired one of the transistors of the pixel circuit 210 may be provided in each of the other semiconductor layers. As an example, it is possible to form the amplification transistor AMP in the semiconductor layer 200S-1. Furthermore, in a case where an insulating layer, a coupling section, and a coupling wiring line are stacked on the semiconductor layer 200S and the semiconductor layer 200S-2 is further stacked thereon, it is possible to form the reset transistor RST in the semiconductor layer 200S-2. In a case where an insulating layer, a coupling section, and a coupling wiring line are stacked on the semiconductor layer 200S-2 and a semiconductor layer 200S-3 is further stacked thereon, it is possible to form the selection transistor SEL in the semiconductor layer 200S-3. The transistors formed in the semiconductor layers 200S-1, 200S-2, and 200S-3 may be any of the transistors included in the pixel circuit 210.

Thus, a structure in which a plurality of semiconductor layers is provided in the second substrate 200 makes it possible to decrease the area of the semiconductor layer 200S occupied by one pixel circuit 210. If it is possible to decrease the area of each pixel circuit 210 or miniaturize each transistor, it is also possible to decrease the area of the chip. In addition, it is possible to increase the area of a desired transistor among the amplification transistor, the reset transistor, and the selection transistor that are allowed to be included in the pixel circuit 210. In particular, increasing the area of the amplification transistor makes it possible to expect a noise reduction effect.

Figure 53:
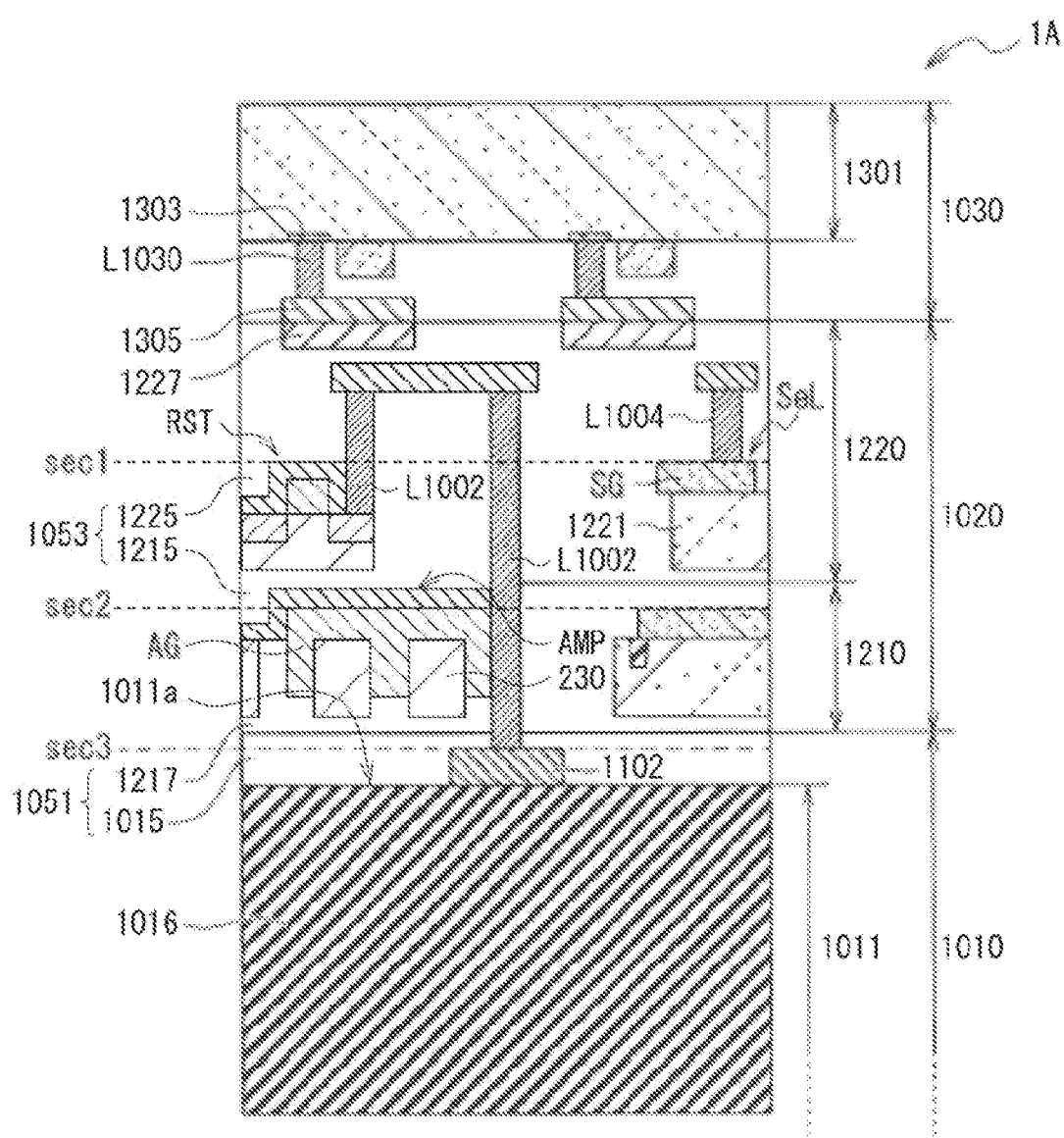
FIG. 53 is a cross-sectional view in the thickness direction of a configuration example of an imaging device according to a combination of the embodiment and the modification example 13 of the present disclosure.
Figure 54:
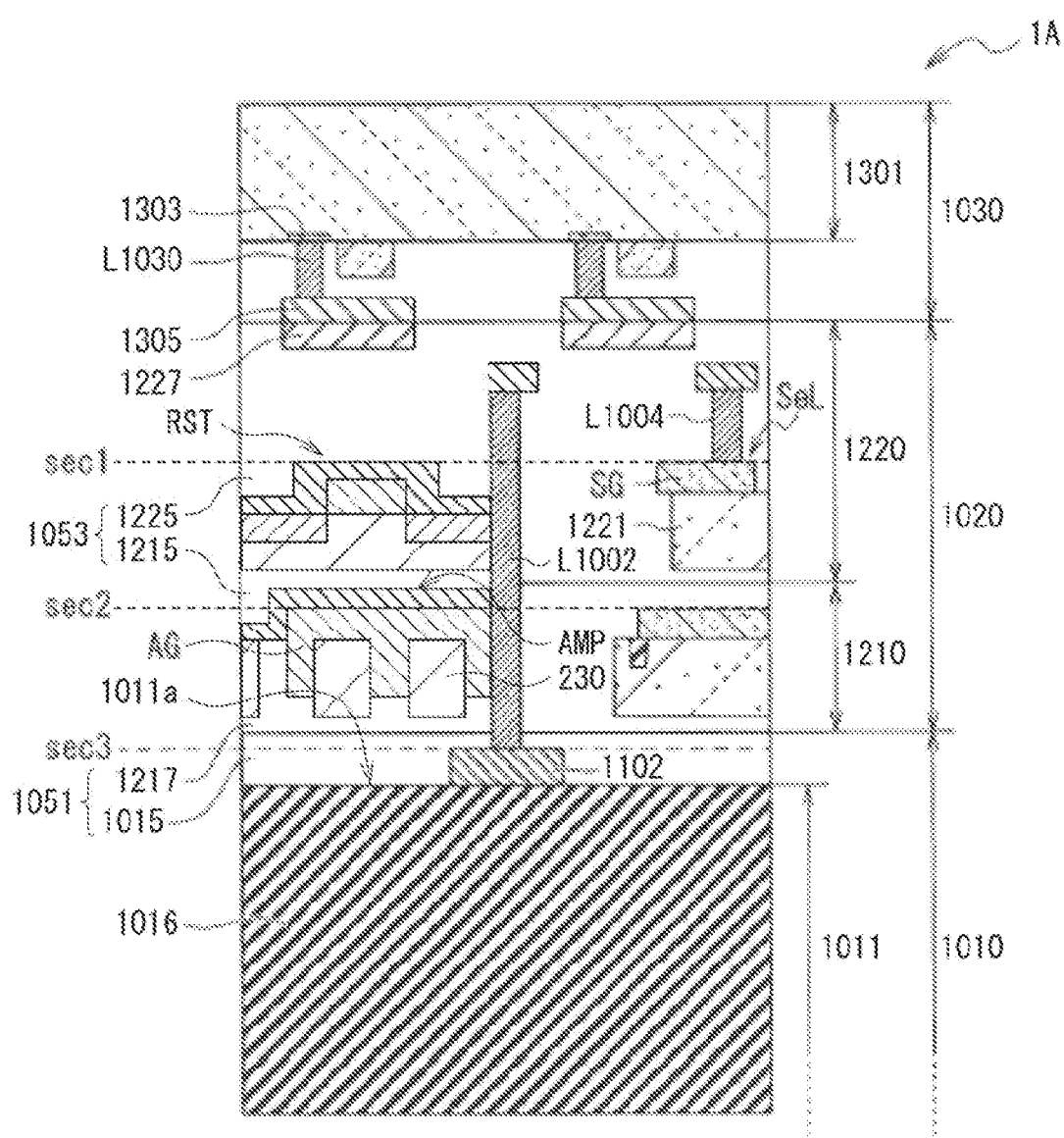
FIG. 54 is a cross-sectional view in the thickness direction of a configuration example of the imaging device according to the combination of the embodiment and the modification example 13 of the present disclosure.

It is to be noted that as described above, in a case where the pixel circuit 210 is formed dividedly in a plurality of semiconductor layers (e.g., the semiconductor layers 200S-1, 200S-2, and 200S-3), for example, as illustrated in FIG. 53 corresponding to a modification example 13 to be described later, in a substrate (a wiring layer 1210) including the gate electrode 23 of the amplification transistor AMP, a gate electrode 231 may be provided in contact with a wiring line L1002 (corresponding to the through electrode 120). Furthermore, as illustrated in FIG. 54, the wiring line L1002 (corresponding to the through electrode 120) is provided in contact with the source of the reset transistor RST provided in a semiconductor layer 1221.

Modification examples of the imaging device 1 according to the embodiment described above are described below. In the following modification examples, common components to those in the embodiment described above are denoted by same reference signs.

2. Modification Example 1

Figure 19:
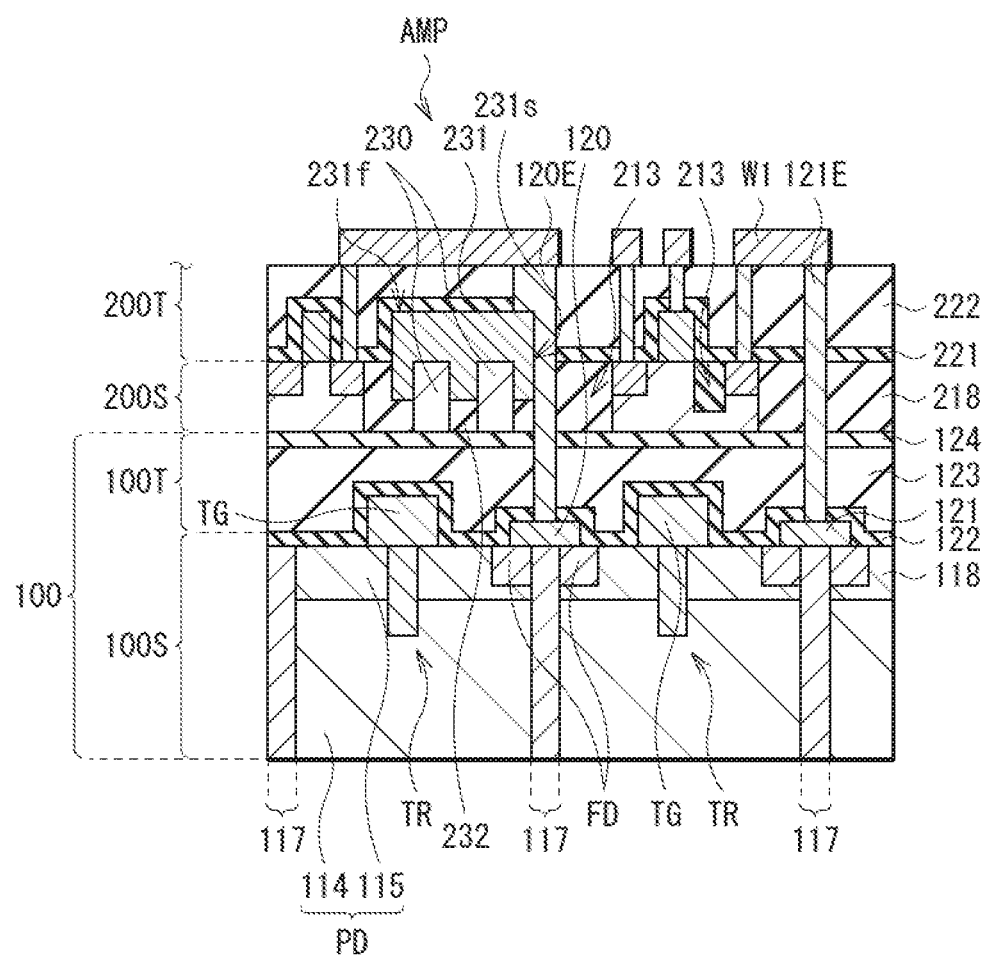
FIG. 19 is a schematic view of a cross-sectional configuration of a main part of an imaging device according to a modification example 1.

FIG. 19 illustrates a modification example of a cross-sectional configuration of a main part of the imaging device according to the embodiment described above. FIG. 19 schematically illustrates a cross-sectional configuration in proximity to the amplification transistor AMP and the through electrode 120E, and corresponds to FIG. 13 described in the above embodiment.

In the present modification example, the side surface 231s and the front surface 231f of the gate electrode 231 are in contact with the through electrode 120E. The imaging device 1 according to the present modification example differs from the imaging device described in the above embodiment in this point.

For example, an end, on side of the through electrode 120E, of the front surface 231f of the gate electrode 231 is exposed from the passivation film 221. The through electrode 120E is in contact with a portion from the end of the front surface 231f to the side surface 231s of the gate electrode 231. This makes it possible to increase a contact area between the gate electrode 231 and the through electrode 120E, as compared with a configuration in which only the side surface 231s of the gate electrode 231 is in contact with the through electrode 120E (e.g., FIG. 13).

The imaging device 1 according to the present modification example also achieves effects similar to those described in the above embodiment. Furthermore, it is possible to increase the contact area between the gate electrode 231 and the through electrode 120E, which makes it possible to improve stability of coupling therebetween.

3. Modification Example 2

Figure 20:
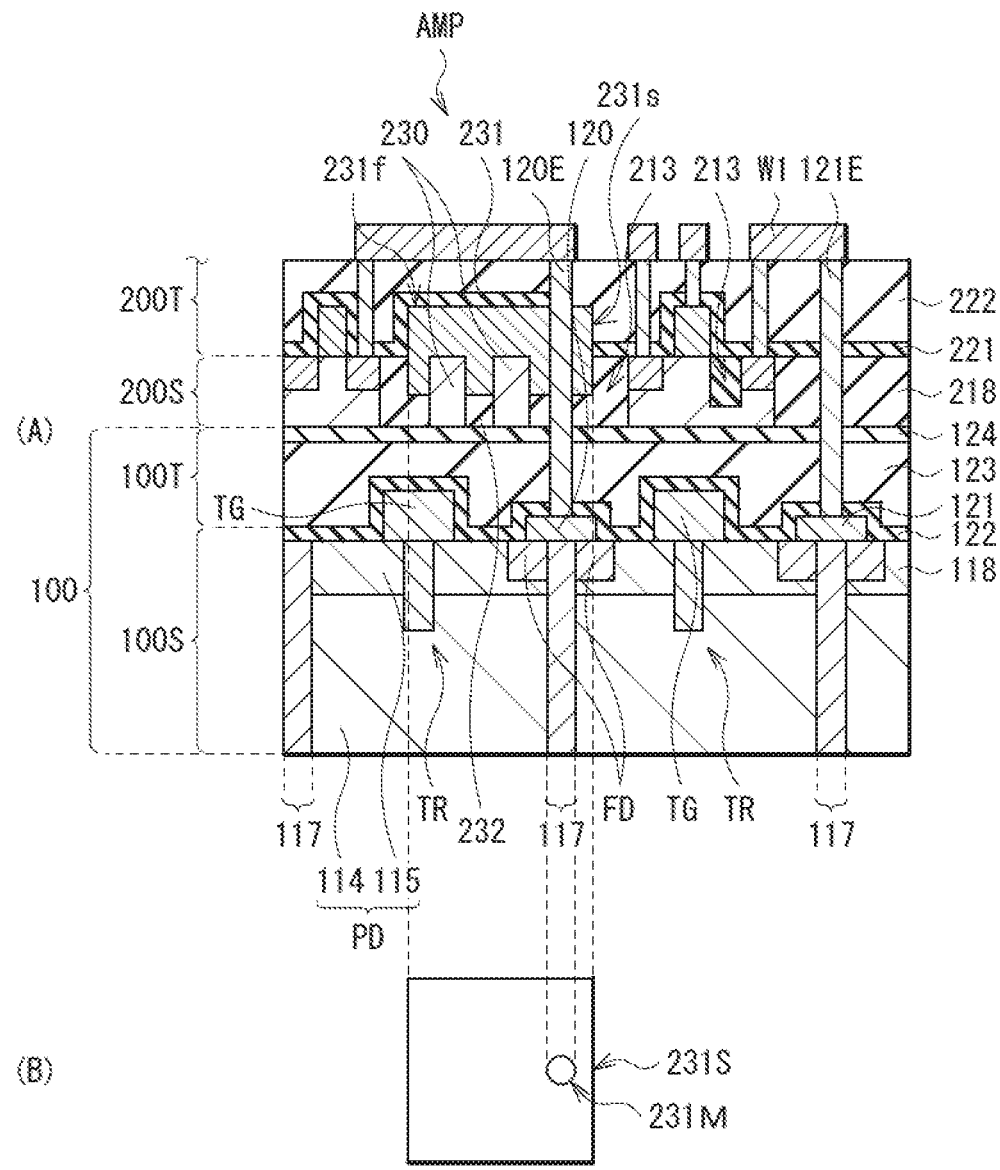
FIG. 20 (A) is a schematic view of a cross-sectional configuration of a main part of an imaging device according to a modification example 2, and (B) is a schematic view of a planar configuration of a gate electrode illustrated in (A).

(A) and (B) of FIG. 20 illustrate a modification example of a configuration of a main part of the imaging device 1 according to the present embodiment. (A) of FIG. 20 schematically illustrates a cross-sectional configuration in proximity to the amplification transistor AMP and the through electrode 120E, and corresponds to FIG. 13 described in the above embodiment. (B) of FIG. 20 schematically illustrates a planar configuration of the gate electrode 231 illustrated in (A) of FIG. 20.

In the present modification example, a through hole 231M into which the through electrode 120E is inserted is provided in the gate electrode 231. The imaging device 1 according to the present modification example differs from the imaging device 1 descried in the above embodiment in this point.

The through hole 231M penetrates through the gate electrode 231 in the thickness direction from the front surface 231f of the gate electrode 231 to a back surface opposed to the front surface 231f ((A) of FIG. 20). The through hole 231M is provided at a position not overlapping the fin 230 in plan view. The through hole 231M is disposed, for example, at a position closer to the side surface 231s of the gate electrode 231 than a plurality of fins 230 arranged side by side in the channel width direction in plan view ((B) of FIG. 20).

The through electrode 120E is provided at a position overlapping the through hole 231M of the gate electrode 231 in plan view, and is inserted into the through hole 231M. The through electrode 120E is in contact with the gate electrode 231 on an inner peripheral surface of the through hole 231M. For example, the through electrode 120E is in contact with the gate electrode 231 in a circumferential direction of the through hole 231M, and is in contact with the gate electrode 231 in a length direction of the through hole 231M (the thickness direction of the gate electrode 231). Providing, in the gate electrode 231, the through hole 231M into which the through electrode 120E is inserted makes it possible to increase a contact area between the gate electrode 231 and the through electrode 120E, as compared with a configuration in which only the side surface 231s of the gate electrode 231 is in contact with the through electrode 120E (e.g., FIG. 13).

The imaging device 1 according to the present modification example also achieves effects similar to those described in the above embodiment. Furthermore, it is possible to increase the contact area between the gate electrode 231 and the through electrode 120E, which makes it possible to improve stability of coupling therebetween. In addition, the through electrode 120E is inserted into the through hole 231M of the gate electrode 231, which further hinders misalignment between the gate electrode 231 and the through electrode 120E in forming the through electrode 120E. It is possible to improve stability of coupling between the gate electrode 231 and the through electrode 120E also in this respect.

4. Modification Example 3

Figure 21:
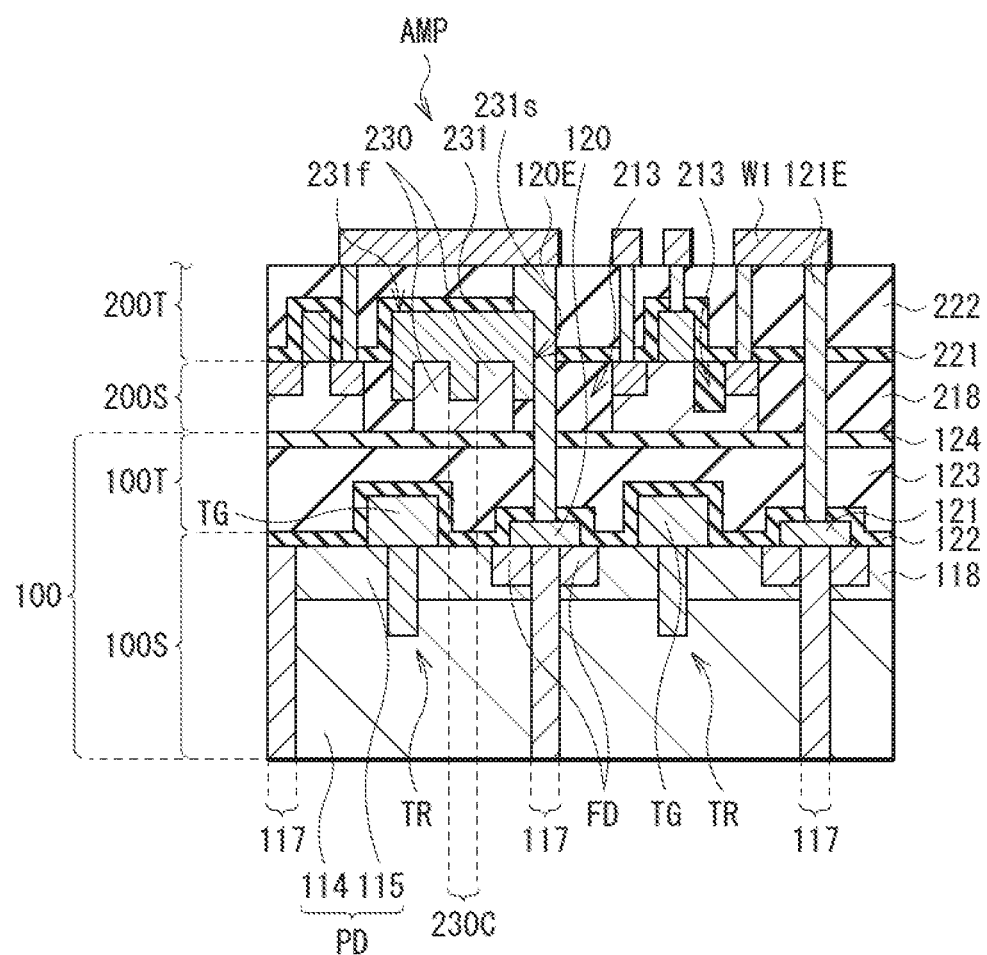
FIG. 21 is a schematic view of a cross-sectional configuration of a main part of an imaging device according to a modification example 3.

FIG. 21 illustrates a modification example of a cross-sectional configuration of a main part of the imaging device according to the embodiment described above. FIG. 21 schematically illustrates a cross-sectional configuration in proximity to the amplification transistor AMP and the through electrode 120E, and corresponds to FIG. 13 described in the above embodiment.

In the present modification example, a connecting section 230c is provided between adjacent fins 230. The imaging device 1 according to the present modification example differs from the imaging device 1 described in the above embodiment in this point.

The connecting section 230c connects a plurality of fins 230 arranged side by side in the channel width direction. The connecting section 230c is formed, for example, by leaving the semiconductor layer 200S between adjacent fins 230 in forming the fins 230 from the semiconductor layer 200S. That is, the connecting section 230c is configured with use of a portion of the semiconductor layer 200S. A height of the connecting section 230c (a size in the thickness direction of the semiconductor layer 200S) is smaller than heights of the fins 230, for example. The connecting section 230c is provided to connect lower portions (portions on side of the first substrate 100) of adjacent fins 230 to each other. That is, the connecting section 230c may be provided in place of the insulating film 232 (FIG. 13) described in the above embodiment. The connecting section 230c that connects the adjacent fins 230 to each other is provided, which increases an area where the channel of the amplification transistor AMP is formed, as compared with a configuration in which the insulating film 232 is provided between the adjacent fins 230.

For example, the through electrode 120E is in contact with a portion from an end of the front surface 231f of the gate electrode 231 to the side surface 231s. This makes it possible to improve stability of coupling between the gate electrode 231 and the through electrode 120E in a manner similar to that described in the above modification example 1. The through electrode 120E may be in contact with only the side surface 231s of the gate electrode 231 (see FIG. 13). Alternatively, a through hole may be provided in the gate electrode 231, and the through electrode 120E may be in contact with the gate electrode 231 on an inner peripheral surface of the through hole (see (A) and (B) of FIG. 20).

The imaging device 1 according to the present modification example also achieves effects similar to those described in the above embodiment. Furthermore, providing the connecting section 230c between the adjacent fins 230 makes it possible to increase the size of the amplification transistor AMP. This makes it possible to more effectively improve transistor characteristics such as the transconductance gm.

5. Modification Example 4

Figure 22:
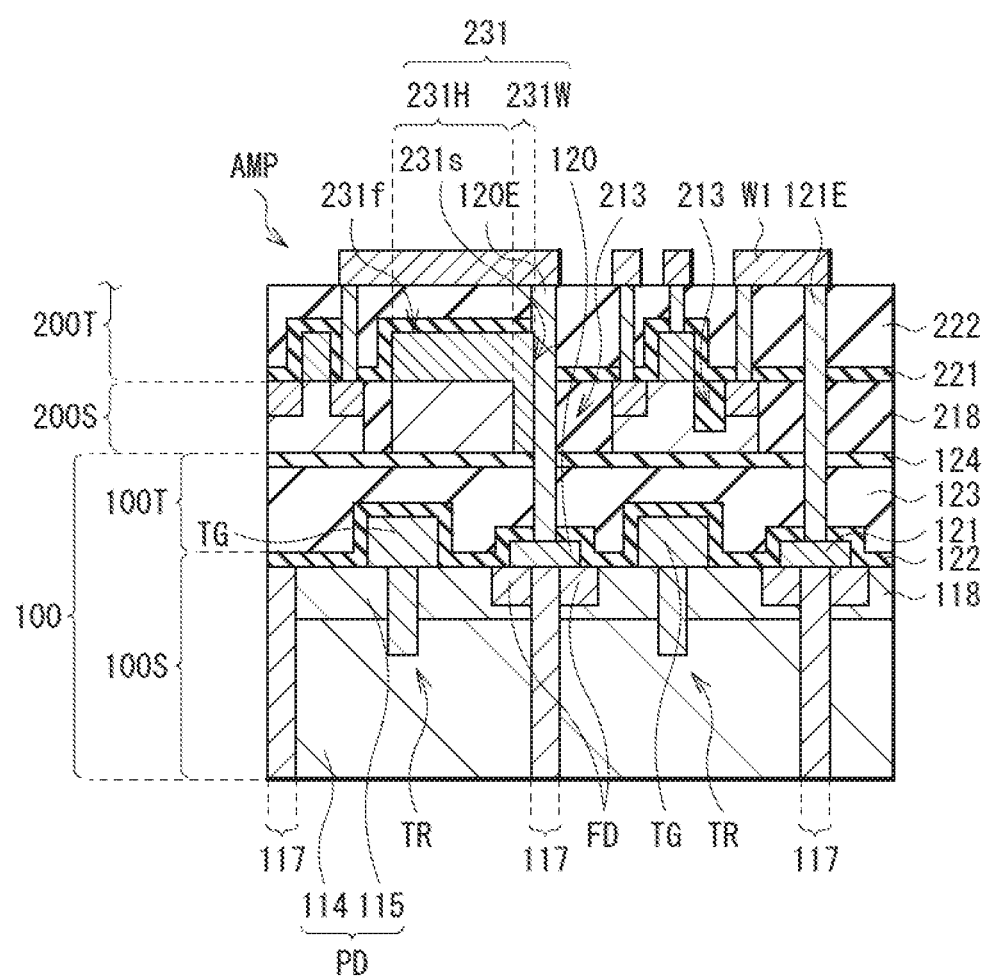
FIG. 22 is a schematic view of a cross-sectional configuration of a main part of an imaging device according to a modification example 4.

FIG. 22 illustrates a modification example of a cross-sectional configuration of a main part of the imaging device 1 according to the embodiment described above. FIG. 22 schematically illustrates a cross-sectional configuration in proximity to the amplification transistor AMP and the through electrode 120E, and corresponds to FIG. 13 described in the above embodiment.

In the present modification example, the amplification transistor AMP includes a planar type (planar) transistor. The imaging device 1 according to the present modification example differs from the imaging device 1 described in the above embodiment in this point.

The amplification transistor AMP includes the semiconductor layer 200S, the gate electrode 231 opposed to the semiconductor layer 200S, and a gate insulating film (not illustrated) provided between the gate electrode 231 and the semiconductor layer 200S. The gate electrode 231 includes, for example, a horizontal section 231H opposed to the front surface of the semiconductor layer 200S and a sidewall section 231W intersecting with the horizontal section 231H. The sidewall section 231W is provided substantially perpendicular to the horizontal section 231H, for example.

The horizontal section 231H is provided substantially parallel to a plane of the semiconductor layer 200S. The horizontal section 231H is provided between the semiconductor layer 200S and the passivation film 221, more specifically between the gate insulating film and the passivation film 221. For example, the front surface 231f of the gate electrode 231 is provided in the horizontal section 231H, and the front surface 231f is covered with the passivation film 221.

The sidewall section 231W is coupled to the horizontal section 231H. The sidewall section 231W is provided between the horizontal section 231H and the through electrode 120E and between the semiconductor layer 200S (more specifically, the gate insulating film) and the through electrode 120E. That is, a size in the height direction of the sidewall section 231W is larger than a size in the thickness direction of the horizontal section 231H. The sidewall section 231W is provided opposed to one (a side surface closer to the through electrode 120E) of a pair of side surfaces extending in the channel length direction of the semiconductor layer 200S. The sidewall section 231W is provided to cover the one side surface of the semiconductor layer 200S in the thickness direction, for example. For example, the side surface 231s of the gate electrode 231 is provided in the sidewall section 231W.

The through electrode 120E is in contact with the sidewall section 231W of the gate electrode 231. For example, the through electrode 120E is in contact with the sidewall section 231W in the height direction. As described above, the size in the height direction of the sidewall section 231W is larger than the size in the thickness direction of the horizontal section 231H. This makes it possible to increase the contact area between the through electrode 120E and the gate electrode 231, as compared with a configuration in which an end surface (a surface perpendicular to the front surface 231*f*) of the horizontal section 230H is in contact with the through electrode 120E. This makes it possible to improve stability of coupling between the through electrode 120E and the gate electrode 231.

The imaging device 1 according to the present modification example also achieves effects similar to those described in the above embodiment. The amplification transistor AMP may include a planar type transistor in such a manner.

6. Modification Example 5

Figure 23:
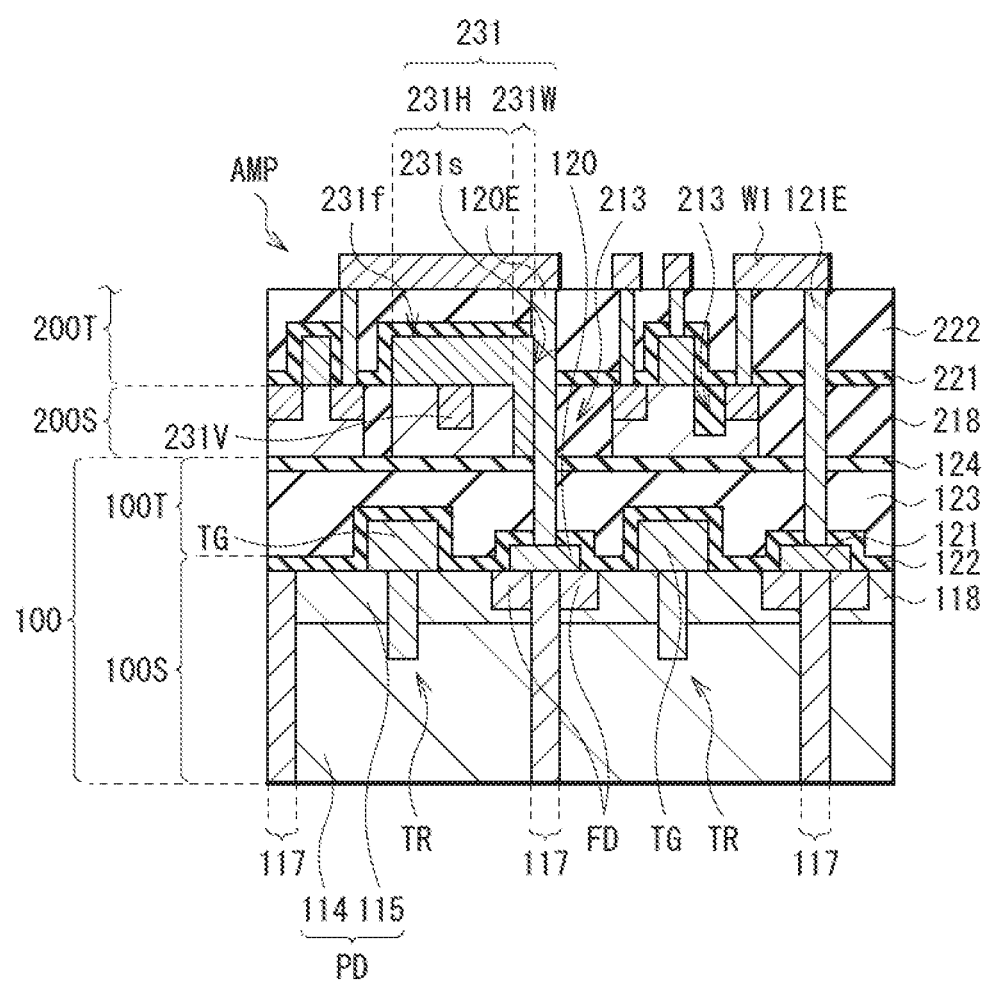
FIG. 23 is a schematic view of a cross-sectional configuration of a main part of an imaging device according to a modification example 5.

FIG. 23 illustrates a modification example of a cross-sectional configuration of a main part of the imaging device 1 according to the embodiment described above. FIG. 23 schematically illustrates a cross-sectional configuration in proximity to the amplification transistor AMP and the through electrode 120E, and corresponds to FIG. 13 described in the above embodiment.

In the present modification example, the amplification transistor AMP includes a planar type (planar) transistor in a manner similar to that described in the above modification example 4. Furthermore, in the amplification transistor AMP, a portion of the gate electrode 231 is embedded in the semiconductor layer 200S. The imaging device 1 according to the present modification example differs from the imaging device 1 described in the above embodiment in this point.

The gate electrode 231 of the amplification transistor AMP includes a vertical section 231V in addition to the horizontal section 231H and the sidewall section 231W. The vertical section 231V is a so-called vertical gate electrode, and is embedded in the semiconductor layer 200S in the thickness direction. For example, an upper end of the vertical section 231V is coupled to a middle portion of the horizontal section 231H.

The imaging device 1 according to the present modification example also achieves effects similar to those described in the above embodiment. The gate electrode 231 of the amplification transistor AMP may include the vertical section 231V embedded in the semiconductor layer 200S in such a manner.

7. Modification Example 6

Figure 24:
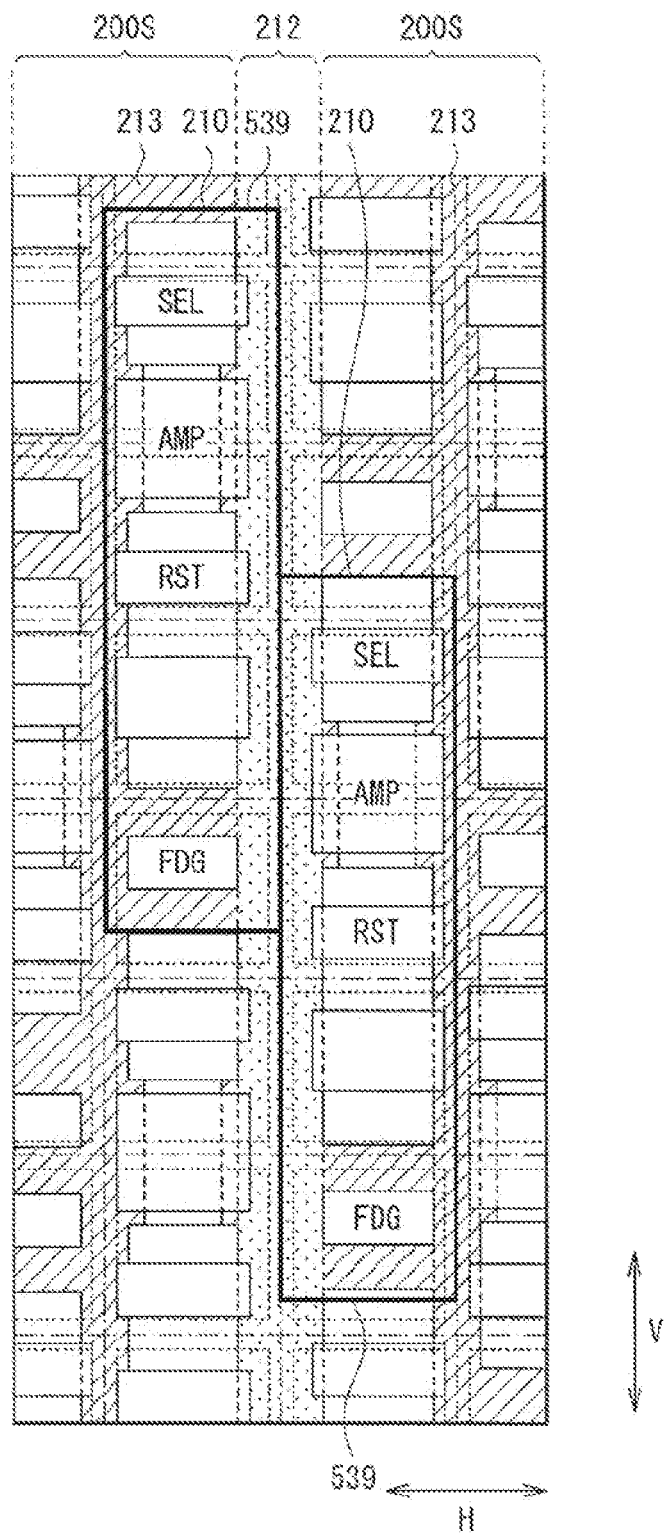
FIG. 24 is a schematic view of a modification example of the planar configuration of the second substrate (the semiconductor layer) illustrated in FIG. 8.
Figure 25:
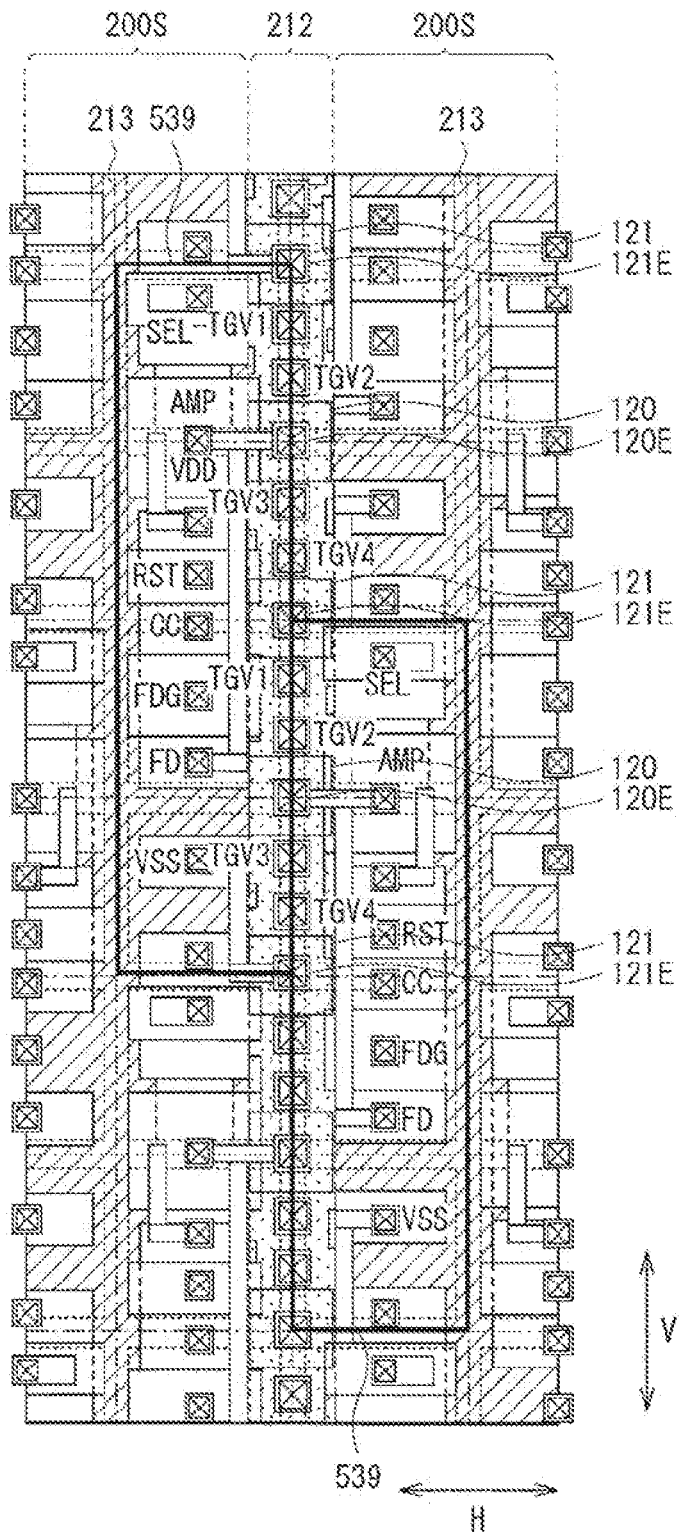
FIG. 25 is a schematic view of a planar configuration of main parts of the first wiring layer and the first substrate together with the pixel circuit illustrated in FIG. 24.
Figure 26:
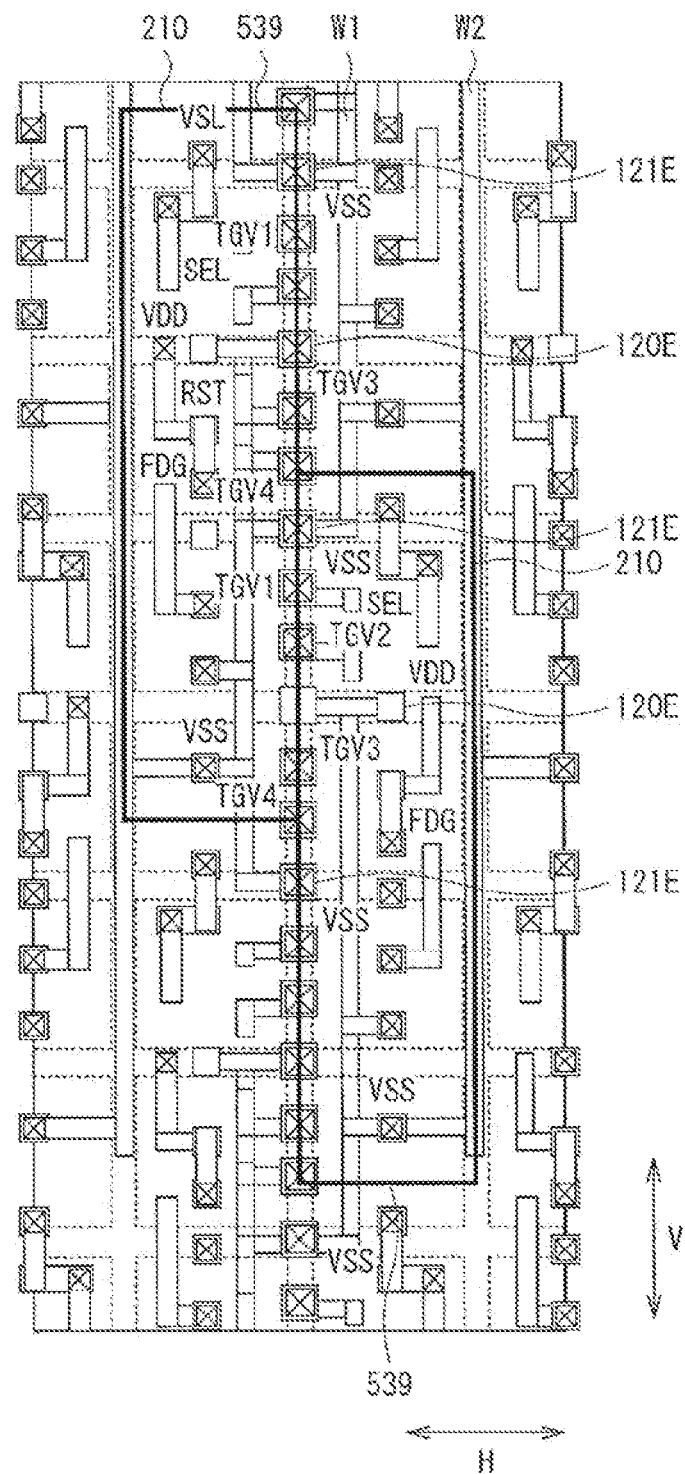
FIG. 26 is a schematic view of an example of a planar configuration of the second wiring layer together with the first wiring layer illustrated in FIG. 25.
Figure 27:
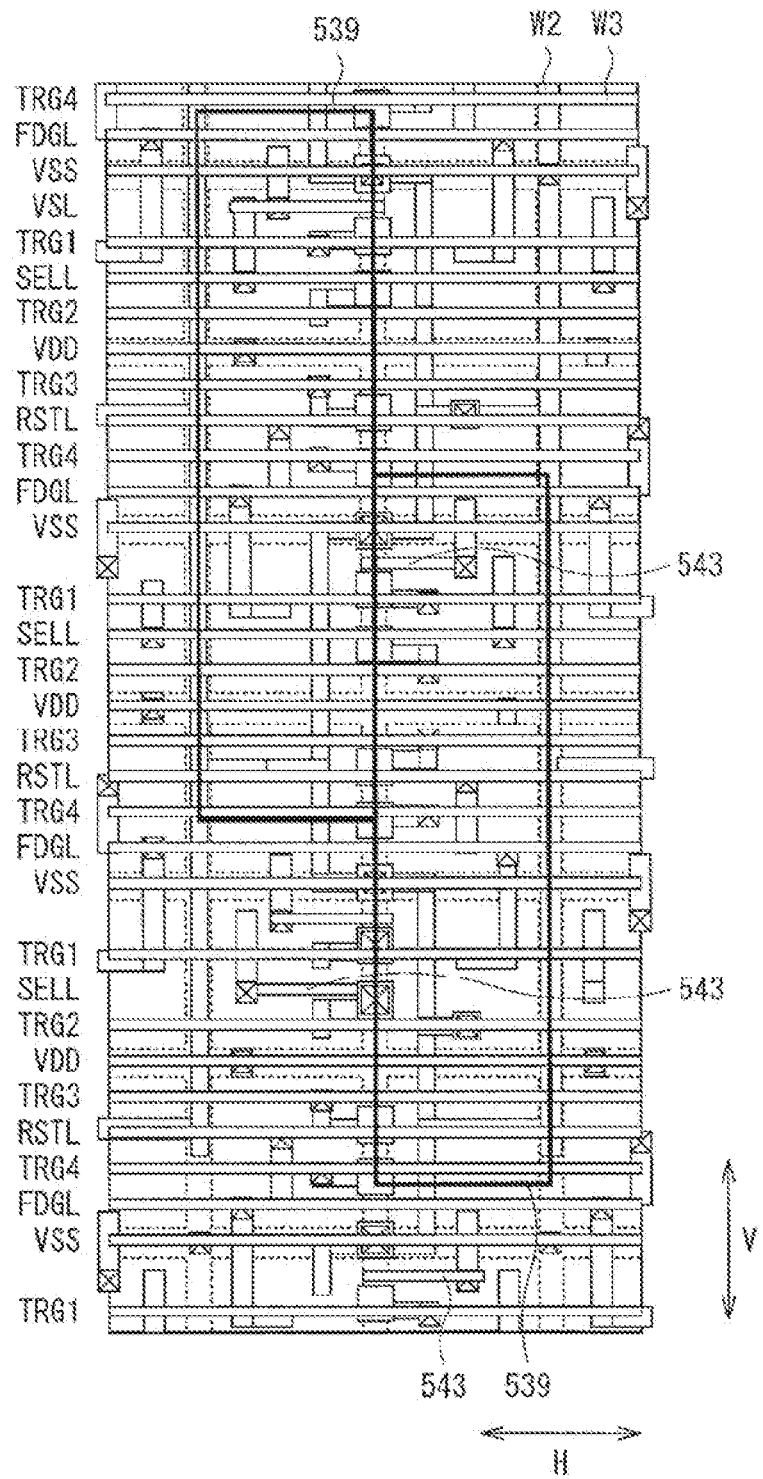
FIG. 27 is a schematic view of an example of a planar configuration of the third wiring layer together with the second wiring layer illustrated in FIG. 26.
Figure 28:
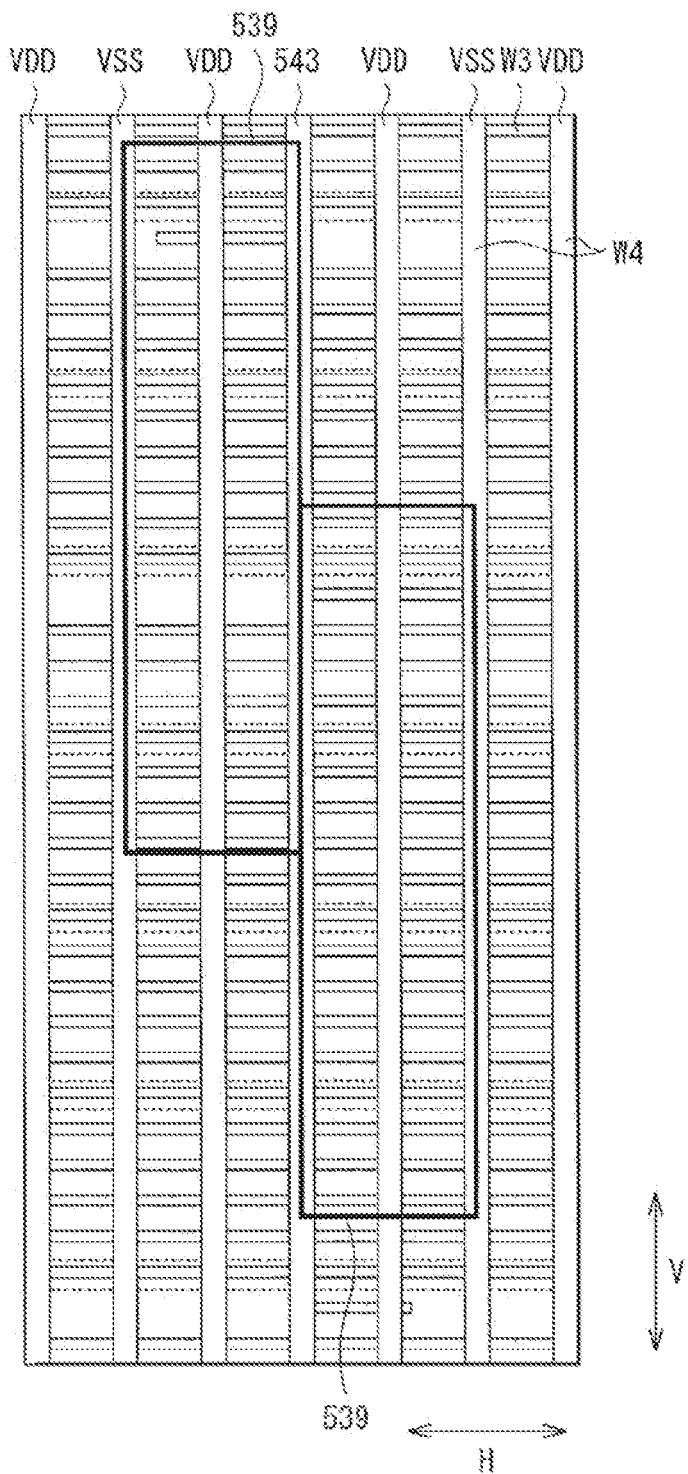
FIG. 28 is a schematic view of an example of a planar configuration of the fourth wiring layer together with the third wiring layer illustrated in FIG. 27.

FIGS. 24 to 28 illustrate a modification example of a planar configuration of the imaging device 1 according to the embodiment described above. FIG. 24 schematically illustrates a planar configuration in proximity to the front surface of the semiconductor layer 200S of the second substrate 200, and corresponds to FIG. 8 described in the above embodiment. FIG. 25 schematically illustrates a configuration of each part of the first wiring layer W1, the semiconductor layer 200S coupled to the first wiring layer W1, and the first substrate 100, and corresponds to FIG. 9 described in the above embodiment. FIG. 26 illustrates an example of a planar configuration of the first wiring layer W1 and the second wiring layer W2, and corresponds to FIG. 10 described in the above embodiment. FIG. 27 illustrates an example of a planar configuration of the second wiring layer W2 and the third wiring layer W3, and corresponds to FIG. 11 described in the above embodiment. FIG. 28 illustrates an example of a planar configuration of the third wiring layer W3 and the fourth wiring layer W4, and corresponds to FIG. 12 described in the above embodiment.

In the present modification example, as illustrated in FIG. 25, in two pixel sharing units 539 arranged side by side in the H direction of the second substrate 200, an internal layout of one (e.g., on right side of a paper surface) pixel sharing unit 539 has a configuration obtained by inverting an internal layout of the other (e.g., on left side of the paper surface) pixel sharing unit 539 only in the H direction. In addition, deviation in the V direction between the contour line of the one pixel sharing unit 539 and the contour line of the other pixel sharing unit 539 is larger than deviation (FIG. 9) described in the above embodiment. In such a manner, increasing the deviation in the V direction makes it possible to decrease a distance between the amplification transistor AMP of the other pixel sharing unit 539 and the pad section 120 coupled to the amplification transistor AMP (the pad section 120 of the other (on lower side of the paper surface) of the two pixel sharing units 539 arranged side by side in the V direction illustrated in FIG. 7B). Such a layout allows the modification example 1 of the imaging device 1 illustrated in FIGS. 24 to 28 to make the areas of the two pixel sharing units 539 arranged side by side in the H direction to each other the same as the areas of the pixel sharing units 539 of the second substrate 200 described in the above embodiment without inverting planar layouts of the two pixel sharing units 539 in the V direction to each other. It is to be noted that the planar layout of the pixel sharing unit 539 of the first substrate 100 is the same as the planar layout (FIGS. 7A and 7B) described in the above embodiment. Thus, the imaging device 1 according to the present modification example is able to achieve effects similar to those in the imaging device 1 described in the above embodiment. The arrangement of the pixel sharing units 539 of the second substrate 200 is not limited to the arrangements described in the above embodiment and the present modification example.

8. Modification Example 7

Figure 29:
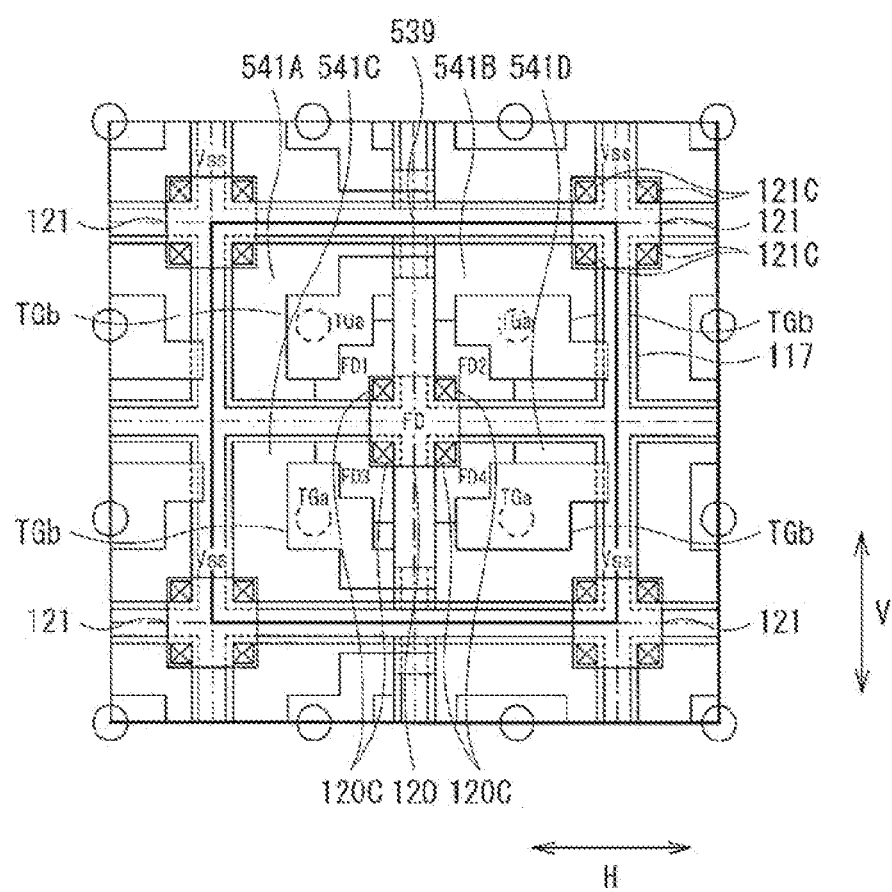
FIG. 29 is a schematic view of a modification example of the planar configuration of the first substrate illustrated in FIG. 7A.
Figure 30:
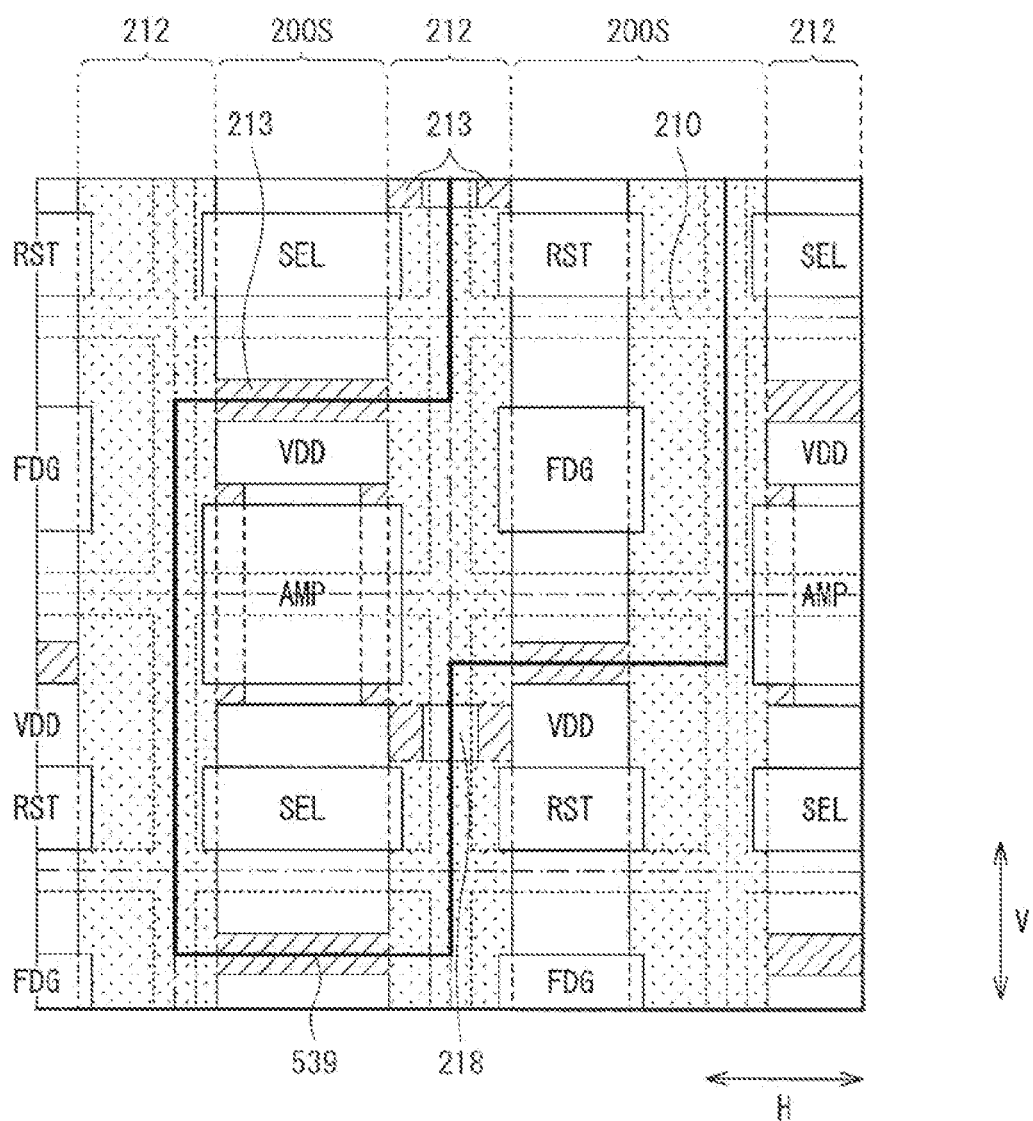
FIG. 30 is a schematic view of an example of a planar configuration of the second substrate (the semiconductor layer) stacked on the first substrate illustrated in FIG. 29.
Figure 31:
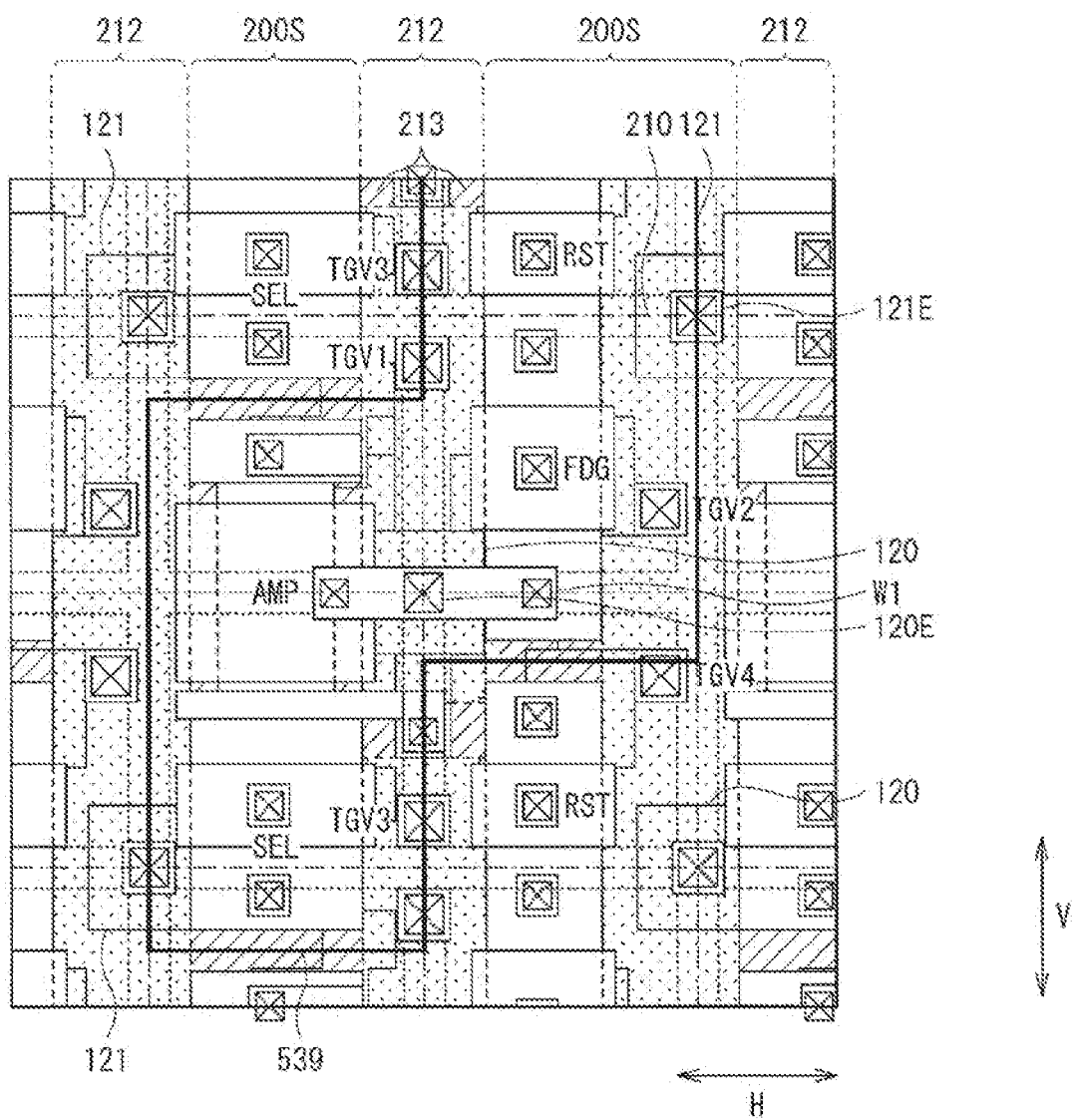
FIG. 31 is a schematic view of an example of a planar configuration of the first wiring layer together with the pixel circuit illustrated in FIG. 30.
Figure 32:
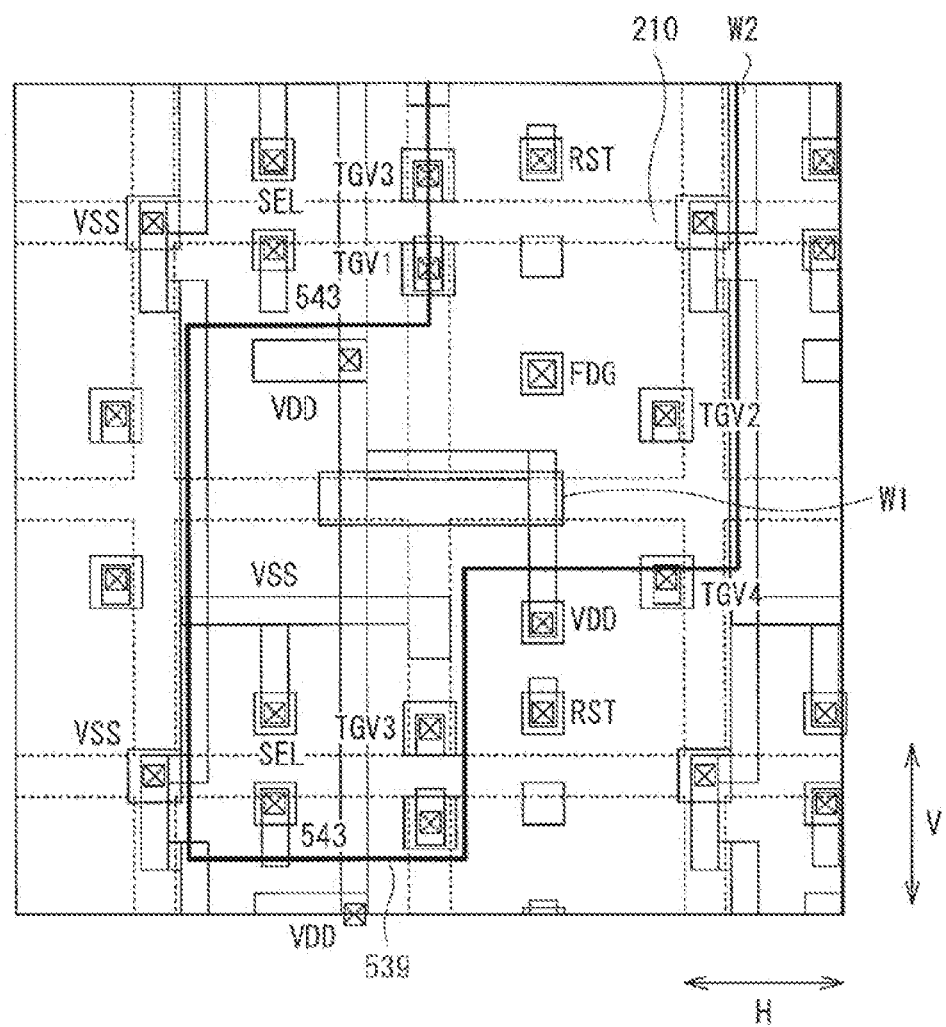
FIG. 32 is a schematic view of an example of a planar configuration of the second wiring layer together with the first wiring layer illustrated in FIG. 31.
Figure 33:
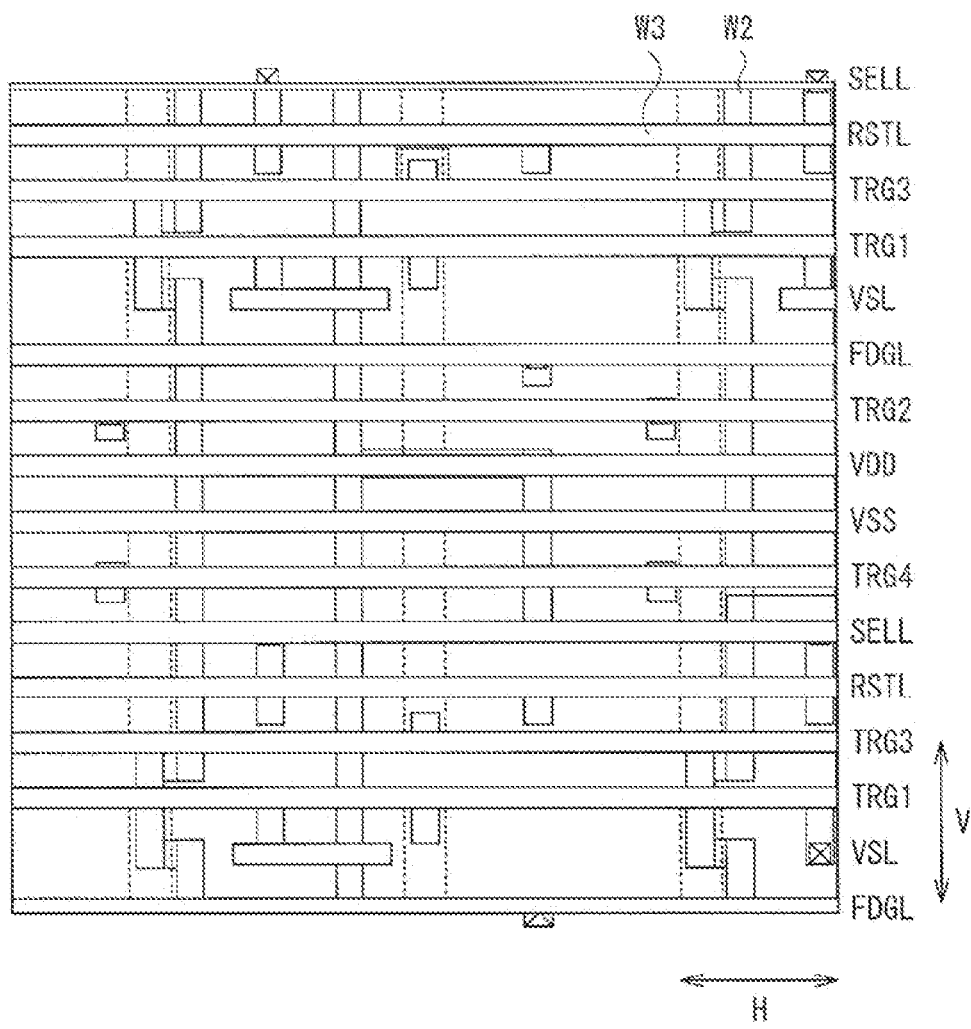
FIG. 33 is a schematic view of an example of a planar configuration of the third wiring layer together with the second wiring layer illustrated in FIG. 32.
Figure 34:
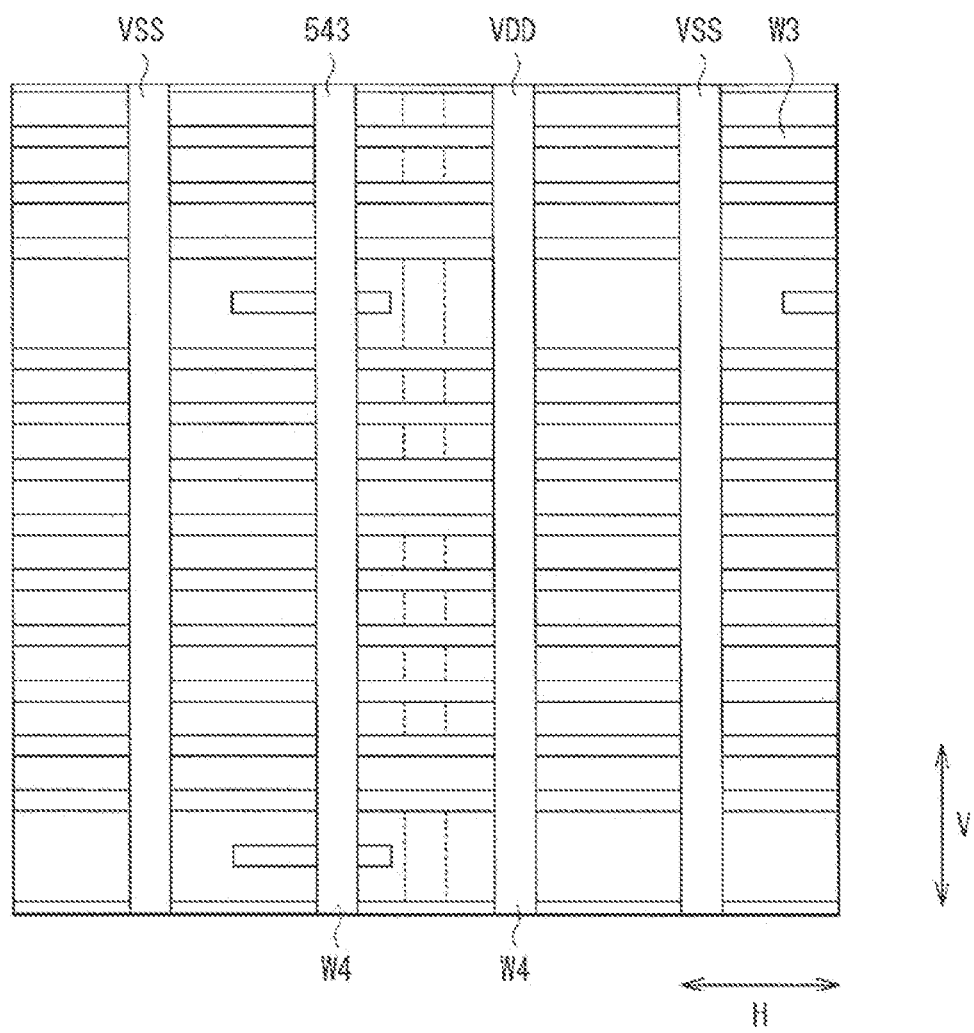
FIG. 34 is a schematic view of an example of a planar configuration of the fourth wiring layer together with the third wiring layer illustrated in FIG. 33.

FIGS. 29 to 34 illustrate a modification example of a planar configuration of the imaging device 1 according to the embodiment described above. FIG. 29 schematically illustrates a planar configuration of the first substrate 100, and corresponds to FIG. 7A described in the above embodiment. FIG. 30 schematically illustrates a planar configuration in proximity to the front surface of the semiconductor layer 200S of the second substrate 200, and corresponds to FIG. 8 described in the above embodiment. FIG. 31 schematically illustrates a configuration of each part of the first wiring layer W1, the semiconductor layer 200S coupled to the first wiring layer W1, and the first substrate 100, and corresponds to FIG. 9 described in the above embodiment. FIG. 32 illustrates an example of a planar configuration of the first wiring layer W1 and the second wiring layer W2, and corresponds to FIG. 10 described in the above embodiment. FIG. 33 illustrates an example of a planar configuration of the second wiring layer W2 and the third wiring layer W3, and corresponds to FIG. 11 described in the above embodiment. FIG. 34 illustrates an example of a planar configuration of the third wiring layer W3 and the fourth wiring layer W4, and corresponds to FIG. 12 described in the above embodiment.

In the present modification example, the contour of each of the pixel circuits 210 has a substantially square planar shape (FIG. 30 and the like). The planar configuration of the imaging device 1 according to the present modification example differs from the planar configuration of the imaging device 1 described in the above embodiment in this point.

For example, the pixel sharing unit 539 of the first substrate 100 is formed over a pixel region of two rows by two columns in a manner similar to that described in the above embodiment and has a substantially square planar shape (FIG. 29). For example, in each of the pixel sharing units 539, the horizontal portions TGb of the transfer gates TG1 and TG3 of the pixel 541A and the pixel 541C in one pixel column extend in directions from positions superimposed on the vertical portions TGa toward a middle portion of the pixel sharing unit 539 in the H direction (more specifically, in directions toward outer edges of the pixels 541A and 541C and a direction toward the middle portion of the pixel sharing unit 539), and the horizontal portions TGb of the transfer gates TG2 and TG4 of the pixels 541B and the pixel 541D in the other pixel column extend in directions from positions superimposed on the vertical portions TGa toward outside of the pixel sharing unit 539 in the H direction (more specifically, in directions toward outer edges of the pixels 541B and 541D and a direction toward outside of the pixel sharing unit 539). The pad section 120 coupled to the floating diffusions FD is provided in the middle portion of the pixel sharing unit 539 (a middle portion in the H direction and the V direction of the pixel sharing unit 539), and the pad section 121 coupled to the VSS contact regions 118 is provided at an end of the pixel sharing unit 539 at least in the H direction (in the H direction and the V direction in FIG. 29).

As another arrangement example, it is conceivable that the horizontal portions TGb of the transfer gates TG1, TG2, TG3, and TG4 are provided only in regions opposed to the vertical portions TGa. On this occasion, in a manner similar to that described in the above embodiment, the semiconductor layer 200S is easily divided finely. Accordingly, it is difficult to form large transistors of the pixel circuit 210. In contrast, in a case where the horizontal portions TGb of the transfer gates TG1, TG2, TG3, and TG4 extend from the positions superimposed on the vertical portions TGa in the H direction as with the modification example described above, it is possible to increase the width of the semiconductor layer 200S in a manner similar to that described in the above embodiment. Specifically, it is possible to dispose the positions in the H direction of the through electrodes TGV1 and TGV3 coupled to the transfer gates TG1 and TG3 in proximity to the position in the H direction of the through electrode 120E, and dispose the positions in the H direction of the through electrodes TGV2 and TGV4 coupled to the transfer gates TG2 and TG4 in proximity to the position in the H direction of the through electrode 121E (FIG. 31). This makes it possible to increase the width (a size in the H direction) of the semiconductor layer 200S extending in the V direction in a manner similar to that described in the above embodiment. Accordingly, it is possible to increase the sizes of the transistors of the pixel circuit 210, specifically the size of the amplification transistor AMP. This consequently makes it possible to improve the signal-to-noise ratio of the pixel signal, thereby allowing the imaging device 1 to output more favorable pixel data (image information).

The pixel sharing unit 539 of the second substrate 200 has, for example, substantially the same sizes as the sizes in the H direction and the V direction of the pixel sharing unit 539 of the first substrate 100, and is provided over a region substantially corresponding to a pixel region of two rows by two columns. For example, in each of the pixel circuits 210, the selection transistor SEL and the amplification transistor AMP are disposed side by side in the V direction in one semiconductor layer 200S extending in the V direction, and the FD conversion gain switching transistor FDG and the reset transistor RST are disposed side by side in the V direction in one semiconductor layer 200S extending in the V direction. The one semiconductor layer 200S provided with the selection transistor SEL and the amplification transistor AMP and the one semiconductor layer 200S provided with the FD conversion gain switching transistor FDG and the reset transistor RST are arranged side by side in the H direction with the insulating region 212 interposed therebetween. The insulating region 212 extends in the V direction (FIG. 30).

Herein, the contour of the pixel sharing unit 539 of the second substrate 200 is described with reference to FIGS. 30 and 31. For example, the pixel sharing unit 539 of the first substrate 100 illustrated in FIG. 29 is coupled to the amplification transistor AMP and the selection transistor SEL provided to one (on left side of a paper surface in FIG. 31) in the H direction of the pad sections 120, and the FD conversion gain switching transistor FDG and the reset transistor RST provided to another one (on right side of the paper surface in FIG. 31) in the H direction of the pad sections 120. The contour of the pixel sharing unit 539 of the second substrate 200 including the amplification transistor AMP, the selection transistor SEL, the FD conversion gain switching transistor FDG, and the reset transistor RST is determined by the following four outer edges.

A first outer edge is an outer edge of one end (an end on upper side of the paper surface in FIG. 31) in the V direction of the semiconductor layer 200S including the selection transistor SEL and the amplification transistor AMP. The first outer edge is provided between the amplification transistor AMP included in that pixel sharing unit 539 and the selection transistor SEL included in the pixel sharing unit 539 adjacent to one side (on upper side of the paper surface in FIG. 31) in the V direction of that pixel sharing unit 539. More specifically, the first outer edge is provided in a middle portion in the V direction of the element separation region 213 between the amplification transistor AMP and the selection transistor SEL. A second outer edge is an outer edge of another end (an end on lower side of the paper surface in FIG. 31) in the V direction of the semiconductor layer 200S including the selection transistor SEL and the amplification transistor AMP. The second outer edge is provided between the selection transistor SEL included in that pixel sharing unit 539 and the amplification transistor AMP included in the pixel sharing unit 539 adjacent to another side (on lower side of the paper surface in FIG. 31) in the V direction of that pixel sharing unit 539. More specifically, the second outer edge is provided in a middle portion in the V direction of the element separation region 213 between the selection transistor SEL and the amplification transistor AMP. A third outer edge is an outer edge of another end (an end on lower side of the paper surface in FIG. 31) in the V direction of the semiconductor layer 200S including the reset transistor RST and the FD conversion gain switching transistor FDG. The third outer edge is provided between the FD conversion gain switching transistor FDG included in that pixel sharing unit 539 and the reset transistor RST included in the pixel sharing unit 539 adjacent to another side (on lower side of the paper surface in FIG. 31) in the V direction of that pixel sharing unit 539. More specifically, the third outer edge is provided in a middle portion in the V direction of the element separation region 213 between the FD conversion gain switching transistor FDG and the reset transistor RST. A fourth outer edge is an outer edge of one end (an end on upper side of the paper surface in FIG. 31) in the V direction of the semiconductor layer 200S including the reset transistor RST and the FD conversion gain switching transistor FDG. The fourth outer edge is provided between the reset transistor RST included in that pixel sharing unit 539 and the FD conversion gain switching transistor FDG (not illustrated) included in the pixel sharing unit 539 adjacent to one side (on upper side of the paper surface in FIG. 31) in the V direction of that pixel sharing unit 539. More specifically, the fourth outer edge is provided in a middle portion in the V direction of the element separation region 213 (not illustrated) between the reset transistor RST and the FD conversion gain switching transistor FDG.

In the contour of the pixel sharing unit 539 of the second substrate 200 including such first, second, third, and fourth outer edges, the third and fourth outer edges are disposed to be deviated on one side in the V direction from the first and second outer edges (in other words, to be offset on one side in the V direction). Using such a layout makes it possible to dispose both the gate of the amplification transistor AMP and the source of the FD conversion gain switching transistor FDG as close as possible to the pad section 120. This makes it easier to decrease the area of a wiring line that couples them to each other and miniaturize the imaging device 1. It is to be noted that the VSS contact region 218 is provided between the semiconductor layer 200S including the selection transistor SEL and the amplification transistor AMP and the semiconductor layer 200S including the reset transistor RST and the FD conversion gain switching transistor FDG. For example, a plurality of pixel circuits 210 has the same arrangement as each other.

The imaging device 1 including such a second substrate 200 also achieves effects similar to those described in the above embodiment. The arrangement of the pixel sharing unit 539 of the second substrate 200 is not limited to the arrangements described in the above embodiment and the present modification example.

9. Modification Example 8

Figure 35:
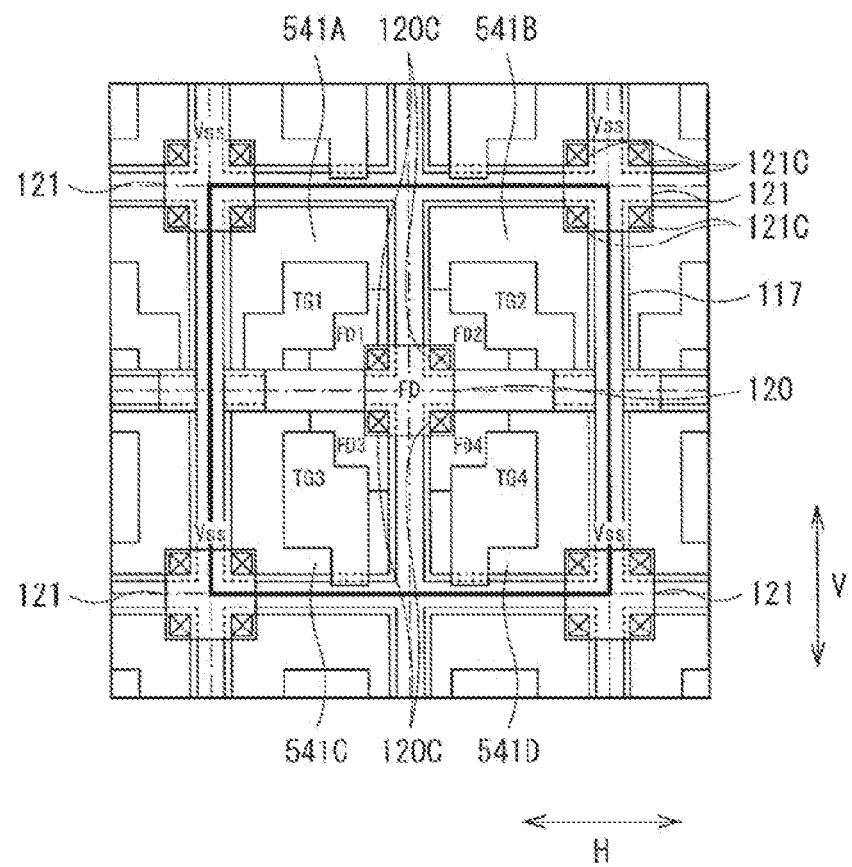
FIG. 35 is a schematic view of another example of the planar configuration of the first substrate illustrated in FIG. 29.
Figure 36:
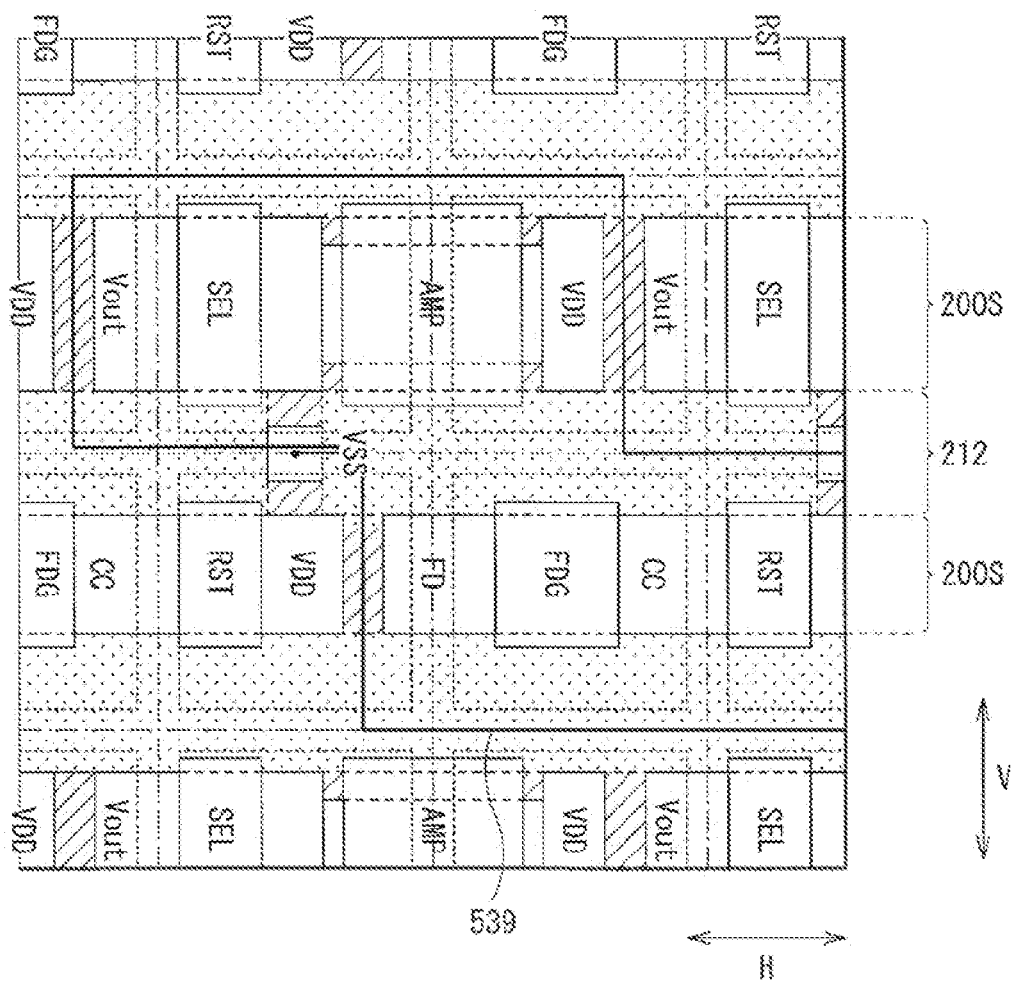
FIG. 36 is a schematic view of an example of a planar configuration of the second substrate (the semiconductor layer) stacked on the first substrate illustrated in FIG. 35.
Figure 37:
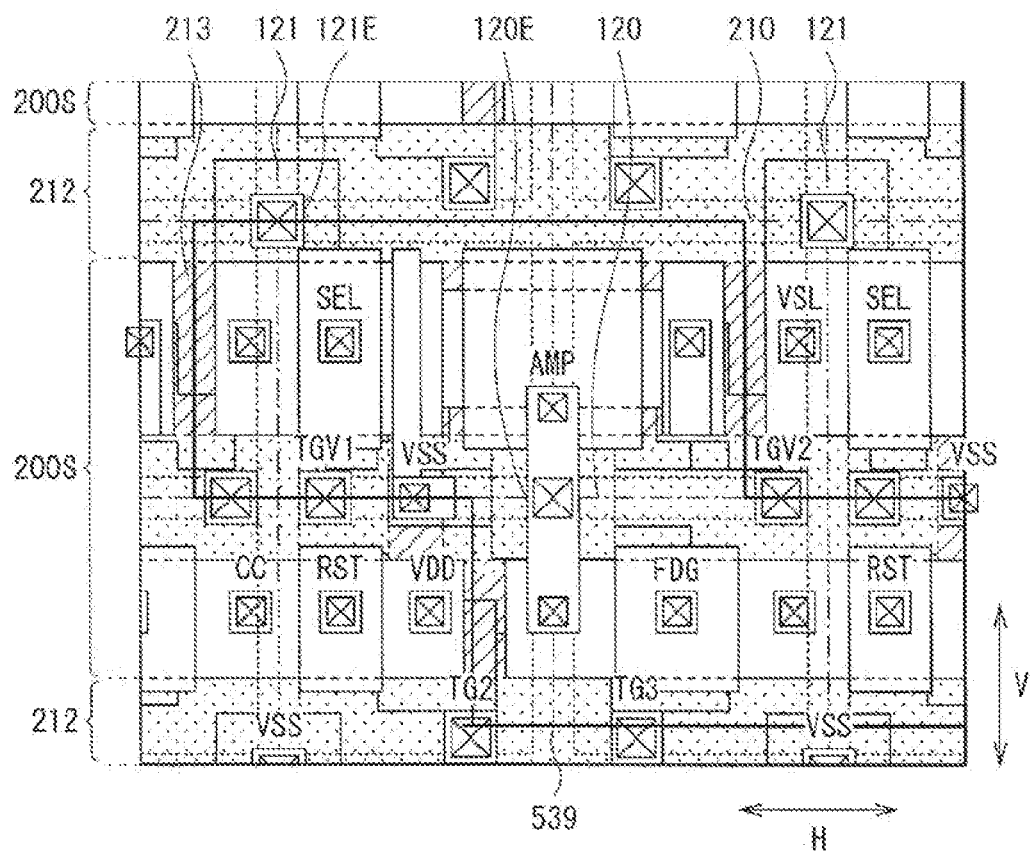
FIG. 37 is a schematic view of an example of a planar configuration of the first wiring layer together with the pixel circuit illustrated in FIG. 36.
Figure 38:
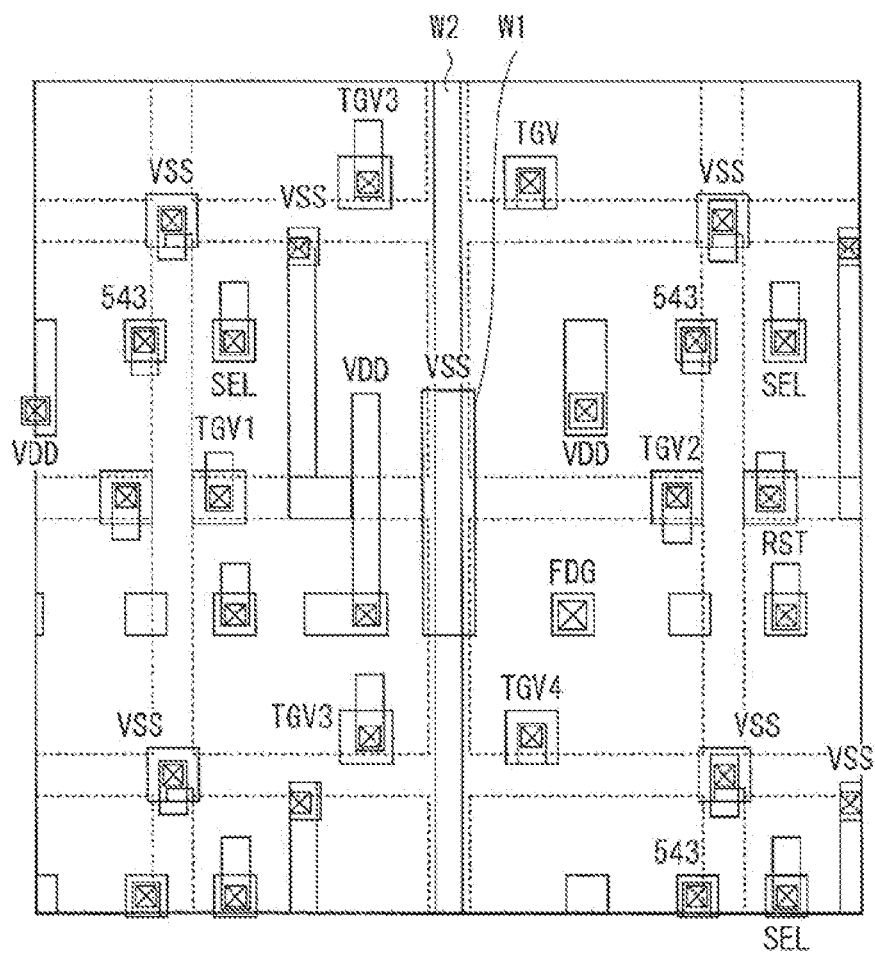
FIG. 38 is a schematic view of an example of a planar configuration of the second wiring layer together with the first wiring layer illustrated in FIG. 37.
Figure 39:
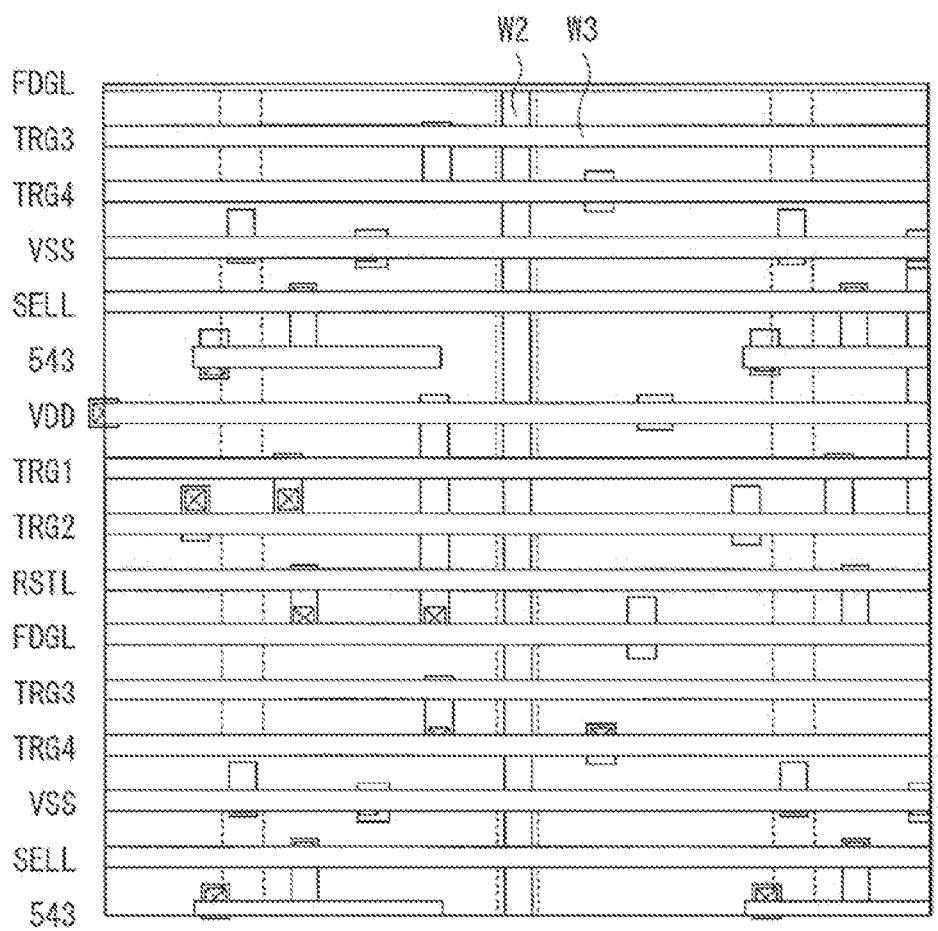
FIG. 39 is a schematic view of an example of a planar configuration of the third wiring layer together with the second wiring layer illustrated in FIG. 38.
Figure 40:
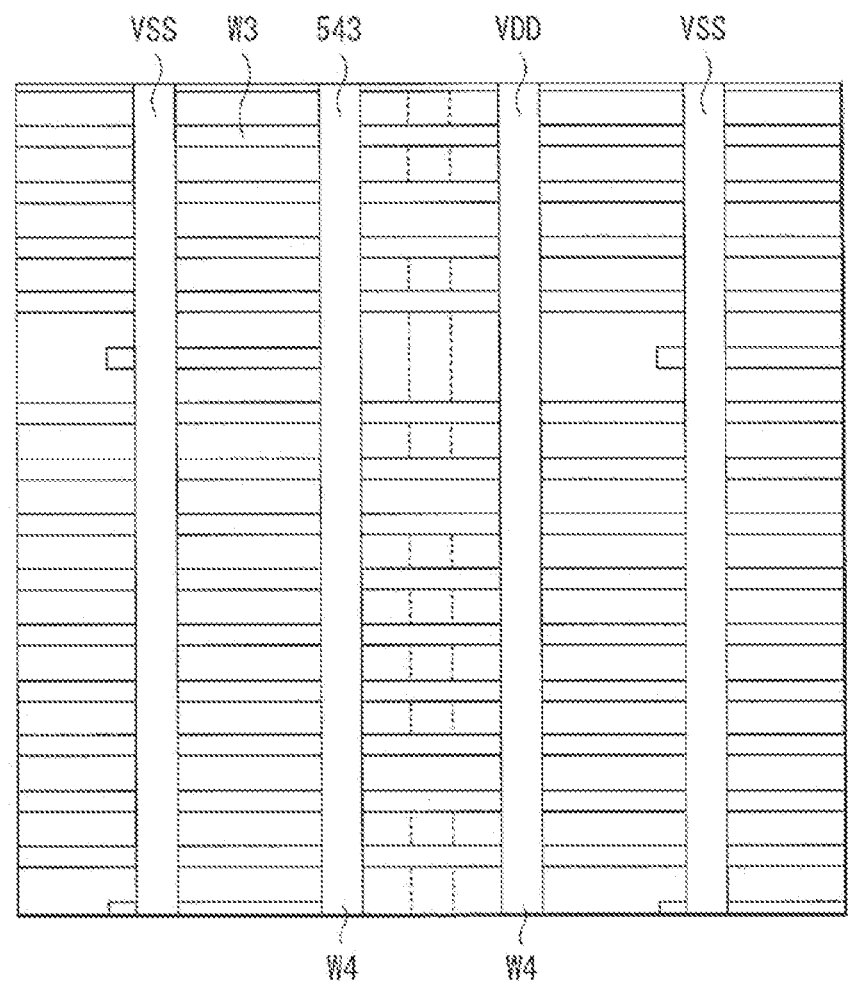
FIG. 40 is a schematic view of an example of a planar configuration of the fourth wiring layer together with the third wiring layer illustrated in FIG. 39.

FIGS. 35 to 40 illustrate a modification example of a planar configuration of the imaging device 1 according to the embodiment described above. FIG. 35 schematically illustrates a planar configuration of the first substrate 100, and corresponds to FIG. 7B described in the above embodiment. FIG. 36 schematically illustrates a planar configuration in proximity to the front surface of the semiconductor layer 200S of the second substrate 200, and corresponds to FIG. 8 described in the above embodiment. FIG. 37 schematically illustrates a configuration of each part of the first wiring layer W1, the semiconductor layer 200S coupled to the first wiring layer W1, and the first substrate 100, and corresponds to FIG. 9 described in the above embodiment. FIG. 38 illustrates an example of a planar configuration of the first wiring layer W1 and the second wiring layer W2, and corresponds to FIG. 10 described in the above embodiment. FIG. 39 illustrates an example of a planar configuration of the second wiring layer W2 and the third wiring layer W3, and corresponds to FIG. 11 described in the above embodiment. FIG. 40 illustrates an example of a planar configuration of the third wiring layer W3 and the fourth wiring layer W4, and corresponds to FIG. 12 described in the above embodiment.

In the present modification example, the semiconductor layer 200S of the second substrate 200 extends in the H direction (FIG. 37). That is, the present modification example substantially corresponds to a configuration obtained by rotating, by 90 degrees, the planar configuration of the imaging device 1 illustrated in FIG. 30 described above and the like.

For example, the pixel sharing unit 539 of the first substrate 100 is formed over a pixel region of two rows by two columns in a manner similar to that described in the above embodiment and has a substantially square planar shape (FIG. 35). For example, in each of the pixel sharing units 539, the transfer gates TG1 and TG2 of the pixel 541A and the pixel 541B in one pixel row extend in the V direction toward the middle portion of the pixel sharing unit 539, and the transfer gates TG3 and TG4 of the pixel 541C and the pixel 541D in the other pixel row extend in the V direction toward outside of the pixel sharing unit 539. The pad section 120 coupled to the floating diffusions FD is provided in the middle portion of the pixel sharing unit 539, and the pad section 121 coupled to the VSS contact regions 118 is provided at an end of the pixel sharing unit 539 at least in the V direction (in the H direction and the V direction in FIG. 35). On this occasion, the positions in the V direction of the through electrodes TGV1 and TGV2 of the transfer gates TG1 and TG2 are close to the position in the V direction of the through electrode 120E, and the positions in the V direction of the transfer gates TG3 and TG4 of the through electrodes TGV3 and TGV4 are close to the position in the V direction of the through electrode 121E (FIG. 37). Accordingly, it is possible to increase the width (the size in the V direction) of the semiconductor layer 200S extending in the H direction because of a reason similar to that described in the above embodiment. This makes it possible to increase the size of the amplification transistor AMP and suppress noise.

In each of the pixel circuits 210, the selection transistor SEL and the amplification transistor AMP are disposed side by side in the H direction, and the reset transistor RST is disposed at a position adjacent in the V direction to the selection transistor SEL with the insulating region 212 interposed therebetween (FIG. 36). The FD conversion gain switching transistor FDG is disposed side by side in the H direction with the reset transistor RST. The VSS contact region 218 is provided in an island shape in the insulating region 212. For example, the third wiring layer W3 extends in the H direction (FIG. 39), and the fourth wiring layer W4 extends in the V direction (FIG. 40).

The imaging device 1 including such a second substrate 200 also achieves effects similar to those described in the above embodiment. The arrangement of the pixel sharing unit 539 of the second substrate 200 is not limited to the arrangements described in the above embodiment and the present modification example. The semiconductor layer 200S described in the above embodiment and the modification example 6 may extend in the H direction, for example.

10. Modification Example 9

Figure 41:
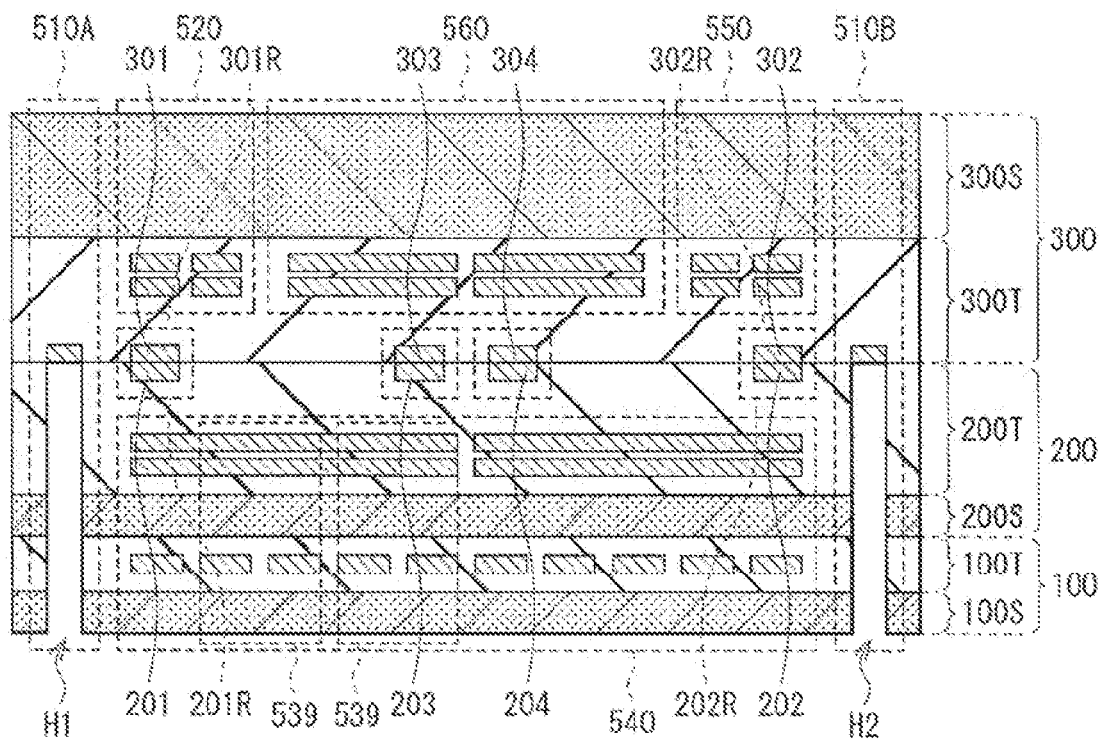
FIG. 41 is a schematic cross-sectional view of another example of the imaging device illustrated in FIG. 3.

FIG. 41 schematically illustrates a modification example of a cross-sectional configuration of the imaging deice 1 according to the embodiment described above. FIG. 41 corresponds to FIG. 3 described in the above embodiment. In the present modification example, the imaging device 1 includes contact sections 203, 204, 303, and 304 at positions opposed to the middle portion of the pixel array section 540 in addition to the contact sections 201, 202, 301, and 302. The imaging device 1 according to the present modification example differs from the imaging device 1 described in the above embodiment in this point.

The contact sections 203 and 204 are provided in the second substrate 200, and are exposed to a bonding surface with the third substrate 300. The contact sections 303 and 304 are provided in the third substrate 300, and are exposed to a bonding surface with the second substrate 200. The contact section 203 is in contact with the contact section 303, and the contact section 204 is in contact with the contact section 304. That is, in the imaging device 1, the second substrate 200 and the third substrate 300 are coupled to each other by the contact sections 203, 204, 303, and 304 in addition to the contact sections 201, 202, 301, and 302.

Figure 42:
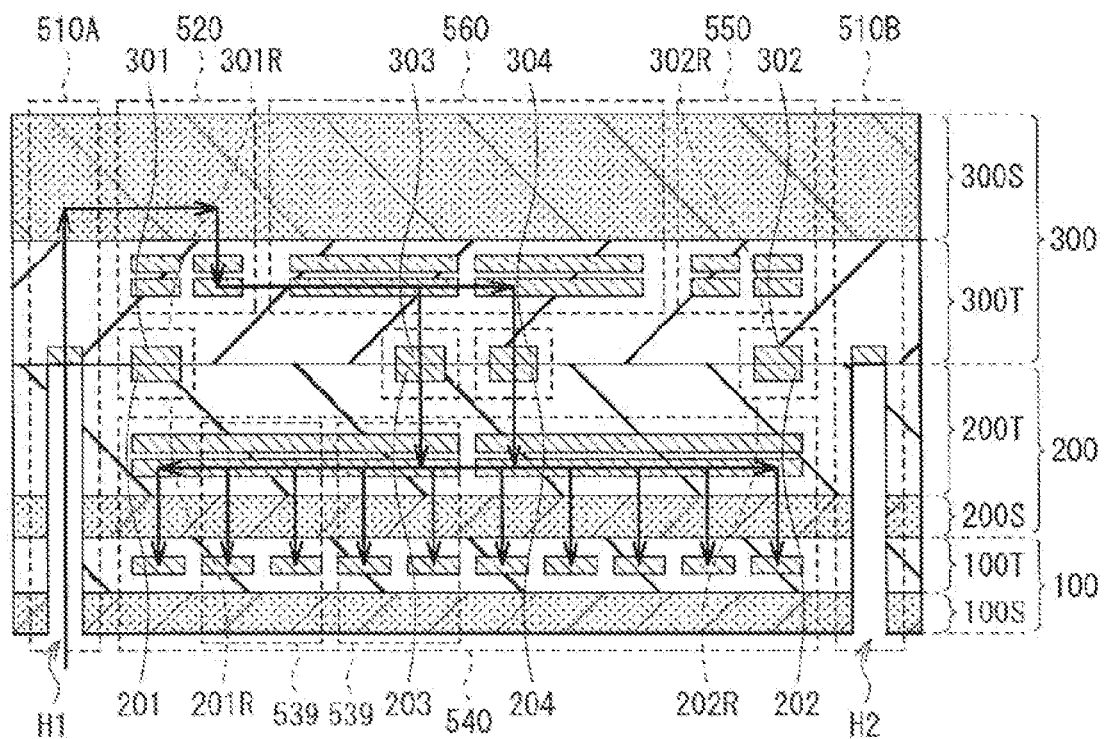
FIG. 42 is a schematic view for describing a path of an input signal to the imaging device illustrated in FIG. 41.
Figure 43:
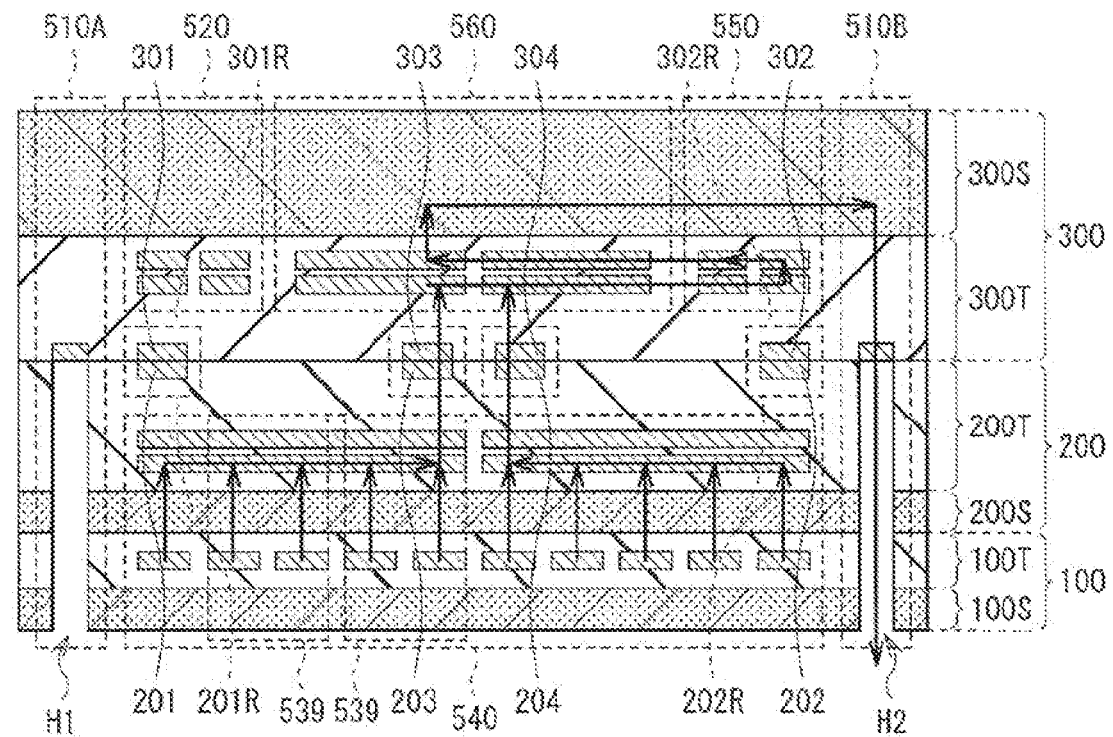
FIG. 43 is a schematic view for describing a signal path of a pixel signal of the imaging device illustrated in FIG. 41.

Next, an operation of the imaging device 1 is described with use of FIGS. 42 and 43. FIG. 42 illustrates paths, indicated by arrows, of an input signal to be inputted from outside to the imaging device 1, a power source potential and a reference potential. FIG. 43 illustrates a signal path, indicated by arrows, of a pixel signal to be outputted from the imaging device 1 to outside. For example, the input signal inputted to the imaging device 1 through the input section 510A is transmitted to the row driving section 520 of the third substrate 300, and row drive signals are generated in the row driving section 520. The row drive signals are transmitted to the second substrate 200 through the contact sections 303 and 203. Furthermore, the row drive signals reach each of the pixel sharing units 539 of the pixel array section 540 through the row drive signal lines 542 in the wiring layer 200T. A drive signal other than a drive signal of the transfer gate TG among the row drive signals having reached the pixel sharing unit 539 of the second substrate 200 is inputted to the pixel circuit 210 to drive each of the transistors included in the pixel circuit 210. The drive signal of the transfer gate TG is inputted to the transfer gates TG1, TG2, TG3, and TG4 of the first substrate 100 through the through electrodes TGV to drive the pixels 541A, 541B, 541C, and 541D. In addition, the power source potential and the reference potential supplied from outside of the imaging device 1 to the input section 510A (the input terminal 511) of the third substrate 300 are transmitted to the second substrate 200 through the contact sections 303 and 203 to be supplied to the pixel circuit 210 of each of the pixel sharing units 539 through a wiring line in the wiring layer 200T. The reference potential is also supplied to the pixels 541A, 541B, 541C, and 541D of the first substrate 100 through the through electrodes 121E. Meanwhile, the pixel signals photoelectrically converted in the pixels 541A, 541B, 541C, and 541D of the first substrate 100 are transmitted to the pixel circuit 210 of the second substrate 200 for each pixel sharing unit 539. A pixel signal based on the pixel signal is transmitted from the pixel circuit 210 to the third substrate 300 through the vertical signal line 543 and the contact sections 204 and 304. The pixel signal is processed in the column signal processor 550 and the image signal processor 560 of the third substrate 300, and then outputted to outside through the output section 510B.

The imaging device 1 including such contact sections 203, 204, 303, and 304 also achieves effects similar to those described in the above embodiment. It is possible to change the positions, the number and the like of contact sections, which are coupling targets of wiring lines through the contact sections 303 and 304, depending on design of a circuit and the like of the third substrate 300.

11. Modification Example 10

Figure 44:
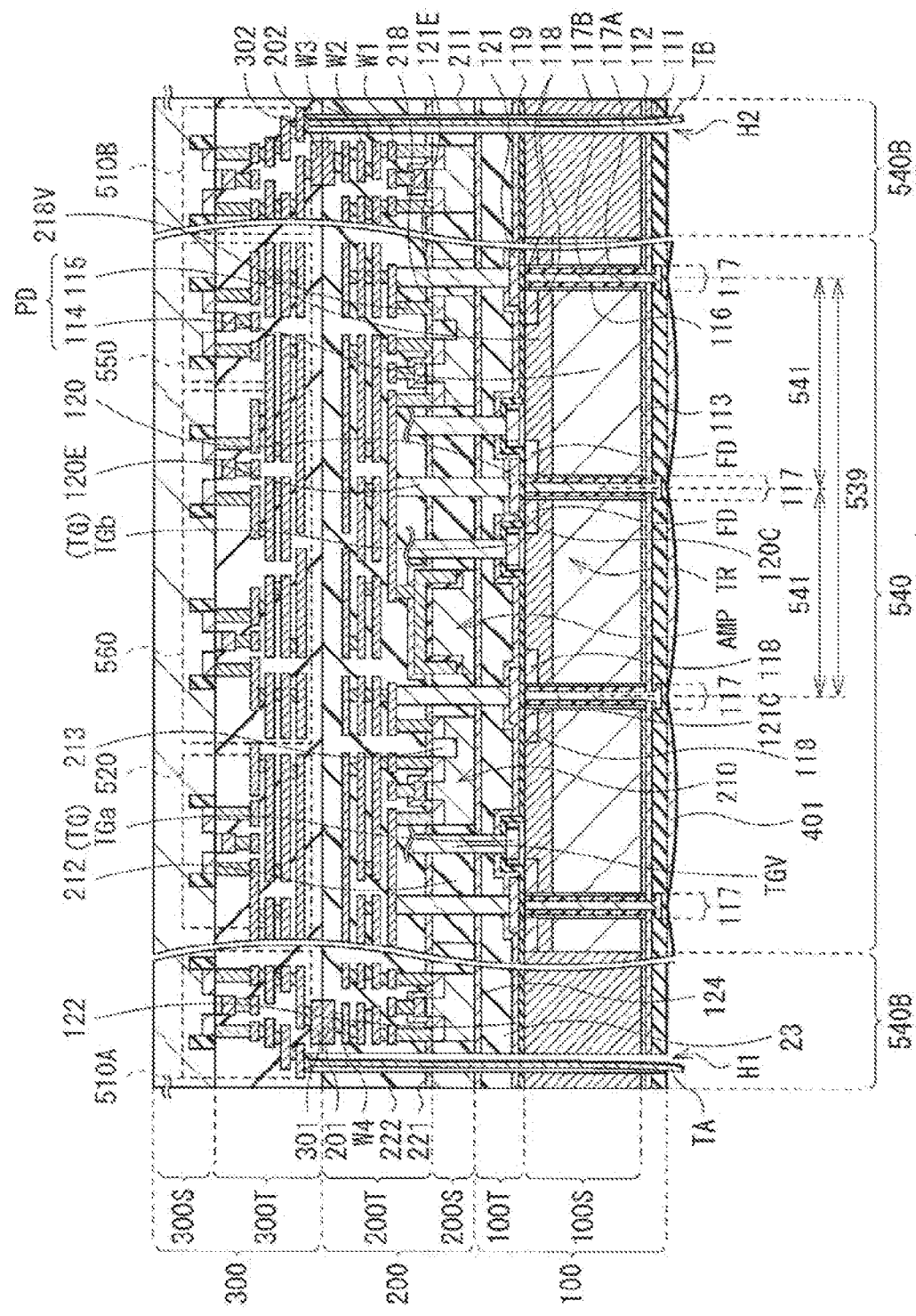
FIG. 44 is a schematic cross-sectional view of another example of the imaging device illustrated in FIG. 6.

FIG. 44 illustrates a modification example of a cross-sectional configuration of the imaging device 1 according to the embodiment described above. FIG. 44 corresponds to FIG. 6 described in the above embodiment. In the present modification example, the transfer transistor TR having a planar structure is provided in the first substrate 100. The imaging device 1 according to the present modification example differs from the imaging device 1 described in the above embodiment in this point.

The transfer transistor TR includes the transfer gate TG including only the horizontal portion TGb. In other words, the transfer gate TG does not include the vertical portion TGa, and is provided opposed to the semiconductor layer 100S.

The imaging device 1 including the transfer transistor TR having such a planar structure also achieves effects similar to those described in the above embodiment. Furthermore, it is conceivable that the planar transfer gate TG is provided in the first substrate 100 to form the photodiode PD closer to the front surface of the semiconductor layer 100S as compared with a case where the vertical transfer gate TG is provided in the first substrate 100, thereby increasing a saturation signal amount (Qs). In addition, it is conceivable that a method of forming the planar transfer gate TG in the first substrate 100 has a smaller number of manufacturing processes as compared with a method of forming the vertical transfer gate TG in the first substrate 100, which hinders an adverse influence on the photodiode PD due to the manufacturing processes.

12. Modification Example 11

Figure 45:
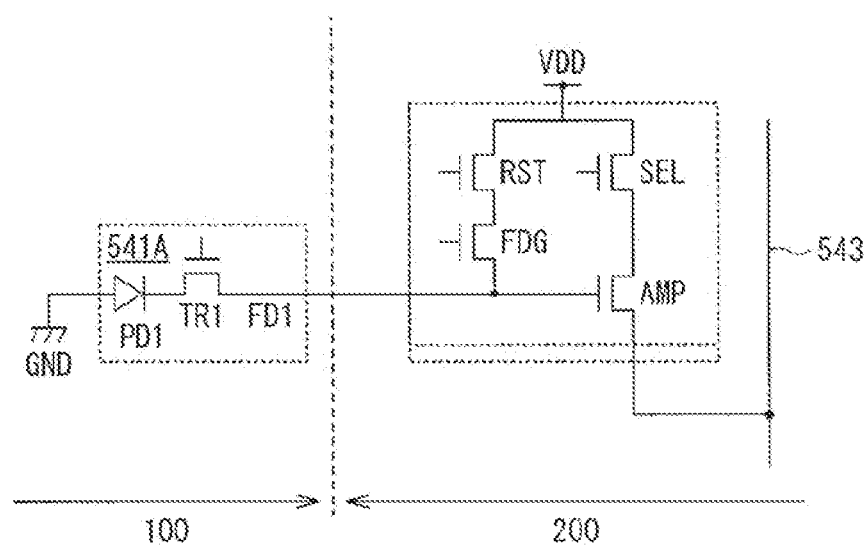
FIG. 45 is a diagram illustrating another example of an equivalent circuit illustrated in FIG. 4.

FIG. 45 illustrates a modification example of the pixel circuit of the imaging device according to the embodiment described above. FIG. 45 corresponds to FIG. 4 described in the above embodiment. In the present modification example, the pixel circuit 210 is provided for each pixel (pixel 541A). That is, the pixel circuit 210 is not shared by a plurality of pixels. The imaging device 1 according to the present modification example differs from the imaging device 1 described in the above embodiment in this point.

The imaging device 1 according to the present modification example is the same as the imaging device 1 described in the above embodiment in that the pixels 541A and the pixel circuits 210 are provided in mutually different substrates (the first substrate 100 and the second substrate 200). Accordingly, the imaging device 1 according to the present modification example is also able to achieve effects similar to those described in the above embodiment.

13. Modification Example 12

Figure 46:
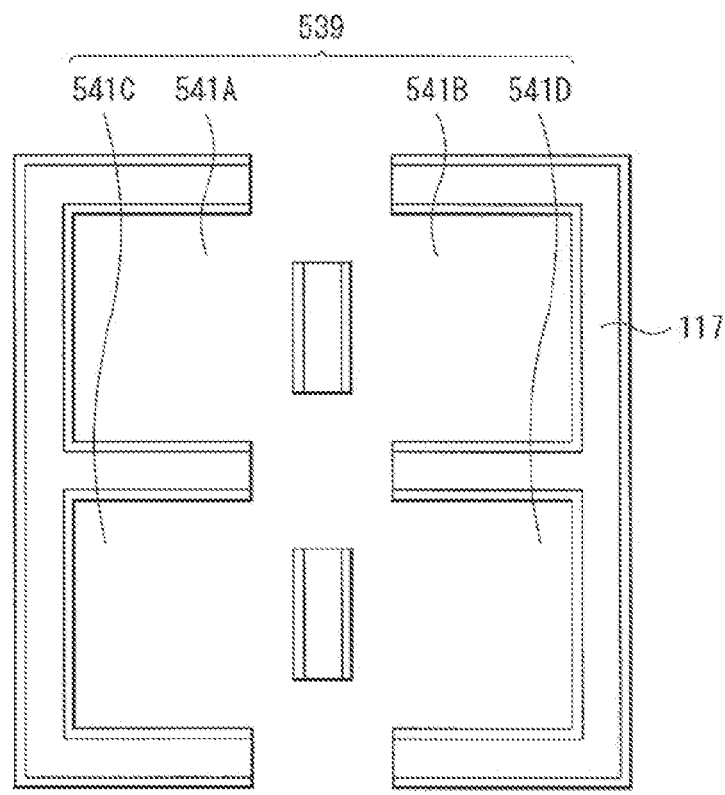
Figure 47:
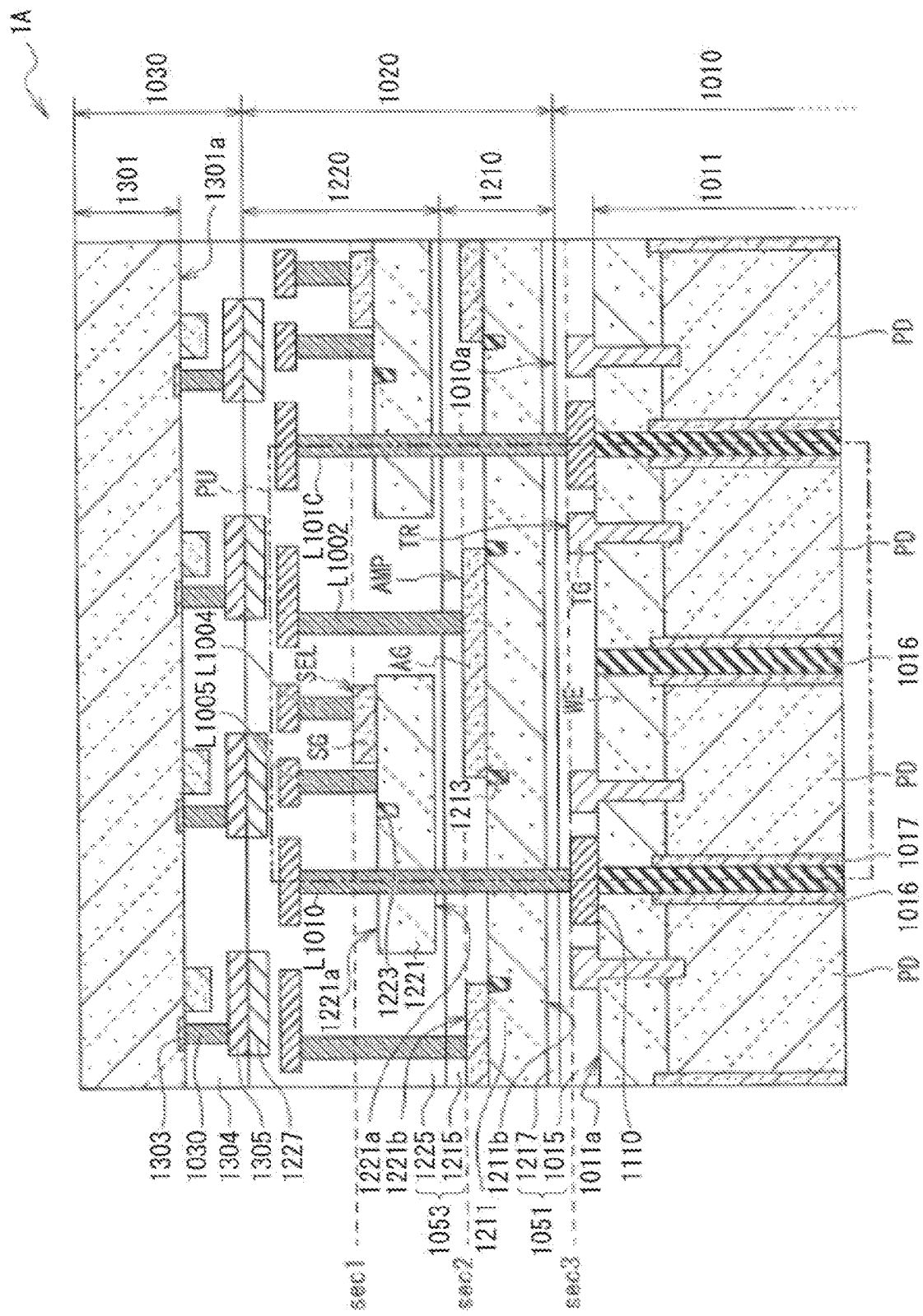
FIG. 47 is a cross-sectional view in a thickness direction of a configuration example of an imaging device according to a modification example 13 of the present disclosure.
Figure 48:
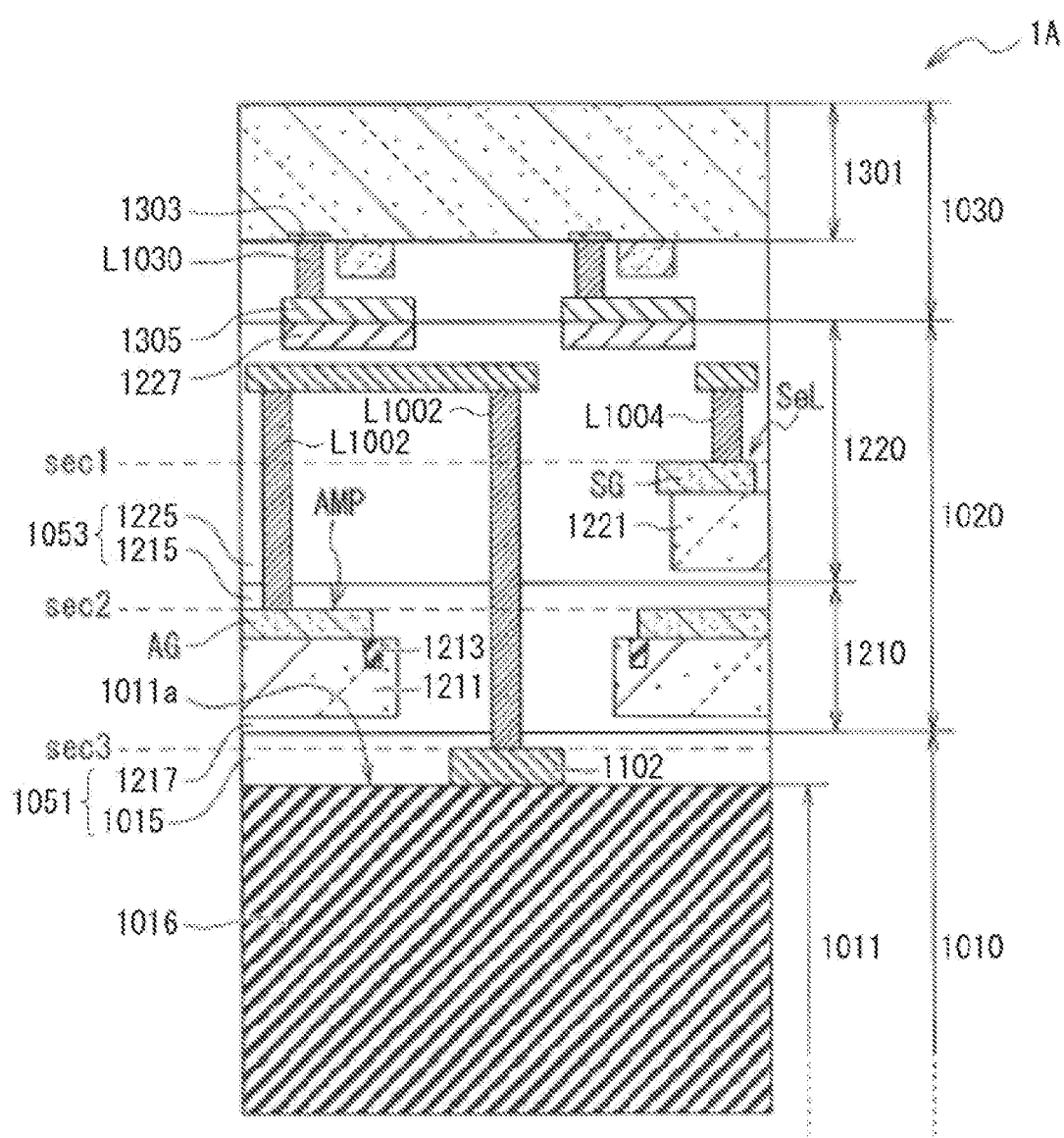
FIG. 48 is a cross-sectional view in the thickness direction of a configuration example of the imaging device according to the modification example 13 of the present disclosure.
Figure 49:
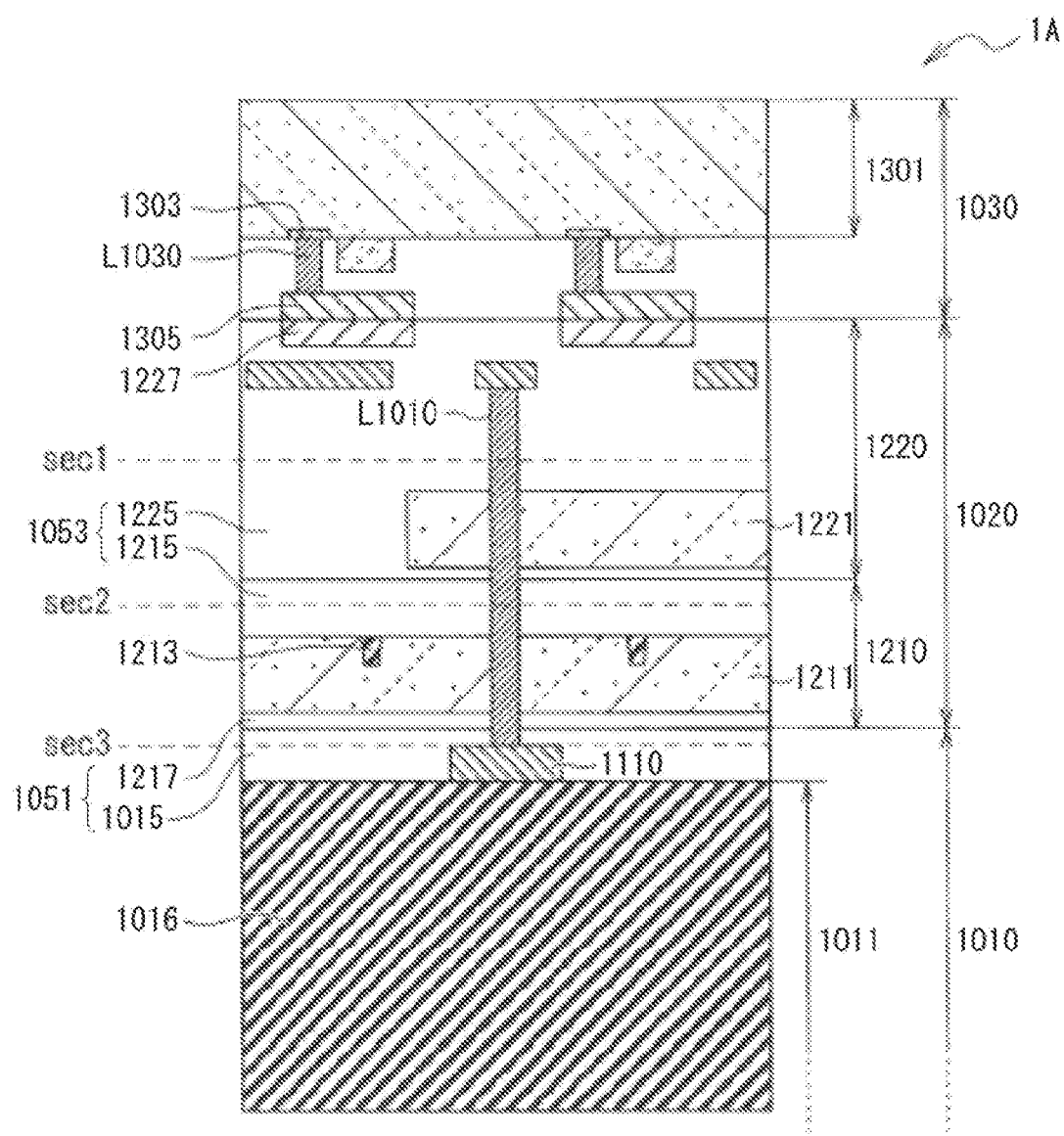
FIG. 49 is a cross-sectional view in the thickness direction of a configuration example of the imaging device according to the modification example 13 of the present disclosure.

FIG. 46 illustrates a modification example of a planar configuration of the pixel separation section 117 described in the above embodiment. A clearance may be provided in the pixel separation section 117 that surrounds each of the pixels 541A, 541B, 541C, and 541D. That is, the entire periphery of each of the pixels 541A, 541B, 541C, and 541D may not be surrounded by the pixel separation section 117. For example, clearances of the pixel separation section 117 are provided in proximity to the pad sections 120 and 121 (see FIG. 7B).

In the embodiment described above, description has been given of an example in which the pixel separation section 117 has the FTI structure that penetrates through the semiconductor layer 100S (see FIG. 6); however, the pixel separation section 117 may have a structure other than the FTI structure. For example, the pixel separation section 117 may not be provided to completely penetrate through the semiconductor layer 100S, and may have a so-called DTI (Deep Trench Isolation) structure.

14. Modification Example 13

In the embodiment described above, a structure has been described in which one wiring line (that is, a floating diffusion contact) electrically coupled to the floating diffusion FD, and one wiring line (that is, a well contact) electrically coupled to a well layer WE are disposed in each of a plurality of sensor pixels. However, an embodiment of the present disclosure is not limited thereto. In the embodiment of the present disclosure, one floating diffusion contact may be disposed for every plurality of sensor pixels. One floating diffusion contact may be shared by four sensor pixels adjacent to each other, for example. Similarly, one well contact may be disposed for every plurality of sensor pixels. One well contact may be shared by four sensor pixels adjacent to each other, for example.

Figure 50:
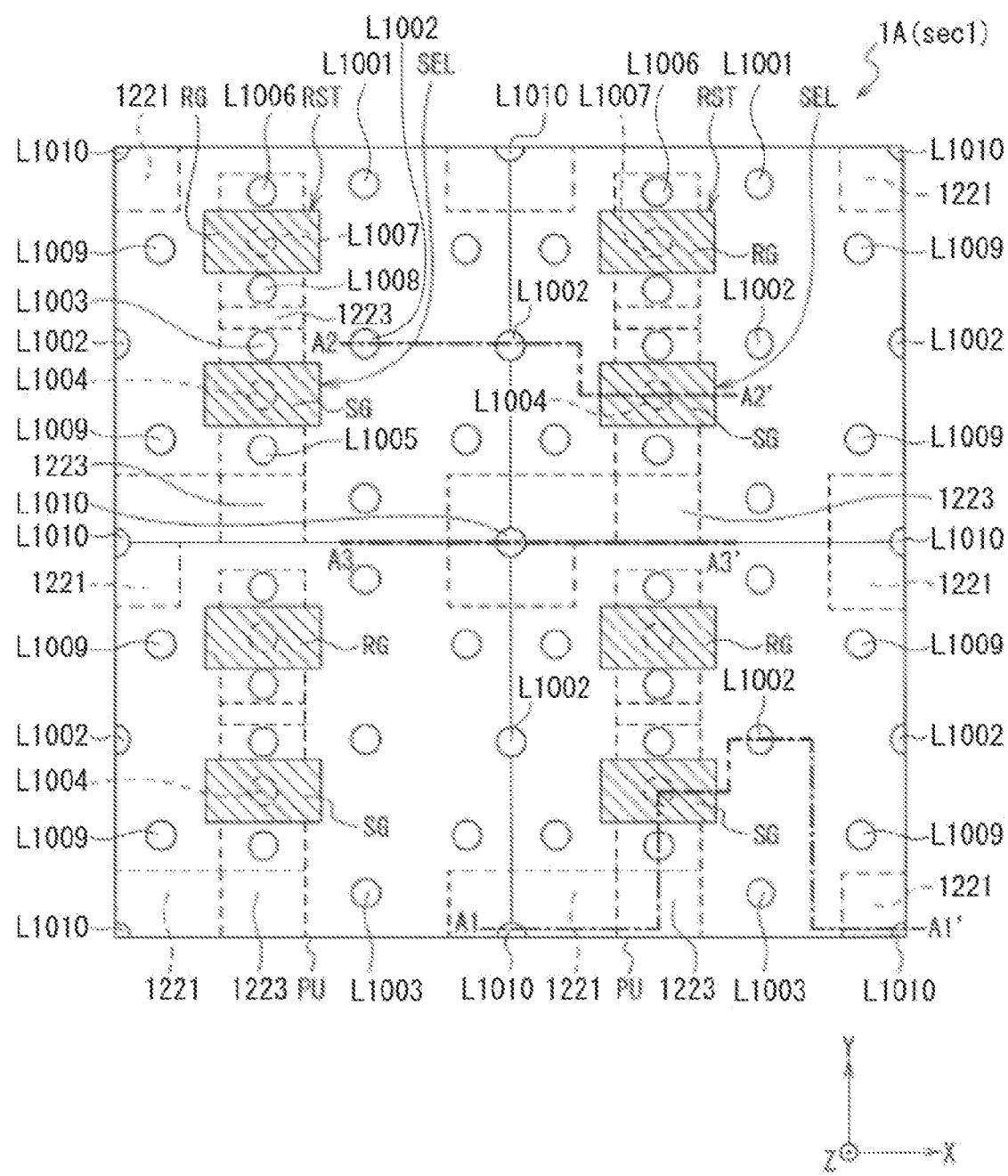
FIG. 50 is a cross-sectional view in a horizontal direction of a layout example of a plurality of pixel units according to the modification example 13 of the present disclosure.
Figure 51:
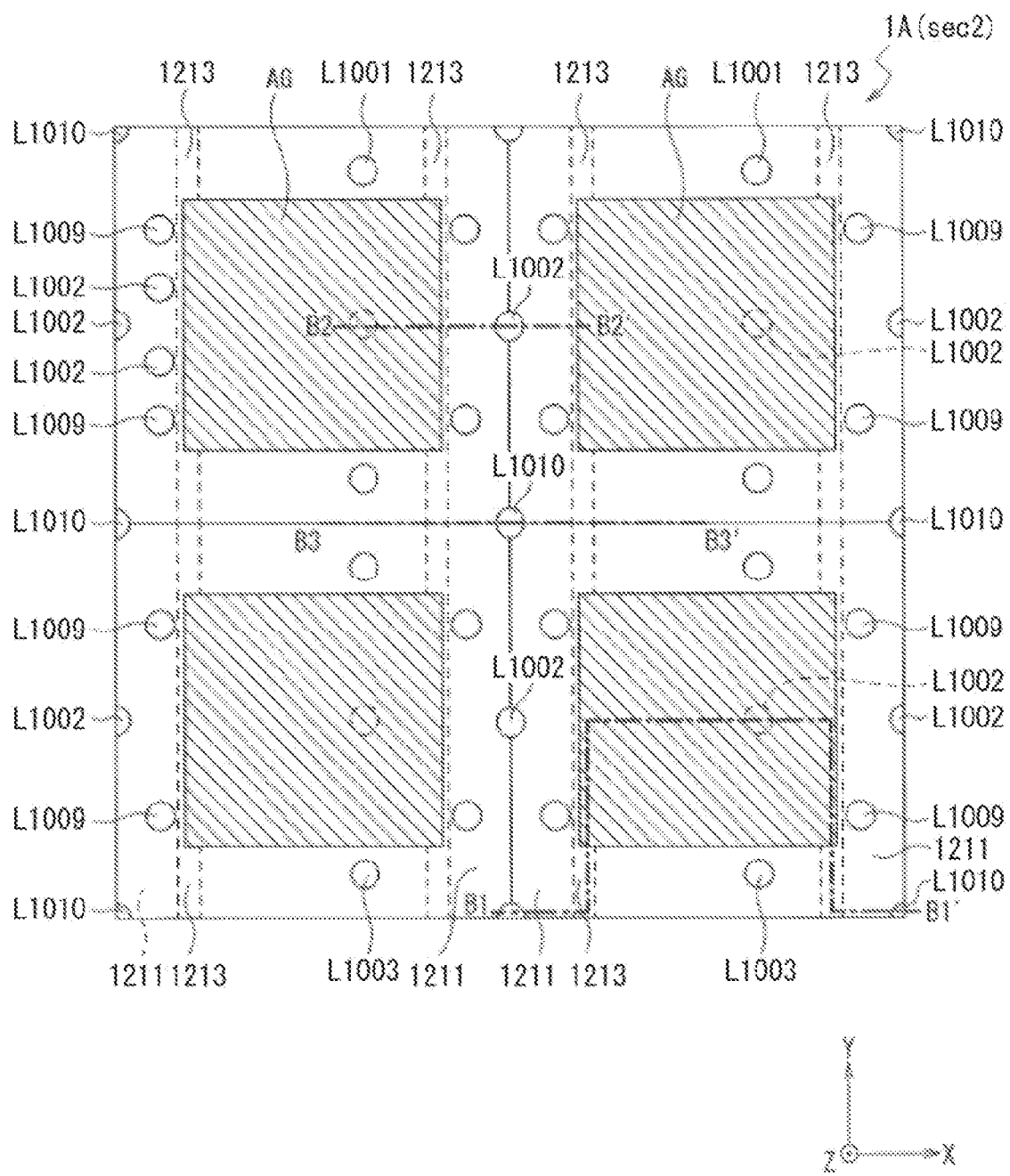
FIG. 51 is a cross-sectional view in the horizontal direction of a layout example of the plurality of pixel units according to the modification example 13 of the present disclosure.
Figure 52:
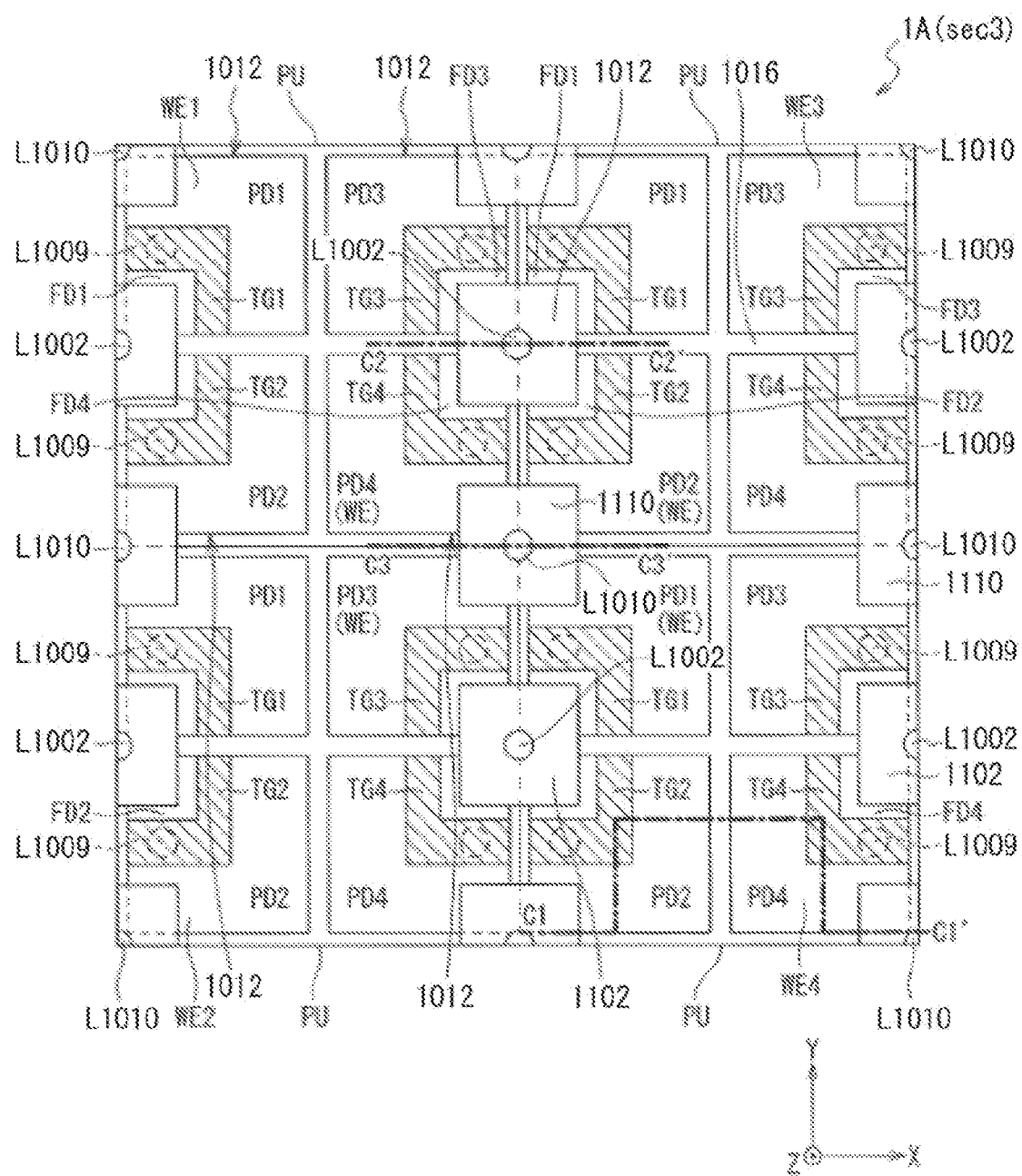
FIG. 52 is a cross-sectional view in the horizontal direction of a layout example of the plurality of pixel units according to the modification example 13 of the present disclosure.
Figure 55:
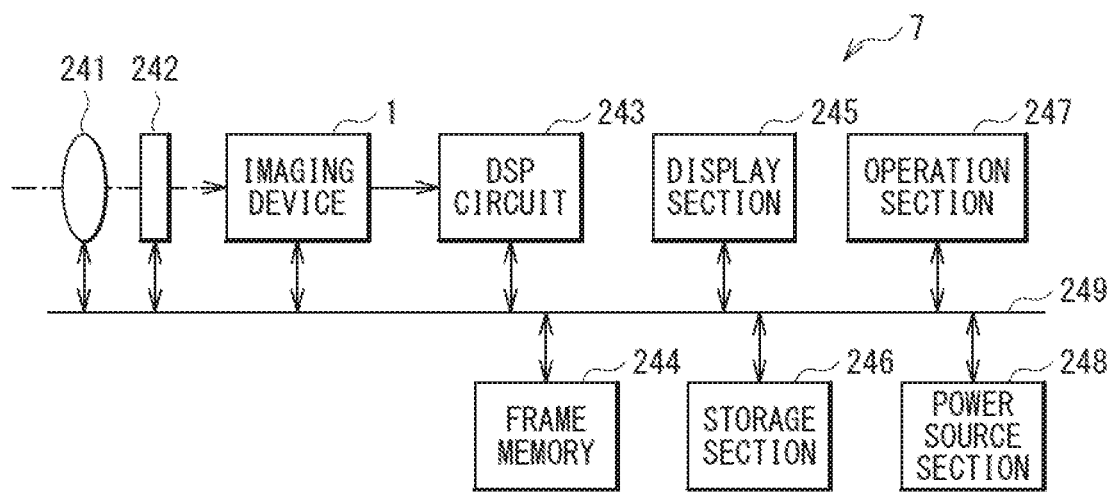
FIG. 55 is a diagram illustrating an example of a schematic configuration of an imaging system including the imaging device according to any of the embodiment described above and the modification examples thereof.

FIGS. 50 to 52 are cross-sectional views in the thickness direction of a configuration example of an imaging device 1A according to a modification example 13 of the present disclosure. FIGS. 53 to 55 are cross-sectional views in a horizontal direction of a layout example of a plurality of pixel units PU according to the modification example 13 of the present disclosure. It is to be noted that the cross-sectional views illustrated in FIGS. 50 to 52 are merely schematic views, and are not diagrams for strictly accurately illustrating an actual structure. In the cross-sectional views illustrated in FIGS. 50 to 52, for easily describing the configuration of the imaging device 1A on a paper surface, positions in the horizontal direction of a transistor and an impurity diffusion layer are intentionally changed at positions sec1 to sec3.

Specifically, in the pixel unit PU of the imaging device 1A illustrated in FIG. 50, a cross section at the position sec1 is a cross section taken along a line A1-A1' of FIG. 53, a cross section at the position sec2 is a cross section taken along a B1-B1' of FIG. 54, and a cross section at the position sec3 is a cross section taken along a line C1-C1' of FIG. 55. Likewise, in the imaging device 1A illustrated in FIG. 51, a cross section at the position sec1 is a cross section taken along a line A2-A2' of FIG. 53, a cross section at the position sec2 is a cross section taken along a B2-B2' of FIG. 54, and a cross section at the position sec3 is a cross section taken along a line C2-C2' of FIG. 55. In the imaging device 1A illustrated in FIG. 52, a cross section at the position sect is a cross section taken along a line A3-A3' of FIG. 53, a cross section at the position sec2 is a cross section taken along a B3-B3' of FIG. 54, and a cross section at the position sec3 is a cross section taken along a line C3-C3' of FIG. 55.

As illustrated in FIGS. 51 and 55, in the imaging device 1A, a common pad electrode 1102 disposed over a plurality of sensor pixels 1012, and one wiring line L1002 provided on the common pad electrode 1102 are shared. For example, in the imaging device 1A, a region is present in which the floating diffusions FD1 to FD4 of four sensor pixels 1012 are adjacent to each other with an element separation layer 1016 interposed therebetween in plan view. The common pad electrode 1102 is provided in this region. The common pad electrode 1102 is disposed over the four floating diffusions FD1 to FD4, and is electrically coupled to each of the four floating diffusions FD1 to FD4. The common pad electrode 1102 includes, for example, a polysilicon film doped with an n-type impurity or a p-type impurity.

One wiring line L1002 (that is, the floating diffusion contact) is provided on a central portion of the common pad electrode 1102. As illustrated in FIGS. 51, and 53 to 55, the wiring line L1002 provided on the central portion of the common pad electrode 1102 extends from a first substrate section 1010 to an upper substrate 1220 of a second substrate section 1020 through a lower substrate 1210 of the second substrate section 1020, and is coupled to a gate electrode AG of the amplification transistor AMP through a wiring line and the like provided in the upper substrate 1220.

In addition, as illustrated in FIGS. 50 and 55, in the imaging device 1A, a common pad electrode 1110 disposed over a plurality of sensor pixels 1012, and one wiring line L1010 provided on the common pad electrode 1110 are shared. For example, in the imaging device 1A, a region is present in which the well layers WE of four sensor pixels 1012 are adjacent to each other with the element separation layer 1016 interposed therebetween in plan view. The common pad electrode 1110 is provided in this region. The common pad electrode 1110 is disposed over the well layers WE of the four sensor pixels 1012, and is electrically coupled to each of the well layers WE of the four sensor pixels 1012. As an example, the common pad electrode 1110 is disposed between one common pad electrode 1102 and another common pad electrode 1102 arranged side by side in a Y-axis direction. In the Y-axis direction, the common pad electrodes 1102 and 1110 are alternately arranged side by side. The common pad electrode 1110 includes, for example, a polysilicon film doped with an n-type impurity or a p-type impurity.

One wiring line L1010 (that is, the well contact) is provided on a central portion of the common pad electrode 1110. As illustrated in FIGS. 50, and 52 to 55, the wiring line L1010 provided on the central portion of the common pad electrode 1110 extends from the first substrate section 1010 to the upper substrate 1220 of the second substrate section 1020 through the lower substrate 1210 of the second substrate section 1020, and is coupled to a reference potential line that supplies a reference potential (e.g., a ground potential: 0 V) through a wiring line and the like provided in the upper substrate 1220.

The wiring line L1010 provided on the central portion of the common pad electrode 1110 is electrically coupled to each of a top surface of the common pad electrode 1110, an inner surface of a through hole provided in the lower substrate 1210, and an inner surface of a through hole provided in the upper substrate 1220. Accordingly, the well layer WE of the semiconductor substrate 1011 of the first substrate section 1010, and well layers of the lower substrate 1210 and the upper substrate 1220 of the second substrate section 1020 are coupled to a reference potential (e.g., a ground potential: 0 V).

The imaging device 1A according to the modification example 13 of the present disclosure has effects similar to those of the imaging device 1 according to the embodiment. In addition, the imaging device 1A further includes the common pad electrodes 1102 and 1110 that are provided on side of a front surface 11a of the semiconductor substrate 1011 included in the first substrate section 1010 and are disposed over a plurality of (e.g., four) sensor pixels 1012 adjacent to each other. The common pad electrode 1102 is electrically coupled to the floating diffusions FD of the four sensor pixels 1012. The common pad electrode 1110 is electrically coupled to the well layers WE of the four sensor pixels 1012. This makes it possible to provide the wiring line L1002, which is coupled to the floating diffusions FD, common to every four sensor pixels 1012. It is possible to provide the wiring line L1010, which is coupled to the well layers WE, common to every four sensor pixels 1012. This makes it possible to reduce the number of wiring lines L1002 and the number of wiring lines L1010, which makes it possible to reduce the areas of the sensor pixels 1012 and downsize the imaging device 1A.

23. Application Example

FIG. 55 illustrates an example of a schematic configuration of an imaging system 7 including the imaging device 1 according to any of the embodiment described above and the modification examples thereof.

The imaging system 7 is an electronic apparatus. Examples of the electronic apparatus include an imaging device such as a digital still camera or a video camera, and a portable terminal device such as a smartphone or a tablet-type terminal. The imaging system 7 includes, for example, the imaging device 1 according to any of the embodiment described above and the modification examples thereof, a DSP circuit 243, a frame memory 244, a display section 245, a storage section 246, an operation section 247, and a power source section 248. In the imaging system 7, the imaging device 1 according to any of the embodiment described above and the modification examples thereof, the DSP circuit 243, the frame memory 244, the display section 245, the storage section 246, the operation section 247, and the power source section 248 are coupled to one another via a bus line 249.

The imaging device 1 according to any of the embodiment described above and the modification examples thereof outputs image data corresponding to incident light. The DSP circuit 243 is a signal processing circuit that processes a signal (image data) outputted from the imaging device 1 according to any of the embodiment described above and the modification examples thereof. The frame memory 244 temporarily holds the image data processed by the DSP circuit 243 in a frame unit. The display section 245 includes, for example, a panel-type display device such as a liquid crystal panel or an organic EL (Electro Luminescence) panel, and displays a moving image or a still image captured by the imaging device 1 according to any of the embodiment described above and the modification examples thereof. The storage section 246 records image data of a moving image or a still image captured by the imaging device 1 according to any of the embodiment described above and the modification examples thereof in a recording medium such as a semiconductor memory or a hard disk. The operation section 247 issues an operation command for various functions of the imaging system 7 in accordance with an operation by a user. The power source section 248 appropriately supplies various types of power for operation to the imaging device 1 according to any of the embodiment described above and the modification examples thereof, the DSP circuit 243, the frame memory 244, the display section 245, the storage section 246, and the operation section 247 which are supply targets.

Next, description is given of an imaging procedure in the imaging system 7.

Figure 56:
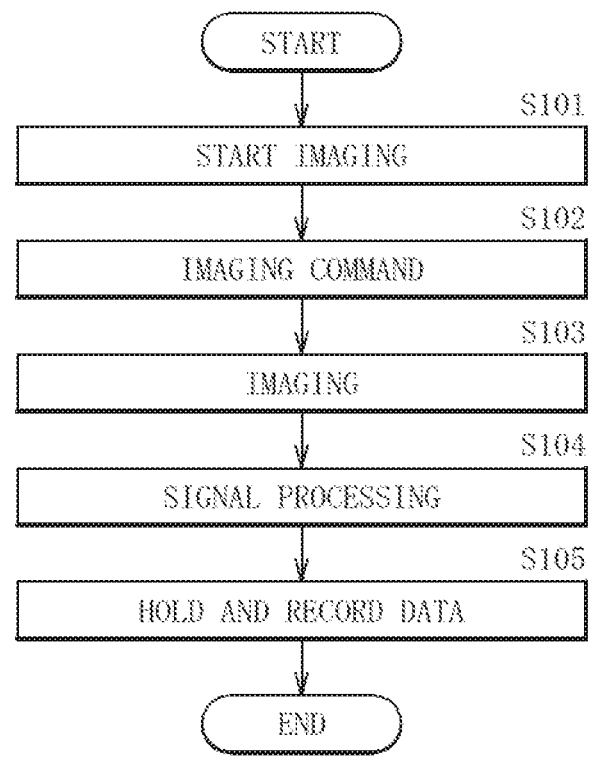
FIG. 56 is a diagram illustrating an example of an imaging procedure in the imaging system illustrated in FIG. 55.

FIG. 56 illustrates an example of a flowchart of an imaging operation in the imaging system 7. A user instructs start of imaging by operating the operation section 247 (step S101). Then, the operation section 247 transmits an imaging command to the imaging device 1 (step S102). The imaging device 1 (specifically, a system control circuit 36) executes imaging in a predetermined imaging method upon receiving the imaging command (step S103).

The imaging device 1 outputs image data obtained by imaging to the DSP circuit 243. Herein, the image data refers to data for all pixels of pixel signals generated on the basis of electric charges temporarily held in the floating diffusions FD. The DSP circuit 243 performs predetermined signal processing (e.g., noise reduction processing, etc.) on the basis of the image data inputted from the imaging device 1 (step S104). The DSP circuit 243 causes the frame memory 244 to hold the image data having been subjected to the predetermined signal processing, and the frame memory 244 causes the storage section 246 to store the image data (step S105). In this manner, the imaging in the imaging system 7 is performed.

In the present application example, the imaging device 1 according to any of the embodiment described above and the modification examples thereof is applied to the imaging system 7. This enables smaller size or higher definition of the imaging device 1, which makes it possible to provide a small or high-definition imaging system 7.

24. Practical Application Examples

Practical Application Example 1

The technology (the present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

Figure 57:
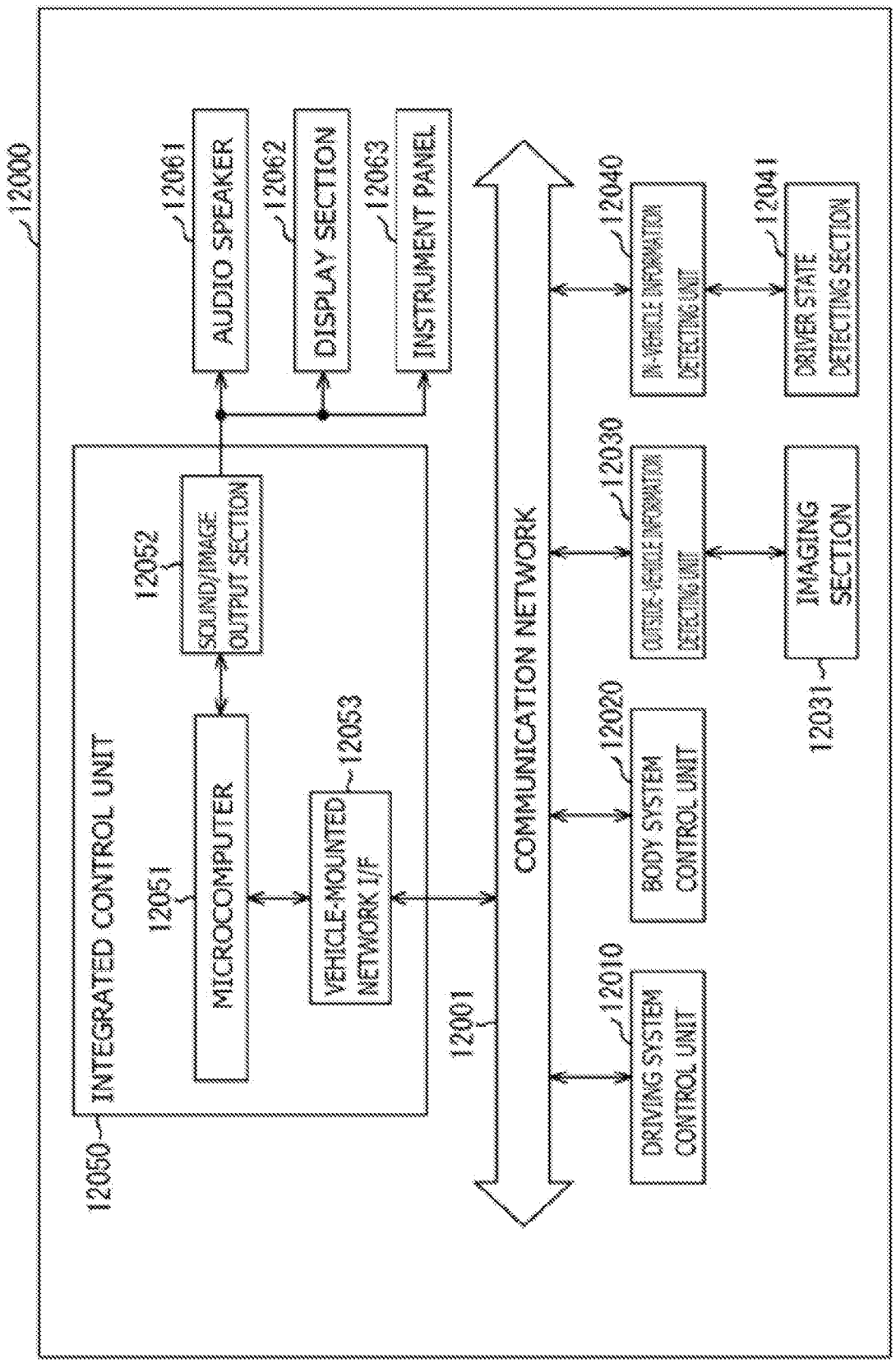
FIG. 57 is a block diagram depicting an example of schematic configuration of a vehicle control system.

FIG. 57 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 57, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 57, an audio speaker 12061, a display section 12062, and an instrument panel 12063 are illustrated as the output device. The display section 12062 may, for example, include at least one of an on-board display and a head-up display.

Figure 58:
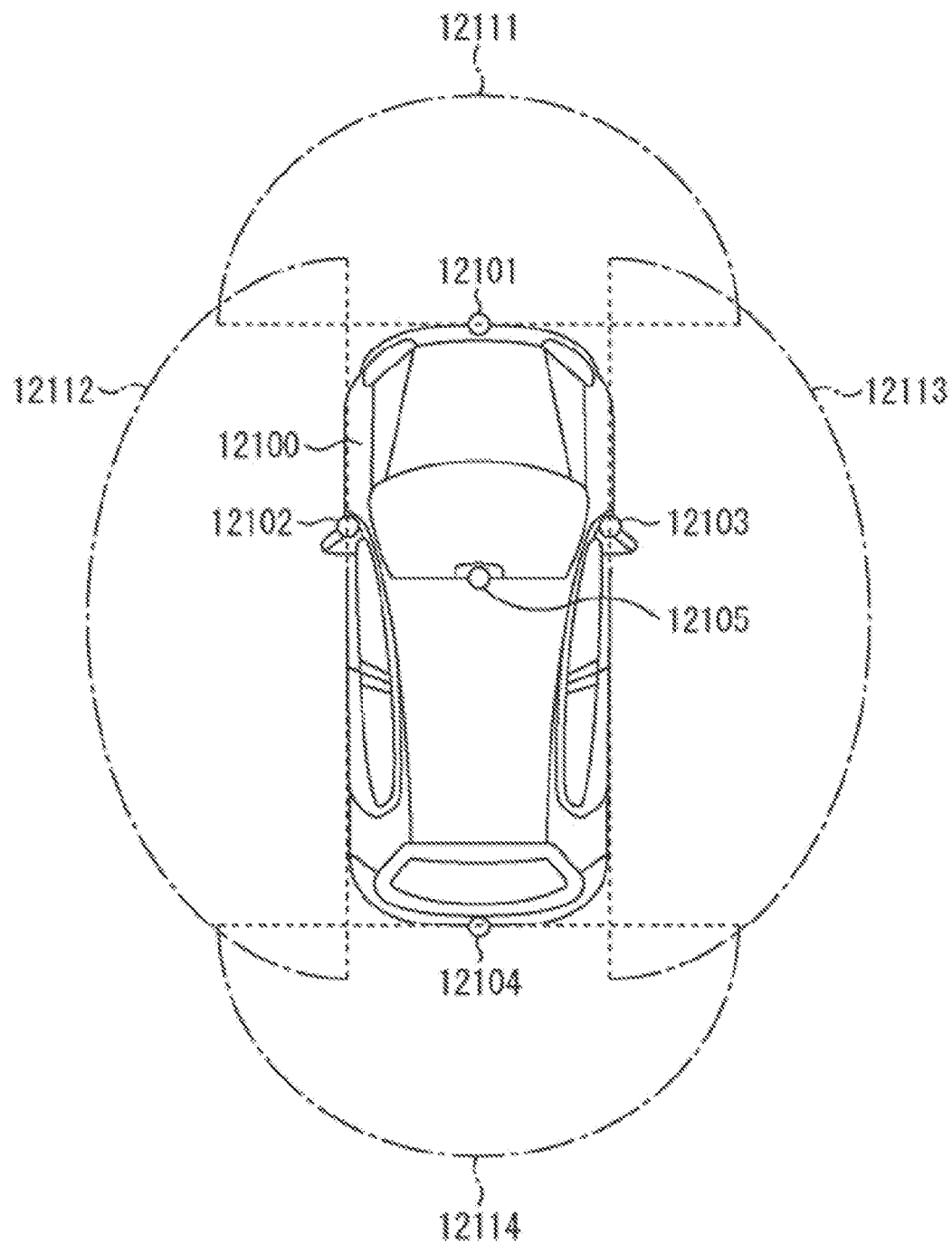
FIG. 58 is a diagram of assistance in explaining an example of installation positions of an outside-vehicle information detecting section and an imaging section.

FIG. 58 is a diagram depicting an example of the installation position of the imaging section 12031.

In FIG. 58, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 58 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to the present disclosure may be applied. The technology according to the present disclosure may be applied to the imaging section 12031 among the configurations described above. Specifically, the imaging device 1 according to any of the embodiment described above and modification examples thereof is applicable to the imaging section 12031. Applying the technology according to the present disclosure to the imaging section 12031 makes it possible to obtain a high-definition captured image with less noise, which makes it possible to perform highly accurate control using the captured image in the mobile body control system.

Practical Application Example 2

Figure 59:
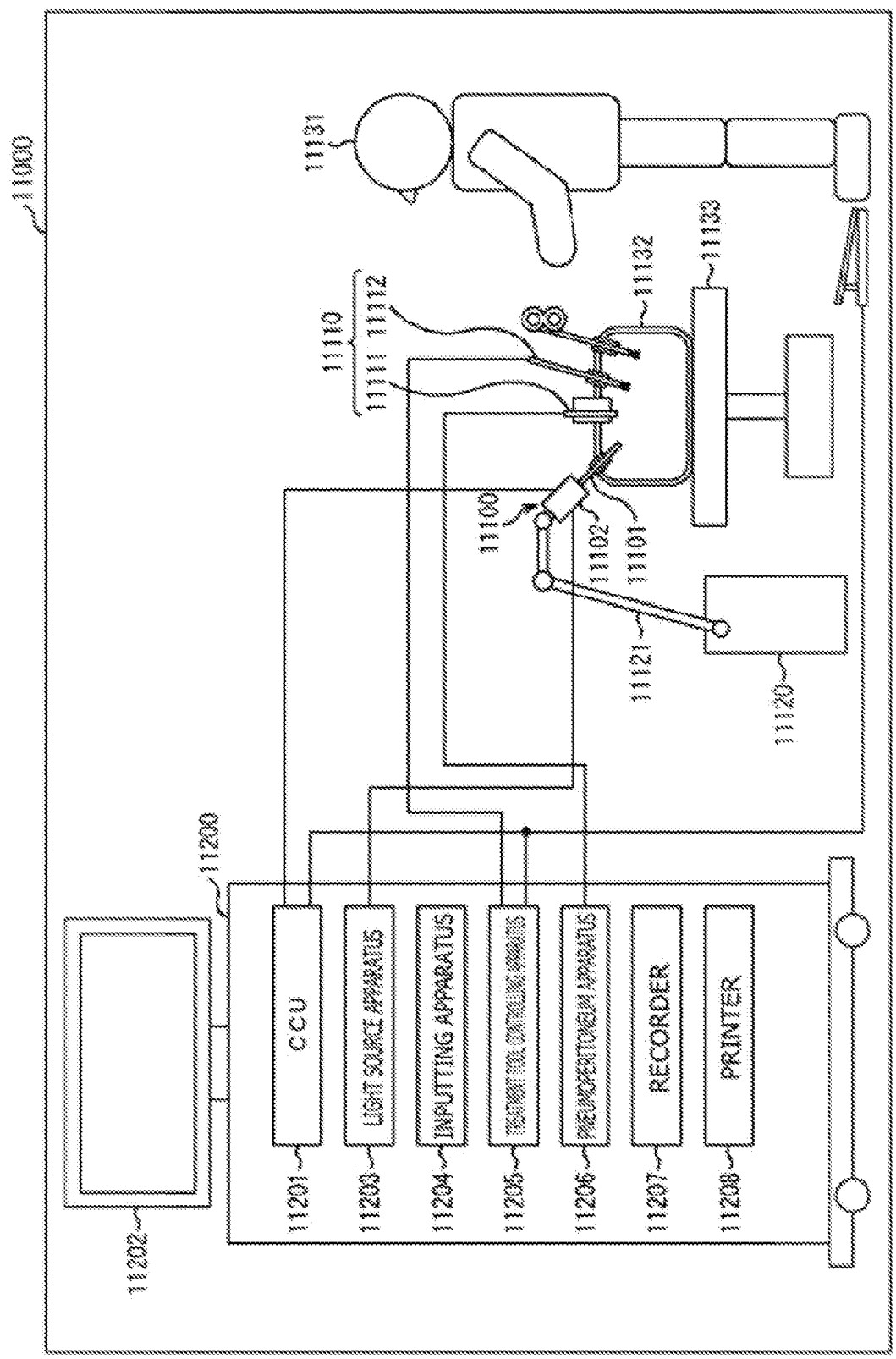
FIG. 59 is a view depicting an example of a schematic configuration of an endoscopic surgery system.

FIG. 59 is a view depicting an example of a schematic configuration of an endoscopic surgery system to which the technology according to an embodiment of the present disclosure (present technology) can be applied.

In FIG. 59, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 60:
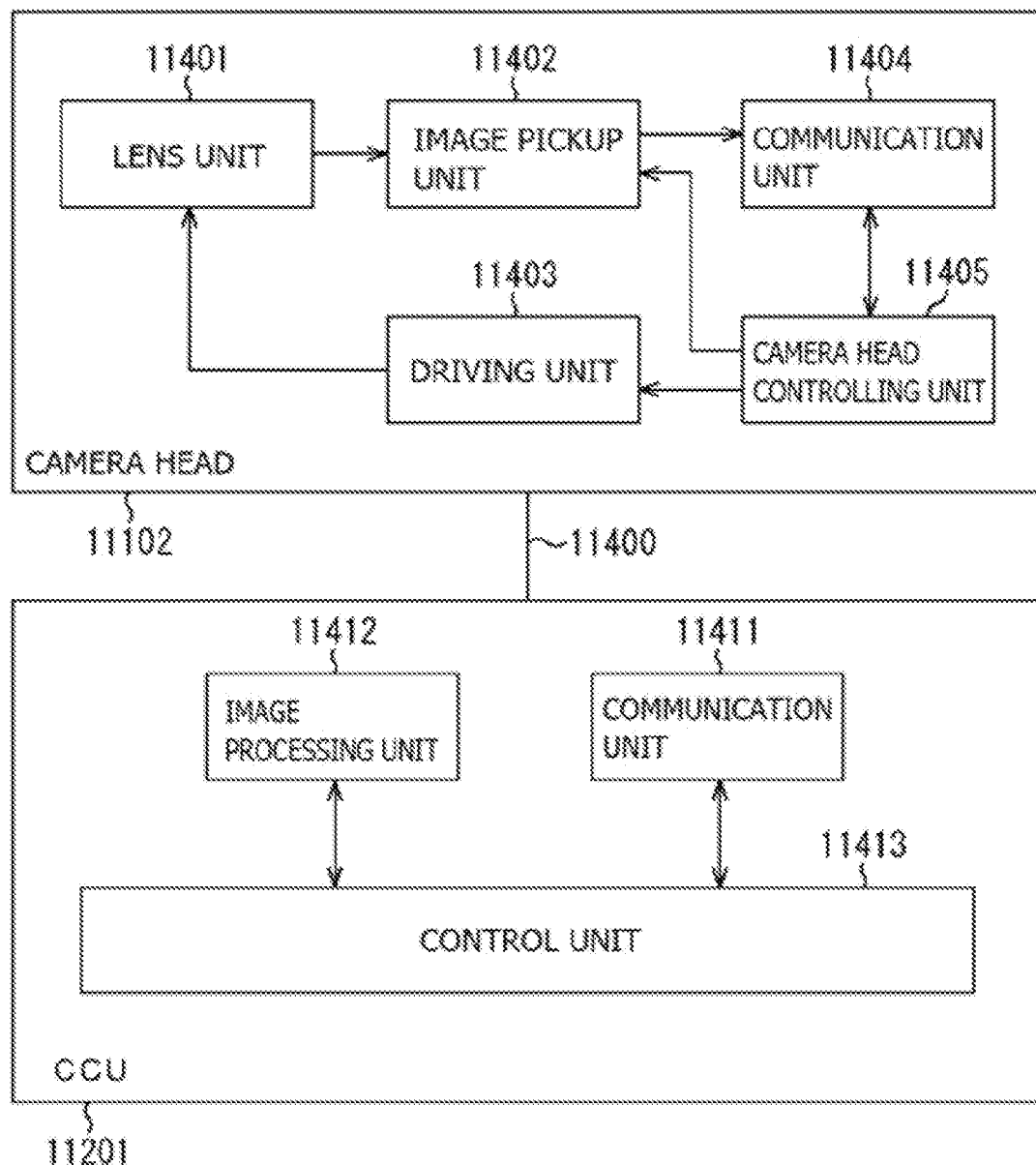
FIG. 60 is a block diagram depicting an example of a functional configuration of a camera head and a camera control unit (CCU).

FIG. 60 is a block diagram depicting an example of a functional configuration of the camera head 11102 and the CCU 11201 depicted in FIG. 59.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given hereinabove of one example of the endoscopic surgery system, to which the technology according to the present disclosure may be applied. The technology according to the present disclosure may be suitably applied to the image pickup unit 11402 provided in the camera head 11102 of the endoscope 11100, among the configurations described above. Applying the technology according to the present disclosure to the image pickup unit 11402 enables smaller size or higher definition of the image pickup unit 11402, which makes it possible to provide the endoscope 11100 having a small size or high definition.

Although the present disclosure has been described with reference to the embodiment and the modification examples thereof, the application example, and the practical application examples, the present disclosure is not limited to the embodiment and the like described above, and may be modified in a variety of ways. It is to be noted that the effects described herein are merely illustrative. The effects of the present disclosure are not limited to those described herein. The present disclosure may have effects other than those described herein.

In addition, for example, the present disclosure may also have the following configurations. In a solid-state imaging device having any of the following configurations, a gate electrode of a pixel transistor is provided in contact with a portion of a through electrode, which makes it possible to increase an area of the gate electrode and improve characteristics of the pixel transistor. This makes it possible to reduce noise of a signal to be outputted from the pixel transistor.

(1)

A solid-state imaging device including:
  a first substrate including a photoelectric converter and an electric charge accumulation section for each pixel, the electric charge accumulation section in which a signal electric charge generated in the photoelectric converter is accumulated;
  a second substrate including a semiconductor layer and a pixel transistor, the semiconductor layer being stacked on the first substrate, and the pixel transistor that includes a gate electrode opposed to the semiconductor layer, and reads the signal electric charge of the electric charge accumulation section; and
  a through electrode that is provided in the first substrate and the second substrate, and electrically couples the first substrate and the second substrate to each other and is partially in contact with the gate electrode.

(2)

The solid-state imaging device according to (1), in which the gate electrode is opposed to the semiconductor layer in a plurality of directions.

(3)

The solid-state imaging device according to (1) or (2), in which
  the semiconductor layer includes at least one fin, and
  the gate electrode is opposed to a plurality of surfaces of the fin.

(4)

The solid-state imaging device according to (3), in which
  the semiconductor layer includes a plurality of the fins, and
  the semiconductor layer further includes an insulating film provided between adjacent ones of the fins.

(5)

The solid-state imaging device according to (3), in which
  the semiconductor layer includes a plurality of the fins, and
  the semiconductor layer further includes a connecting section that connects adjacent ones of the fin.

(6)

The solid-state imaging device according to any one of (1) to (5), in which the gate electrode has a front surface opposed to the first substrate, and a side surface that is provided in a direction intersecting with the front surface and is in contact with the through electrode.

(7)

The solid-state imaging device according to (6), in which
  the gate electrode includes a horizontal section and a sidewall section, the horizontal section being provided with the front surface, and the sidewall section being provided with the side surface and provided between the semiconductor layer and the through electrode, and
  the sidewall section is provided in a thickness direction of the semiconductor layer.

(8)

The solid-state imaging device according to (7), further including a vertical section that is coupled to the horizontal section and is embedded in a portion in the thickness direction of the semiconductor layer.

(9)

The solid-state imaging device according to (6), in which a portion of the front surface of the gate electrode is also in contact with the through electrode.

(10)

The solid-state imaging device according to any one of (1) to (6), in which
 a through hole is provided in the gate electrode, and
 the through electrode is in contact with an inner peripheral surface of the through hole.

The solid-state imaging device according to any one of (1) to (10), in which
 the second substrate further includes an insulating region that divides the semiconductor layer, and
 the through electrode is provided to penetrate through the insulating region.

(12)

The solid-state imaging device according to any one of (1) to (11), in which the pixel transistor includes an amplification transistor.

(13)

The solid-state imaging device according to any one of (1) to (12), in which the through electrode electrically couples the electric charge accumulation section and the gate electrode of the pixel transistor to each other.

(14)

The solid-state imaging device according to any one of (1) to (13), further including a shared coupling section that is coupled to a plurality of the electric charge accumulation sections and is provided in the first substrate, in which
 an end of the through electrode is in contact with the shared coupling section.

REFERENCE SIGNS LIST

This application claims the benefit of Japanese Priority Patent Application JP2019-118474 filed with Japan Patent Office on Jun. 26, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:
 a first substrate including a photoelectric converter and an electric charge accumulation section for each pixel, wherein a signal electric charge generated in the photoelectric converter is accumulated in the electric charge accumulation section;
 a second substrate including a semiconductor layer and a pixel transistor, wherein the semiconductor layer is stacked on the first substrate, and wherein the pixel transistor includes a gate electrode opposed to the semiconductor layer, and reads the signal electric charge of the electric charge accumulation section; and
 a through electrode that is provided in the first substrate and the second substrate, wherein the through electrode electrically couples the first substrate and the second substrate to each other, and wherein the through electrode is partially in contact with the gate electrode, wherein the semiconductor layer includes at least one fin, and
 wherein the gate electrode is opposed to a plurality of surfaces of the fin.

2. The solid-state imaging device according to claim 1, wherein the gate electrode is opposed to the semiconductor layer in a plurality of directions.

3. The solid-state imaging device according to claim 1, wherein the semiconductor layer includes a plurality of the fins, and wherein the semiconductor layer further includes an insulating film provided between adjacent ones of the fins.

4. The solid-state imaging device according to claim 1, wherein the semiconductor layer includes a plurality of the fins, and wherein the semiconductor layer further includes a connecting section that connects adjacent ones of the fins.

5. The solid-state imaging device according to claim 1, wherein the second substrate further includes an insulating region that divides the semiconductor layer, and wherein the through electrode penetrates through the insulating region.

6. The solid-state imaging device according to claim 1, wherein the pixel transistor comprises an amplification transistor.

7. The solid-state imaging device according to claim 1, wherein the through electrode electrically couples the electric charge accumulation section and the gate electrode of the pixel transistor to each other.

8. A solid-state imaging device, comprising:
 a first substrate including a photoelectric converter and an electric charge accumulation section for each pixel, wherein a signal electric charge generated in the photoelectric converter is accumulated in the electric charge accumulation section;
 a second substrate including a semiconductor layer and a pixel transistor, wherein the semiconductor layer is stacked on the first substrate, and wherein the pixel transistor includes a gate electrode opposed to the semiconductor layer, and reads the signal electric charge of the electric charge accumulation section; and
 a through electrode that is provided in the first substrate and the second substrate, wherein the through electrode electrically couples the first substrate and the second substrate to each other, wherein the through electrode is partially in contact with the gate electrode, and wherein the gate electrode has a front surface opposed to the first substrate, and a side surface that is provided in a direction intersecting with the front surface and is in contact with the through electrode.

9. The solid-state imaging device according to claim 8, wherein the gate electrode includes a horizontal section and a sidewall section, wherein the horizontal section includes the front surface, wherein the sidewall section includes the side surface and is between the semiconductor layer and the through electrode, and wherein the sidewall section is provided in a thickness direction of the semiconductor layer.

10. The solid-state imaging device according to claim 9, wherein the gate electrode further includes a vertical section that is coupled to the horizontal section and is embedded in a portion in the thickness direction of the semiconductor layer.

11. The solid-state imaging device according to claim 8, wherein a portion of the front surface of the gate electrode is also in contact with the through electrode.

12. The solid-state imaging device according to claim 8, wherein the gate electrode is opposed to the semiconductor layer in a plurality of directions.

13. The solid-state imaging device according to claim 8, wherein the semiconductor layer includes at least one fin, and wherein the gate electrode is opposed to a plurality of surfaces of the fin.

14. The solid-state imaging device according to claim 13, wherein the semiconductor layer includes a plurality of the fins, and wherein the semiconductor layer further includes an insulating film provided between adjacent ones of the fins.

15. The solid-state imaging device according to claim 13, wherein the semiconductor layer includes a plurality of the fins, and wherein the semiconductor layer further includes a connecting section that connects adjacent ones of the fins.

16. A solid-state imaging device, comprising:
a first substrate including a photoelectric converter and an electric charge accumulation section for each pixel, wherein a signal electric charge generated in the photoelectric converter is accumulated in the electric charge accumulation section;
a second substrate including a semiconductor layer and a pixel transistor, wherein the semiconductor layer is stacked on the first substrate, and wherein the pixel transistor includes a gate electrode opposed to the semiconductor layer, and reads the signal electric charge of the electric charge accumulation section; and
a through electrode that is provided in the first substrate and the second substrate, wherein the through electrode electrically couples the first substrate and the second substrate to each other, and wherein the through electrode is partially in contact with the gate electrode, wherein a through hole is provided in the gate electrode, and wherein the through electrode is in contact with an inner peripheral surface of the through hole.

17. The solid-state imaging device according to claim 16, wherein the gate electrode is opposed to the semiconductor layer in a plurality of directions.

18. The solid-state imaging device according to claim 16, wherein the semiconductor layer includes at least one fin, and wherein the gate electrode is opposed to a plurality of surfaces of the fin.

19. The solid-state imaging device according to claim 18, wherein the semiconductor layer includes a plurality of the fins, and wherein the semiconductor layer further includes an insulating film provided between adjacent ones of the fins.

20. A solid-state imaging device, comprising:
a first substrate including a photoelectric converter and an electric charge accumulation section for each pixel, wherein a signal electric charge generated in the photoelectric converter is accumulated in the electric charge accumulation section;
a second substrate including a semiconductor layer and a pixel transistor, wherein the semiconductor layer is stacked on the first substrate, wherein the pixel transistor includes a gate electrode opposed to the semiconductor layer, and wherein the pixel transistor reads the signal electric charge of the electric charge accumulation section;
a through electrode that is provided in the first substrate and the second substrate, wherein the through electrode electrically couples the first substrate and the second substrate to each other, and wherein the through electrode is partially in contact with the gate electrode; and
a shared coupling section that is coupled to a plurality of the electric charge accumulation sections and is provided in the first substrate, wherein—an end of the through electrode is in contact with the shared coupling section.

* * * * *